US008091767B2

(12) United States Patent
Seki et al.

(10) Patent No.: US 8,091,767 B2
(45) Date of Patent: Jan. 10, 2012

(54) SUBSTRATE MANUFACTURING APPARATUS, SUBSTRATE MANUFACTURING METHOD, BALL-MOUNTED SUBSTRATE, AND ELECTRONIC COMPONENT-MOUNTED SUBSTRATE

(75) Inventors: Kazuhiko Seki, Ueda-shi (JP); Hideo Matsubayashi, Ueda-shi (JP); Makoto Shimizu, Ueda-shi (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 0 days.

(21) Appl. No.: 12/702,514

(22) Filed: Feb. 9, 2010

(65) Prior Publication Data

US 2010/0200284 A1 Aug. 12, 2010

(30) Foreign Application Priority Data

| Feb. 10, 2009 | (JP) | 2009-028069 |
| Jul. 13, 2009 | (JP) | 2009-164366 |
| Jul. 30, 2009 | (JP) | 2009-177156 |
| Sep. 4, 2009 | (JP) | 2009-204335 |
| Sep. 15, 2009 | (JP) | 2009-212601 |
| Oct. 7, 2009 | (JP) | 2009-233131 |
| Jan. 7, 2010 | (JP) | 2010-001737 |

(51) Int. Cl.
*B23K 35/12* (2006.01)

(52) U.S. Cl. .................. 228/249; 228/245; 228/246

(58) Field of Classification Search .............. 228/178, 228/179.1, 180.1, 180.21, 180.22, 245, 249–255, 228/4.1, 6.1, 6.2, 33
See application file for complete search history.

(56) References Cited

U.S. PATENT DOCUMENTS

| 5,687,901 A * | 11/1997 | Hoshiba et al. ............... 228/246 |
| 6,056,190 A * | 5/2000 | Foulke et al. .................. 228/246 |
| 6,533,159 B1 * | 3/2003 | Cobbley et al. ............... 228/20.1 |
| 6,739,498 B2 * | 5/2004 | Shafie ........................... 228/223 |
| 2008/0003805 A1 * | 1/2008 | Pang et al. .................... 438/613 |

FOREIGN PATENT DOCUMENTS

| JP | 8-250853 | 9/1996 |
| JP | 2000077837 A * | 3/2000 |
| JP | 2003-100789 | 4/2003 |
| JP | 2008-130956 | 6/2008 |

OTHER PUBLICATIONS

Written translation of JP 2000-077837 Ukai.*
Machine translation of JP 08-250853 Yoshinaga obtained from the JPO website.*

* cited by examiner

*Primary Examiner* — David Sample
*Assistant Examiner* — Megha Mehta
(74) *Attorney, Agent, or Firm* — Greenblum & Bernstein P.L.C.

(57) ABSTRACT

A substrate manufacturing apparatus manufactures a ball-mounted substrate and has a ball mounting apparatus which includes a ball vacuum chucking apparatus including a vacuum chucking head that carries out a vacuum chucking process to chuck balls at edges of inlets formed in a vacuum chucking surface and which mounts the balls vacuum-chucked by the vacuum chucking head on a substrate, the ball vacuum chucking apparatus further including: a holding vessel that holds the balls; and a vacuum chucking/holding unit that vacuum chucks and holds the balls held in the holding vessel on a front end thereof, and carrying out a supplying process that brings the vacuum chucking/holding unit that holds the balls on the front end thereof and the vacuum chucking surface of the vacuum chucking head relatively close to supply the balls to the vacuum chucking head while air is being drawn through the inlets.

16 Claims, 33 Drawing Sheets

F I G. 5 2
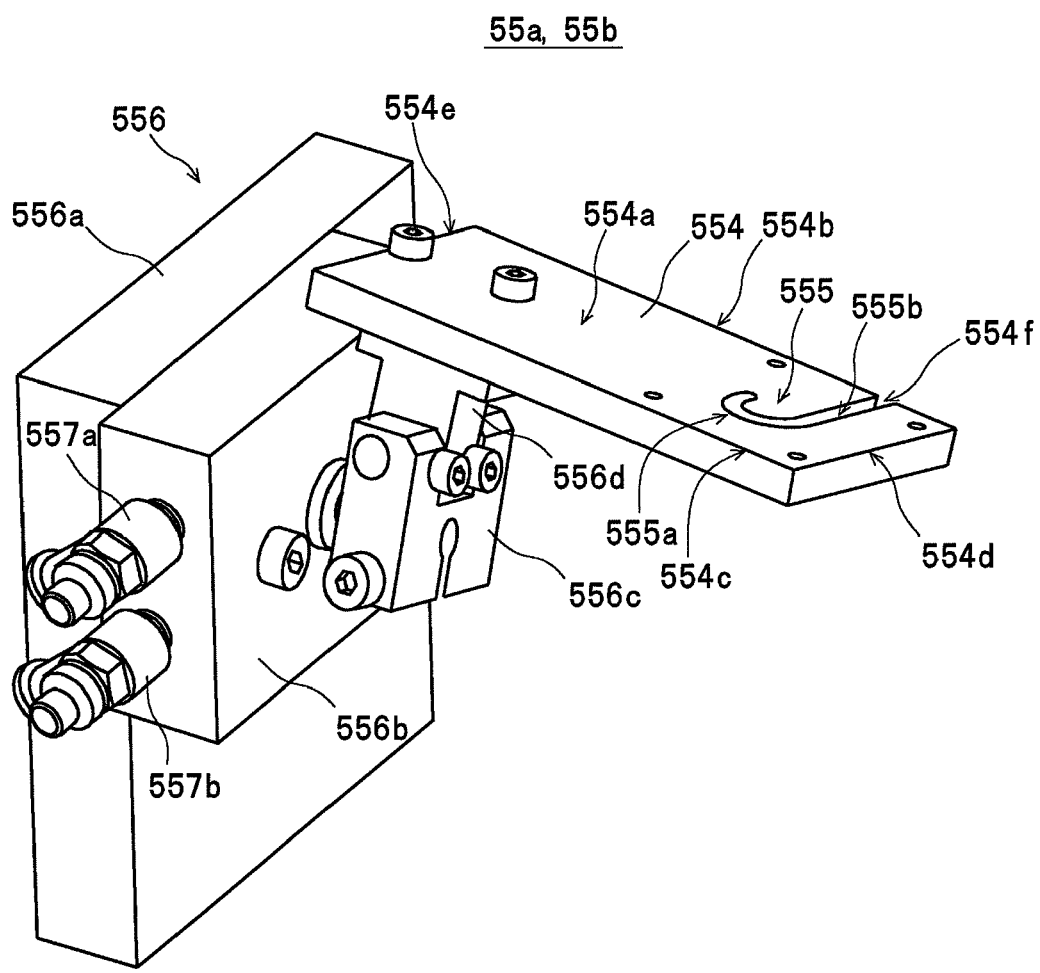

F I G. 6 1
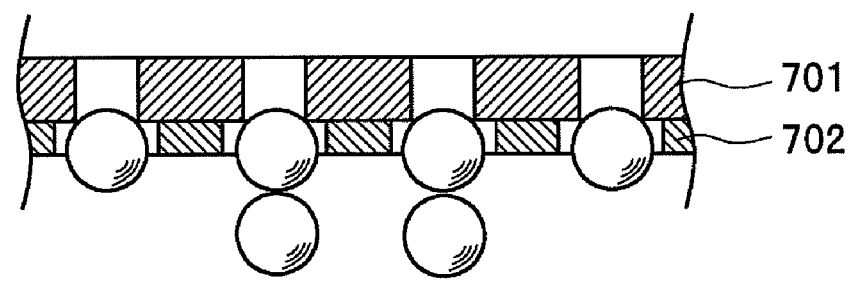

SUBSTRATE MANUFACTURING APPARATUS, SUBSTRATE MANUFACTURING METHOD, BALL-MOUNTED SUBSTRATE, AND ELECTRONIC COMPONENT-MOUNTED SUBSTRATE

BACKGROUND OF THE INVENTION

1. Field of the Invention

The present invention relates to a substrate manufacturing apparatus and a substrate manufacturing method that manufacture a ball-mounted substrate by mounting balls onto a substrate, a ball-mounted substrate manufactured by such substrate manufacturing apparatus or substrate manufacturing method, and an electronic component-mounted substrate where an electronic component has been mounted on such ball-mounted substrate.

2. Description of the Related Art

When manufacturing this type of ball-mounted substrate, a solder ball mounting apparatus disclosed in Japanese Laid-Open Patent Publication No. 2003-100789 is known as a ball mounting apparatus that mounts balls onto a substrate. This solder ball mounting apparatus includes an alignment mask, which has a plurality of vacuum chucking holes formed on a vacuum chucking surface, and a moving unit that moves the alignment mask, and is constructed so as to be capable of mounting solder balls that are vacuum-chucked by the alignment mask onto connection terminals of a package. This solder ball mounting apparatus also includes a detachable plate in which a plurality of through-holes that are larger than the solder balls have been formed in the same arrangement as the vacuum chucking holes of the alignment mask, with the detachable plate being relatively movable with respect to the alignment mask. When solder balls are mounted on the connection terminals of a package using this solder ball mounting apparatus, the detachable plate is placed in contact with the vacuum chucking surface of the alignment mask, and the alignment mask and the detachable plate in this state are fitted into a solder ball vessel in which a large number of solder balls are held so as to supply the solder balls. When doing so, one solder ball will pass through each through-hole of the detachable plate to become vacuum-chucked in a vacuum chucking hole of the alignment mask, and due to the airflow drawn in through the gaps between the solder balls and the vacuum chucking holes, excess solder balls aside from the above solder ball will also be vacuum-chucked. Next, the detachable plate is moved downward to separate the detachable plate from the vacuum chucking surface of the alignment mask. When doing so, the excess solder balls described above become separated from the alignment mask due to the movement of the detachable plate and fall back into the solder ball vessel. This means that with the solder ball mounting apparatus described above, it is possible to prevent excess solder balls from being mounted on the connection terminals.

SUMMARY OF THE INVENTION

However, by investigating the solder ball mounting apparatus described above, the present inventors found the problems described below with the solder ball mounting apparatus. With the solder ball mounting apparatus described above, solder balls are supplied by fitting the alignment mask and the detachable plate into the solder ball vessel in which a large number of solder balls are held. Also, with the solder ball mounting apparatus described above, by moving the detachable plate downward to separate the detachable plate from the vacuum chucking surface of the alignment mask, excess solder balls are caused to fall from the alignment mask and thereby removed. On the other hand, in recent years, as the density of packages has increased, solder balls have become increasingly tiny. As the solder balls become increasingly tiny, the attractive forces that act between the solder balls due to static electricity and intermolecular forces between the solder balls also increase relative to the weight of the solder balls. For this reason, as shown in FIGS. 59 to 61, when solder balls have been supplied by the method described above, a large number of excess solder balls will stick due to the attractive forces that pull the solder balls together, and there are cases where it is not possible to remove all of the excess solder balls from an alignment mask 701 by merely moving a detachable plate 702 downward. Accordingly, with the solder ball mounting apparatus described above, when the solder balls are tiny, there is the problem that it is difficult to prevent excess solder balls from being mounted on the connection terminals (that is, to prevent the excessive mounting of solder balls on the connection terminals). As a result, when solder balls are mounted on a substrate by the solder ball mounting apparatus described above and such solder balls are used to manufacture a ball-mounted substrate, there is the problem of defects occurring due to the excessive mounting of solder balls.

The present invention was conceived in view of the problems described above, and it is a principal object of the present invention to provide a substrate manufacturing apparatus and a substrate manufacturing method that can reliably prevent the excessive mounting of tiny balls on a substrate, a ball-mounted substrate manufactured by such substrate manufacturing apparatus or substrate manufacturing method, and an electronic component-mounted substrate where an electronic component is mounted on such ball-mounted substrate.

To achieve the stated objects, a substrate manufacturing apparatus according to the present invention that manufactures a ball-mounted substrate comprises: a ball mounting apparatus which includes a ball vacuum chucking apparatus including a vacuum chucking head that carries out a vacuum chucking process to vacuum chuck balls at edges of suction inlets formed in a vacuum chucking surface and which mounts the balls vacuum-chucked by the vacuum chucking head on a substrate, wherein the ball vacuum chucking apparatus further includes: a holding vessel that has an opening and holds the balls; and a vacuum chucking/holding unit that vacuum chucks and holds the balls held in the holding vessel on a front end portion thereof, and the ball vacuum chucking apparatus carries out a supplying process that brings the vacuum chucking/holding unit that holds the balls on the front end portion thereof and the vacuum chucking surface of the vacuum chucking head relatively close to one another to supply the balls to the vacuum chucking head in a state where air is being drawn through the suction inlets.

Also, a substrate manufacturing method according to the present invention manufactures a ball-mounted substrate by causing a vacuum chucking head to carry out a vacuum chucking process where balls are vacuum-chucked on edges of suction inlets form in a vacuum chucking surface of the vacuum chucking head and mounting the balls, which have been vacuum-chucked by the vacuum chucking head, onto a substrate, wherein during execution of the vacuum chucking process, the balls, that are held in a holding vessel with an opening, are vacuum-chucked and held on a front end portion of a vacuum chucking/holding unit, and a supplying process is carried out where the vacuum chucking/holding unit that holds the balls on the front end portion thereof and the vacuum chucking surface of the vacuum chucking head are brought relatively close to one another to supply the balls to the vacuum chucking head in a state where air is being drawn through the suction inlets.

With the substrate manufacturing apparatus and the substrate manufacturing method described above, a supplying process is carried out where the balls are supplied to the vacuum chucking head by chucking and holding the balls by suction on the front end portion of the vacuum chucking/holding unit, bringing the vacuum chucking/holding unit that holds the balls on the front end portion thereof and the vacuum chucking surface of the vacuum chucking head relatively close to one another, and drawing in air from the suction inlets. This means that according to the substrate manufacturing apparatus and the substrate manufacturing method described above, since it is possible to supply an appropriate amount of balls to the vacuum chucking head by holding the appropriate amount of balls on the front end portion, it is possible to reliably prevent the supplying of excess balls. As a result, it is possible to suppress the adhesion of excess balls. Therefore, according to the substrate manufacturing apparatus and the substrate manufacturing method described above, since it is possible to hold the only the balls to be mounted on the vacuum chucking head, it is possible to reliably prevent the mounting of excessive solder balls on the substrate, that is, the excessive mounting of balls on the substrate.

In the substrate manufacturing apparatus described above, it is possible to use a construction where the ball vacuum chucking apparatus includes a suction unit that is capable of pulling away the balls by suction, and carries out a suction process that brings the suction unit and the vacuum chucking surface of the vacuum chucking head relatively close to one another and uses suction to remove excess balls aside from balls vacuum-chucked at the edges of the suction inlets. Also, in the substrate manufacturing method described above, it is possible to use a method where when the vacuum chucking process is carried out, a suction process is carried out that brings a suction unit that is capable of pulling away the balls by suction and the vacuum chucking surface of the vacuum chucking head relatively close to one another and uses suction to remove excess balls aside from balls vacuum-chucked at the edges of the suction inlets. By using the construction and method described above, even if strong attractive forces act between the balls to be mounted and the excessive balls due to static electricity and intermolecular forces, it will still be possible to reliably remove all of the excess balls from the vacuum chucking head by using suction by the suction unit to forcibly pull the excess balls away from the balls to be mounted. Therefore, according to the substrate manufacturing apparatus and the substrate manufacturing method described above, since it is possible to cause the vacuum chucking head to hold only the balls to be mounted with greater reliability, it is possible to prevent the mounting of excess balls on the substrate, that is, the excessive mounting of balls on the substrate with even greater reliability.

In the substrate manufacturing apparatus described above, it is possible to use a construction where the ball mounting apparatus further includes: a first detecting unit that carries out a first detecting process that detects any excess or insufficiency of balls on the vacuum chucking head after execution of the vacuum chucking process; a first removing unit that carries out a first removing process that removes the balls vacuum-chucked by the vacuum chucking head from the vacuum chucking head; and a control unit, wherein the control unit is operable when an excess of the balls has been detected in the first detecting process, to repeat the vacuum chucking process and the supplying process after the first removing process has been carried out and is operable when an insufficiency of the balls has been detected in the first detecting process, to repeat the vacuum chucking process and the supplying process. Also, in the substrate manufacturing method described above, it is possible to use a method further comprising a first detecting process that detects any excess or insufficiency of the balls on the vacuum chucking head after execution of the vacuum chucking process, wherein when an excess of the balls has been detected in the first detecting process, a first removing process that removes the balls vacuum-chucked by the vacuum chucking head from the vacuum chucking head is carried out and then the vacuum chucking process and the supplying process are repeated, and when an insufficiency of the balls has been detected in the first detecting process, the vacuum chucking process and the supplying process are repeated. By using the construction and method described above, even if balls are excessively chucked during the vacuum chucking process, the chucked balls will be removed and then the vacuum chucking process and the supplying process will be repeated. Similarly, if insufficient balls are chucked during the vacuum chucking process, the vacuum chucking process and the supplying process will be repeated. Therefore, according to the substrate manufacturing apparatus and the substrate manufacturing method described above, since it is possible to mount the balls onto the substrate using the vacuum chucking head on which the balls have been vacuum-chucked with no excess or insufficiency, it is possible to reliably mount the balls onto the substrate with no excess or insufficiency.

Also, in the substrate manufacturing apparatus described above, it is possible to use a construction further comprising a flux applying apparatus that carries out an applying process to apply flux onto the substrate, wherein the flux applying apparatus includes: a squeegee unit including a squeegee that spreads out supplied flux on an application surface of the substrate; and an application mechanism that moves at least one of the squeegee unit and the substrate, which has a mask provided with an opening that exposes an application area for the flux out of the application surface pressed onto the application surface thereof, in a first direction so that the substrate and the squeegee unit become close to one another and a front end portion, which is linear when viewed from above, of the squeegee becomes pressed onto a surface of the mask and moves at least one of the squeegee unit and the substrate in a second direction across the application surface with the front end portion of the squeegee pressed onto the surface of the mask so as to spread out the flux on the application area, wherein the squeegee unit includes: a first base portion and a second base portion; a connecting mechanism that connects the first base portion and the second base portion while tolerating movement of the second base portion relative to the first base portion along the first direction; and an energizing member that energizes the first base portion and the second base portion in a direction where the first base portion and the second base portion move apart, the squeegee is attached to the second base portion via a rotational shaft whose axis is disposed along the second direction, and the ball mounting apparatus mounts the balls onto the substrate after the applying process has been carried out. Also, in the substrate manufacturing method described above, it is possible to use a method further comprising an applying process that moves at least one of a squeegee unit including a squeegee that spreads out supplied flux on an application surface of the substrate and the substrate, which has a mask provided with an opening that exposes an application area for the flux out of the application surface pressed onto the application surface thereof, in a first direction so that the substrate and the squeegee unit become close to one another and a front end portion, which is linear when viewed from above, of the squeegee becomes pressed onto a surface of the mask and moves at least one of the squeegee unit and the substrate in a second direction across the application surface with the front end portion of the squeegee pressed onto the surface of the mask so as to spread out the flux on the application area, wherein the applying process is carried out using the squeegee unit which includes: a first base portion and a second base portion; a connecting mechanism that connects the first base portion and the second base portion while tolerating movement of the second base portion relative to the first base portion along the first direction; and an energizing member that energizes the first base portion and the second base portion in a direction where the first base portion and the second base portion move apart, wherein the squeegee is attached to the second base portion via a rotational shaft whose axis is disposed along the second direction, and the balls are mounted onto the substrate after the applying process has been carried out. By using the construction and method described above, even if the squeegee has been attached in an inclined state, if the mask or the substrate on which the squeegee is pressed during the application of the flux is inclined, or if the front end portion of the squeegee has become slanted due to grinding, when at least one of the squeegee unit and the substrate is moved so that the front end portion of the squeegee main body contacts the surface of the mask, the squeegee will rotate with respect to the second base portion about the rotational shaft, and as a result, it is possible for the entire width of the front end portion of the squeegee to contact the mask. Also, when at least one of the squeegee unit and the substrate is lowered further, the energizing members press the second base portion with respect to the first base portion in a direction away from each other. As a result, it is possible for the front end portion of the squeegee that is attached to the second base portion to press on the surface of the mask with a sufficient pressing force. By doing so, according to the substrate manufacturing apparatus and the substrate manufacturing method described above, since a complex operation that finely adjusts the fixed position of the squeegee unit relative to the moving mechanism, for example, to avoid inclination of the squeegee is not necessary, it is possible not only to easily attach the squeegee unit to the moving mechanism, for example, but also to spread out the flux in a state where the entire width of the front end portion is pressed onto the surface of the mask with a uniform pressing force in the various states described above. As a result, it is possible to apply the flux onto the application area of the substrate uniformly without inconsistencies in application.

Further, in the substrate manufacturing apparatus described above, it is possible to use a construction where the ball vacuum chucking apparatus includes a moving mechanism, and during the supplying process, the moving mechanism moves at least one of the vacuum chucking head and the vacuum chucking/holding unit in a state where the vacuum chucking/holding unit that holds the balls on the front end portion thereof and the vacuum chucking surface of the vacuum chucking head have been brought relatively close to one another so that the vacuum chucking/holding unit moves relatively across the vacuum chucking surface. Also, in the substrate manufacturing method described above, it is possible to use a method where during the supplying process, at least one of the vacuum chucking head and the vacuum chucking/holding unit is moved in a state where the vacuum chucking/holding unit that holds the balls on the front end portion thereof and the vacuum chucking surface of the vacuum chucking head have been brought relatively close to one another so that the vacuum chucking/holding unit moves relatively across the vacuum chucking surface. By using the construction and method described above, it is possible to supply the balls held on the front end portion of the vacuum chucking/holding unit little by little in a distributed manner as the vacuum chucking/holding unit moves. As a result, it is possible to prevent excessive supplying of the balls even more reliably and to further suppress the adhesion of excess balls. Therefore, according to the substrate manufacturing apparatus and the substrate manufacturing method described above, it is possible to reliably prevent the mounting of excess balls on the substrate, that is, the excessive mounting of balls on the substrate.

Further, in the substrate manufacturing apparatus described above, it is possible to use a construction where the ball mounting apparatus includes a plurality of vacuum chucking heads and a mounting unit that mounts the balls held by the vacuum chucking heads onto the substrate by carrying out a moving process that moves one out of the vacuum chucking heads and the substrate toward the other out of the vacuum chucking heads and the substrate, the vacuum chucking heads are constructed so that diameters of the suction inlets on each vacuum chucking head differ corresponding to diameters of the balls, and the mounting unit carries out the moving process for each vacuum chucking head so as to mount, on a single substrate, a plurality of types of the balls with different diameters corresponding to the diameters of the suction inlets of the vacuum chucking heads. Also, in the substrate manufacturing method described above, it is possible to use a method where when the balls held by the vacuum chucking head are mounted onto the substrate by carrying out a moving process that moves one out of the vacuum chucking head and the substrate toward the other out of the vacuum chucking head and the substrate, the moving process is carried out separately for a plurality of vacuum chucking heads where diameters of the suction inlets on each vacuum chucking head differ corresponding to diameters of the balls so as to mount, on a single substrate, a plurality of types of the balls with different diameters corresponding to the diameters of the suction inlets. By using the construction and method described above, it is possible to reliably mount a plurality of types of balls with different diameters (i.e., different sizes) on a substrate with a complex construction where the intervals between adjacent terminals differ in different areas and/or the thickness of lead wires to be connected differs in different areas.

Further, in the substrate manufacturing apparatus described above, it is possible to use a construction where the ball mounting apparatus includes a ball refilling apparatus that carries out a refilling process that refills the holding vessel with the balls, wherein the ball refilling apparatus includes: a refilling vessel that stores the balls and in which a discharge opening that discharges the stored balls is formed; a mounting portion on which the refilling vessel is mounted in a state where the discharge opening faces downward and in which a holding portion, which is connected to the discharge opening in a mounted state and which is capable of holding the balls, is formed; and a rotating mechanism that rotates the mounting portion so as to enable an angle of inclination of the mounting portion to be changed, wherein the holding portion includes a storage portion that stores the balls discharged from the discharge opening of the refilling vessel and a movement path that joins the storage portion to a refilling opening that is formed at an edge of the mounting portion and enables the balls to fall out of the mounting portion, and during a standby state, the rotating mechanism keeps the mounting portion in a first posture where the storage portion is positioned lower than the refilling opening and during the refilling process, the rotating mechanism rotates the mounting portion to a second posture where the refilling opening becomes positioned lower than the storage portion. Also, in the substrate manufacturing method described above, it is possible to use a method where when a refilling process that refills the holding vessel with the balls is carried out, a ball refilling apparatus is used, the ball refilling apparatus including: a refilling vessel that stores the balls and in which a discharge opening that discharges the stored balls is formed; a mounting portion on which the refilling vessel is mounted in a state where the discharge opening faces downward and in which a holding portion, which is connected to the discharge opening in a mounted state and which is capable of holding the balls, is formed; and a rotating mechanism that rotates the mounting portion so as to enable an angle of inclination of the mounting portion to be changed, wherein the holding portion includes a storage portion that stores the balls discharged from the discharge opening of the refilling vessel and a movement path that joins the storage portion to a refilling opening that is formed at an edge of the mounting portion and enables the balls to fall out of the mounting portion, and during a standby state, the rotating mechanism keeps the mounting portion in a first posture where the storage portion is positioned lower than the refilling opening and during the refilling process, the rotating mechanism rotates the mounting portion to a second posture where the refilling opening becomes positioned lower than the storage portion. By using the construction and method described above, without using a refilling vessel that needs to be manufactured precisely, it is possible to store an appropriate amount of balls that is set in advance in the storage portion of the holding portion in the standby state. Also, in spite of using a simple construction where the mounting portion is rotated during the refilling process to change the posture of the mounting portion from the first posture to the second posture, it is possible to reliably refill the holding vessel with an appropriate amount of balls. Therefore, according to the substrate manufacturing apparatus and the substrate manufacturing method described above, it is possible to use a refilling vessel and a rotating mechanism of a simple construction, which means that it is possible to sufficiently reduce the manufacturing cost of the ball refilling apparatus, the ball mounting apparatus, and the substrate manufacturing apparatus.

Further, in the substrate manufacturing apparatus described above, it is possible to use a construction further comprising a dicing apparatus that carries out a dicing process that dices a multi-substrate panel on which a plurality of substrates are formed to divide the multi-substrate panel into the plurality of substrates and a testing apparatus that carries out electrical testing on the substrates produced by the dicing process, wherein the ball mounting apparatus mounts the balls on only the substrates that have been judged to be non-defective in the electrical testing. Also, in the substrate manufacturing method described above, it is possible to use a method where a dicing process that dices a multi-substrate panel on which a plurality of substrates are formed to divide the multi-substrate panel into the plurality of substrates and electrical testing of the substrates produced by the dicing process are carried out, and the balls are mounted on only the substrates that have been judged to be non-defective in the electrical testing. By using the construction and method described above, it is possible to reliably avoid the mounting of balls onto substrates that are electrically defective. By doing so, it is possible to reliably suppress wasteful consumption of the balls, and as a result, it is possible to sufficiently reduce the manufacturing cost.

With the substrate manufacturing apparatus described above, the ball vacuum chucking apparatus of the ball mounting apparatus may include a rotating mechanism that rotates the vacuum chucking/holding unit, the vacuum chucking/holding unit may be disposed at the opening of the holding vessel and may be constructed so as to be capable of being rotated about a base end portion thereof by the rotating mechanism in a state where the balls are held on the front end portion, and the rotating mechanism may rotate the vacuum chucking/holding unit during execution of the supplying process so that the front end portion that holds the balls faces the vacuum chucking surface. Also with the substrate manufacturing method described above, during execution of the vacuum chucking process, the balls may be placed on the front end portion of a vacuum chucking/holding unit that is disposed at the opening of the holding vessel and is capable of rotating about the base end portion thereof in a state where the balls are held on the front end portion, and during the supplying process, the vacuum chucking/holding unit may be rotated so that the front end portion that holds the balls faces the vacuum chucking surface. By using the construction and method described above, in spite of using a simple construction where the vacuum chucking/holding unit is merely rotated, it is possible to reliably supply an appropriate amount of balls to the vacuum chucking head.

Also, with the substrate manufacturing apparatus described above, it is possible to integrate the holding vessel and the vacuum chucking/holding unit of the ball vacuum chucking apparatus of the ball mounting apparatus. Similarly, with the substrate manufacturing method described above, during execution of the vacuum chucking process, it is possible to carry out the supplying process using the holding vessel and the vacuum chucking/holding unit that have been integrated. By using the construction and method described above, compared to a construction and method that use a holding vessel and a vacuum chucking/holding unit which are constructed separately and move such components separately using a plurality of moving mechanisms, it is possible to move the holding vessel and the vacuum chucking/holding unit together using a single moving mechanism. As a result, it is possible to simplify the construction of the ball vacuum chucking apparatuses, the solder ball mounting apparatus, and the substrate manufacturing apparatus and to improve the processing efficiency thereof.

Also, with the substrate manufacturing apparatus described above, it is also possible to integrate the holding vessel, the vacuum chucking/holding unit, and the suction unit in the ball vacuum chucking apparatus of the ball mounting apparatus. Similarly, with the substrate manufacturing method described above, during execution of the vacuum chucking process, it is also possible to carry out the supplying process and the suction process using the holding vessel, the vacuum chucking/holding unit, and the suction unit that have been integrated. By using the construction and method described above, compared to a construction and method that use a holding vessel, a vacuum chucking/holding unit, and a suction unit which are separately constructed and move such components separately using a plurality of moving mechanisms, it is possible to move such components together using a single moving mechanism. As a result, it is possible to simplify the construction of the ball vacuum chucking apparatuses, the ball mounting apparatus, and the substrate manufacturing apparatus and to improve the processing efficiency thereof.

Also, with the substrate manufacturing apparatus described above, the ball vacuum chucking apparatus of the ball mounting apparatus may include an alignment plate that is constructed so as to be detachably attached to the vacuum chucking head and in which are formed a plurality of through-holes through which the balls can pass and which become connected to the suction inlets when the alignment plate has been attached with one surface thereof in contact with the vacuum chucking surface, and the supplying process and the suction process may be carried out in a state where the alignment plate has been attached to the vacuum chucking head. Similarly, with the substrate manufacturing method described above, during execution of the vacuum chucking process, an alignment plate that is constructed so as to be detachably attached to the vacuum chucking head and in which are formed a plurality of through-holes through which the balls can pass and which become connected to the suction inlets when the alignment plate has been attached with one surface thereof in contact with the vacuum chucking surface may be attached to the vacuum chucking head and the supplying process and the suction process may be carried out in such state. By using the construction and method described above, it is possible to reliably supply the balls one at a time to the respective suction inlets of the vacuum chucking head during the supplying process.

Also, with the substrate manufacturing apparatus described above, the ball mounting apparatus may include a second detecting unit that carries out a second detecting process that detects whether adhering matter adheres to the vacuum chucking head after the balls have been mounted on the substrate and a second removing unit that carries out a second removing process that removes the adhering matter from the vacuum chucking head, and the control unit may have the second removing process carried out when flux has been detected as the adhering matter in the second detecting process. Similarly, with the substrate manufacturing method described above, a second detecting process that detects whether adhering matter adheres to the vacuum chucking head after the balls have been mounted on the substrate may be carried out and a second removing process that removes the adhering matter from the vacuum chucking head may be carried out when flux has been detected as the adhering matter in the second detecting process. By using the construction and method described above, even if flux applied to the substrate adheres to the vacuum chucking head when the balls are mounted onto the substrate and/or balls adhere to the vacuum chucking head due to the adhesion of flux, it will still be possible to reliably remove such flux and/or balls (adhering matter). As a result, it is possible to reliably prevent a situation where the execution of various subsequent processes is obstructed by adhering matter that adheres to the vacuum chucking head.

Also, with the substrate manufacturing method described above, the ball mounting apparatus may include a second detecting unit that carries out a second detecting process that detects whether adhering matter adheres to the vacuum chucking head after the balls have been mounted on the substrate and a second removing unit that carries out a second removing process that removes the adhering matter from the vacuum chucking head, and the control unit may have the first removing process carried out when the balls have been detected as the adhering matter without flux having been detected as the adhering matter in the second detecting process. Similarly, with the substrate manufacturing method described above, a second detecting process that detects whether adhering matter adheres to the vacuum chucking head after the balls have been mounted on the substrate may be carried out and the first removing process may be carried out when the balls have been detected as the adhering matter without flux having been detected as the adhering matter in the second detecting process. By using the construction and method described above, if, for example, only balls adhere to the vacuum chucking head with no adhesion of flux when the balls are mounted onto the substrate, it will be possible to reliably remove such balls (adhering matter) by carrying out the first removing process that is less time-consuming than the second removing process that removes the flux. As a result, it is possible to sufficiently reduce the processing time.

Also, with the substrate manufacturing apparatus described above, it is possible to use a construction where a concave or cutaway part for avoiding contact with balls that have already been mounted on the substrate is formed in the vacuum chucking head of the ball mounting apparatus. Also, with the substrate manufacturing method described above, it is possible to use a vacuum chucking head in which a concave or cutaway part for avoiding contact with balls that have already been mounted on the substrate is formed. By using the construction and method described above, when, for example, the mounting unit carries out the moving process for the vacuum chucking head where the suction inlets have a large diameter before the moving process for the vacuum chucking head where the suction inlets have a small diameter, it is possible to reliably avoid contact between the balls that have already been mounted on the substrate and the vacuum chucking head, and as a result, it is possible to reliably avoid having the balls that have been mounted knocked off by contact.

Also, with the substrate manufacturing apparatus described above, it is possible to use a construction where the mounting unit of the ball mounting apparatus is equipped with the same number of moving mechanisms, which each carry out a process that moves a vacuum chucking head toward the substrate as the moving process, as the number of vacuum chucking heads, with the moving mechanisms moving the vacuum chucking heads separately. Similarly, with the substrate manufacturing method described above, it is possible to carry out a process that moves a vacuum chucking head toward the substrate as the moving process separately for each vacuum chucking head using the same number of moving mechanisms as the number of vacuum chucking heads. By using the construction and method described above, compared to a construction where a plurality of vacuum chucking heads are interchanged and moved by a single moving mechanism, it is possible to reduce the processing time by the time required to interchange the vacuum chucking heads, which makes it possible to sufficiently improve the processing efficiency Also, with the substrate manufacturing apparatus described above, the mounting unit of the ball mounting apparatus may carry out the moving process that moves the vacuum chucking head where the inlet diameter is small before the moving process that moves the vacuum chucking head where the inlet diameter is large. Similarly, with the substrate manufacturing method described above, the moving process that moves the vacuum chucking head where the inlet diameter is small may be carried out before the moving process that moves the vacuum chucking head where the inlet diameter is large. By using the construction and method described above, when, for example, the balls mounted by a previous moving process are sufficiently larger than the balls mounted by a later moving process, it is possible to reliably avoid contact between the balls that have been mounted and the vacuum chucking head moved by the later moving process without providing a concave or cutaway part. Therefore, according to the substrate manufacturing apparatus and the substrate manufacturing method, in spite of using a vacuum chucking head of a simple construction that is not provided with a concave or cutaway part, it is still possible to reliably avoid having the balls that have been mounted knocked off by contact with the vacuum chucking head.

Also, with the substrate manufacturing apparatus described above, the storage portion of the ball refilling apparatus in the ball mounting apparatus may be formed in a U shape when viewed from above or from the side and the movement path may be formed in a straight line when viewed from above or from the side. Similarly, with the substrate manufacturing method described above, it is possible to use a ball refilling apparatus with a mounting portion including a hold where the storage portion is formed in a U shape when viewed from above or from the side and the movement path is formed in a straight line when viewed from above or from the side. By using the construction and method described above, since the U-shaped convex part of the storage portion becomes positioned lower when the mounting portion is placed in the first posture, by connecting the discharge opening of the refilling vessel to the end of the storage portion, it is possible to reliably store an appropriate amount of the solder balls in a region that extends from such end to the U-shaped convex part. Also, when the mounting portion is placed in the second posture, it is possible to cause the stored balls to slide down the movement path and reliably move toward the refilling opening. In addition, since the end of the storage portion that is connected to the discharge opening of the refilling vessel becomes positioned lower than the U-shaped convex part when the mounting portion is placed in the second posture, the balls discharged from the refilling vessel will be blocked by the end of the storage portion. As a result, it is possible to prevent balls aside from the balls stored in the storage portion of the holding portion from crossing the surface of the mounting portion and falling from positions aside from the refilling opening.

The substrate manufacturing apparatus described above may also include an oxidization preventing gas supplying unit that supplies oxidization preventing gas into the refilling vessel of the ball refilling apparatus of the ball mounting apparatus. Similarly, the substrate manufacturing method described above may also supply oxidization preventing gas into the refilling vessel of the ball refilling apparatus. By using the construction and method described above, it is possible to reliably prevent oxidization of the balls held in the refilling vessel. This means that it is possible to reliably prevent a situation where the refilling process becomes difficult due to the balls becoming joined together to form lumps.

Also, with the substrate manufacturing apparatus described above, the ball refilling apparatus may carry out the refilling process when a condition set in advance is satisfied. Similarly, the substrate manufacturing method described above may carry out the refilling process when a condition set in advance is satisfied. By using the construction and method described above, by carried out the refilling process when the process that mounts the balls onto the substrate has been carried out a predetermined number of times as one example of when the condition set in advance is satisfied, it is possible to reliably prevent a situation where the number of balls to be mounted onto the substrate is insufficient.

With the substrate manufacturing apparatus described above, the flux applying apparatus may be constructed so that the squeegee includes a squeegee main body and a third base portion that is attached to the second base unit via the rotational shaft and is detachably attached to the squeegee main body. Similarly, with the substrate manufacturing method described above, it is possible to carry out the applying process using a squeegee including a squeegee main body and a third base portion that is attached to the second base unit via the rotational shaft and is detachably attached to the squeegee main body. By using the construction and method described above, it is possible during a grinding operation on the squeegee main body to remove only the squeegee main body from the third base portion without removing the entire squeegee unit. Also, when the squeegee main body has become short due to repeated grinding, by replacing only the squeegee main body with a new component, it is possible to continue using the first base portion, the second base portion, the third base portion, and the like. This makes it possible to sufficiently reduce the running cost of the flux applying apparatus.

With the substrate manufacturing apparatus described above, the testing apparatus may carry out the electrical testing on the substrates that have been produced by dicing by the dicing apparatus. Similarly, with the substrate manufacturing method described above, it is possible to carry out the electrical testing after the dicing process has been carried out. By using the construction and method described above, as one example, even if broken wires or shorting has occurred in the conductive pattern, terminals, or through holes of the substrate due to vibrations and the like during the dicing process, it will still be possible to reliably judge that the substrate in question is defective. Therefore, according to the substrate manufacturing apparatus and the substrate manufacturing method described above, in addition to it being possible to suppress the wasteful consumption of balls due to the mounting of balls on substrates that have become defective during manufacturing of the multi-substrate panel, it is also possible to reliably suppress the wasteful consumption of balls due to mounting of the balls on substrates that have become defective due to the dicing process. As a result, it is possible to significantly reduce the manufacturing cost.

Further, a ball-mounted substrate according to the present invention is manufactured by the substrate manufacturing apparatus described above.

Also, a ball-mounted substrate according to the present invention is manufactured by the substrate manufacturing method described above.

The solder-mounted substrate is manufactured by the substrate manufacturing apparatus or the substrate manufacturing method described above. This means that with the solder-mounted substrate, the excessive mounting of the balls on the substrate is reliably prevented, and as a result, when the balls are melted and attached to the substrate, a situation where excessively mounted balls become connected to one another due to the melting of the balls is avoided. Therefore, according to the solder-mounted substrate, when an electronic component is mounted, it is possible to reliably prevent the occurrence of defects whereby the terminals of the electronic components are short circuited via the connected balls (the solder).

Further, in an electronic component-mounted substrate according to the present invention, an electronic component is mounted on the ball-mounted substrate described above via the balls attached to the ball-mounted substrate.

With the electronic component-mounted substrate, the electronic component that is connected via the balls attached to ball-mounted substrate described above is mounted on the ball-mounted substrate. This means that with the electronic component-mounted substrate, a situation where excessively mounted balls become connected to one another due to the melting of the balls is avoided, and as a result, when the electronic component is installed, defects whereby the terminals of the electronic component are short circuited via the connected balls (the solder) are reliably prevented. Therefore, according to the electronic component-mounted substrate, it is possible to reliably prevent defects from occurring in products that use the electronic component-mounted substrate.

It should be noted that the disclosure of the present invention relates to a content of Japanese Patent Application 2009-028069 that was filed on 10 Feb. 2009, Japanese Patent Application 2009-164366 that was filed on 13 Jul. 2009, Japanese Patent Application 2009-177156 that was filed on 30 Jul. 2009, Japanese Patent Application 2009-204335 that was filed on 4 Sep. 2009, Japanese Patent Application 2009-212601 that was filed on 15 Sep. 2009, Japanese Patent Application 2009-233131 that was filed on 7 Oct. 2009, and Japanese Patent Application 2010-001737 that was filed on 7 Jan. 2010, the entire contents of all of which are herein incorporated by reference.

BRIEF DESCRIPTION OF THE DRAWINGS

These and other objects and features of the present invention will be explained in more detail below with reference to the attached drawings, wherein:

FIG. 52 is a first schematic diagram useful in explaining the operation of the solder ball refilling apparatus;

FIG. 61 is a third schematic diagram useful in explaining the operation of the conventional solder ball mounting apparatus.

DESCRIPTION OF THE PREFERRED EMBODIMENTS

Preferred embodiments of a substrate manufacturing apparatus, a substrate manufacturing method, a ball-mounted substrate, and an electronic component-mounted substrate will now be described with reference to the attached drawings.

Figure 4:
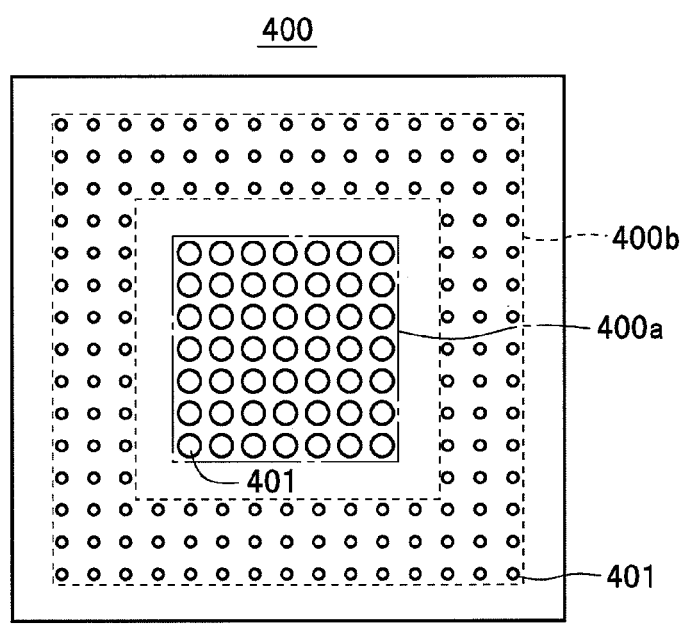
FIG. 4 is a plan view showing the construction of a substrate.

First, the construction of a solder-mounted substrate manufacturing apparatus 1 shown in FIG. 1 (hereinafter also referred to simply as the "manufacturing apparatus 1") will be described. The manufacturing apparatus 1 is one example of a substrate manufacturing apparatus (a ball-mounted substrate manufacturing apparatus) and is constructed so as to be capable of manufacturing a solder-mounted substrate (ball-mounted substrate) 600 (see FIG. 51) in accordance with a substrate manufacturing method (a ball-mounted substrate manufacturing method). More specifically, the manufacturing apparatus 1 mounts two types of solder balls (microballs) 300a, 300b (see FIGS. 22, 24: hereinafter collectively referred to as the "solder balls 300" when no distinction is required) that are tiny spherical particles as one example of balls on terminals 401 (see FIG. 4) of the substrate 400 as a mounted body and melts (reflows) the solder balls 300 to attach the solder balls 300 to the substrate 400.

Figure 5:
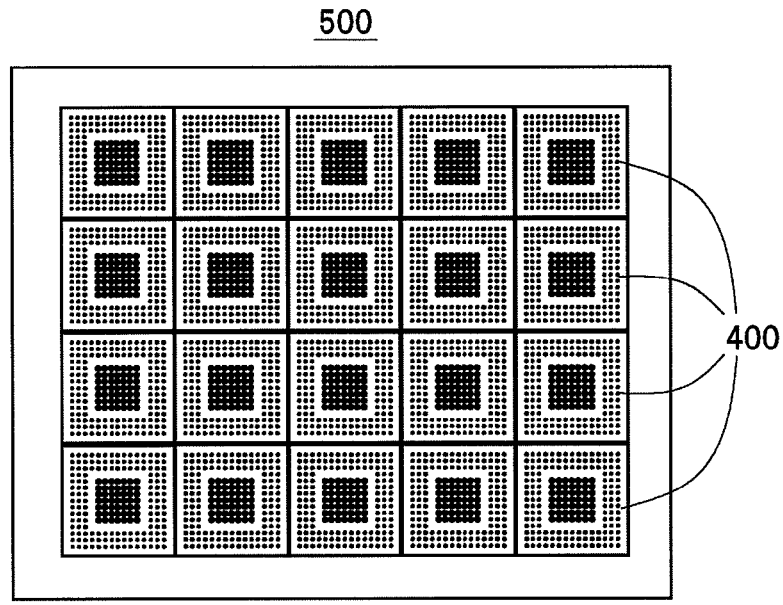
FIG. 5 is a plan view of a multi-substrate panel.
Figure 6:
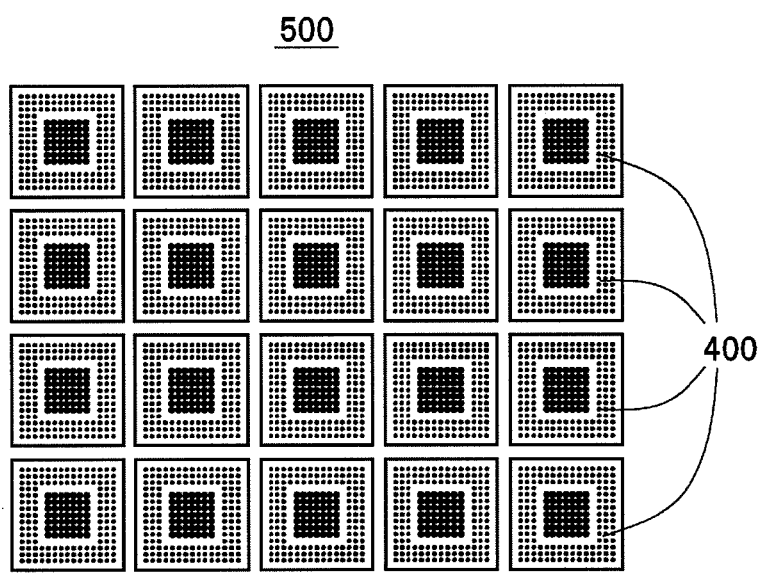
FIG. 6 is a plan view showing a state where the multi-substrate panel has been diced to divide the multi-substrate panel into substrates.
Figure 24:
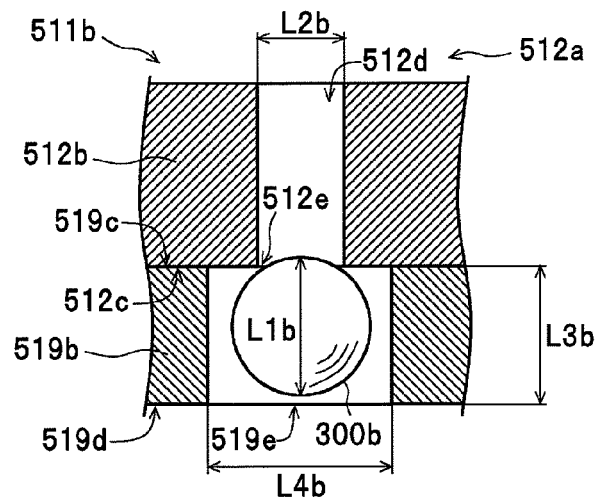
FIG. 24 is a cross-sectional view showing the construction of a bottom wall of the vacuum chucking head and an alignment plate.

The solder balls 300a are composed of balls with a diameter L1a (see FIG. 22) of around 70 μm and the solder balls 300b are composed of balls with a diameter L1b of around 50 μm (see FIG. 24: hereinafter the diameters L1a, L1b are collectively referred to as the "diameter L1" when no distinction is required). On the substrate 400, as one example, a plurality of the terminals 401 with a large diameter to which thick lead wires are to be connected are formed in a first area 400a (see FIG. 4) in the center and a plurality of the terminals 401 with a smaller diameter than the terminals 401 in the first area 400a are formed at short intervals in a second area 400b (see FIG. 4) in the outer periphery. Accordingly, on the substrate 400, large (i.e., large-diameter) solder balls 300a are mounted on the terminals 401 formed in the first area 400a to reliably connect the thick lead wires and small (i.e., small-diameter) solder balls 300b are mounted on the terminals 401 formed in the second area 400b to prevent shorting between the terminals 401. Note that after the solder balls 300a, 300b have been mounted on the substrate 400 by a solder ball mounting apparatus 5, described later, by heating and melting the solder balls 300a, 300b (i.e., carrying out a reflow process) using a melting apparatus 7, also described later, a ball grid array (BGA) is constructed on the substrate 400. Also, as shown in FIGS. 5 and 6, the substrate 400 is produced by dicing a multi-substrate panel 500 on which a plurality of substrates 400 (pieces) are disposed (arranged).

Figure 1:
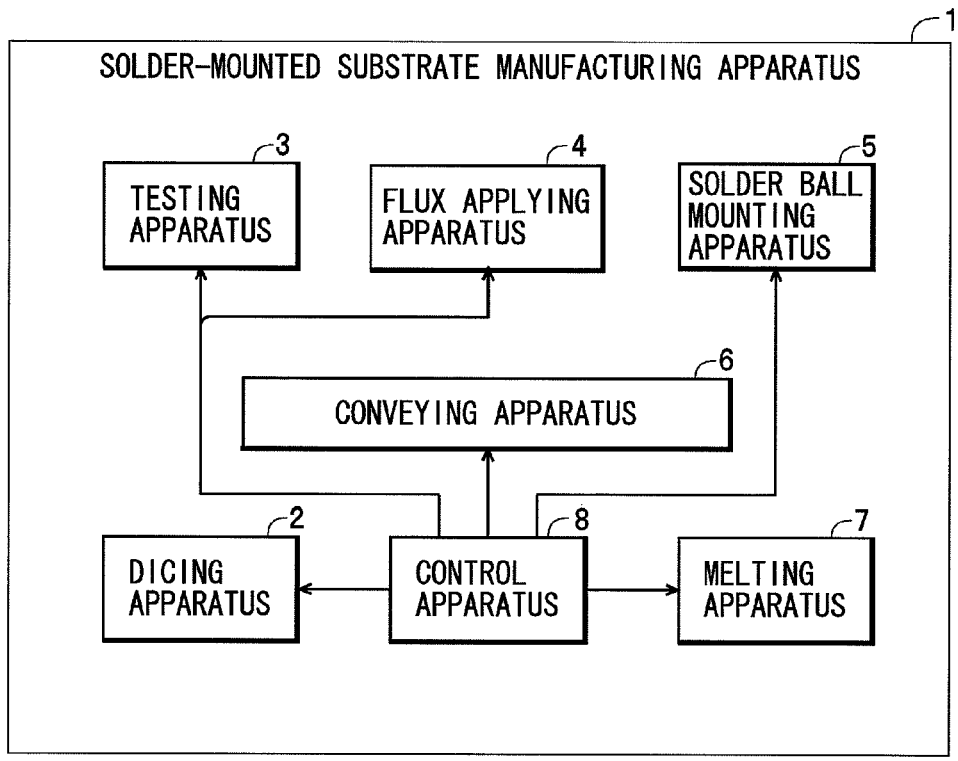
FIG. 1 is a diagram showing the construction of a solder-mounted substrate manufacturing apparatus.

As one example, as shown in FIG. 1, the manufacturing apparatus 1 includes a dicing apparatus 2, a testing apparatus 3, a flux applying apparatus 4, the solder ball mounting apparatus 5 (a ball mounting apparatus for the present invention), a conveying apparatus 6, the melting apparatus 7, and a control apparatus 8 (a control unit for the present invention).

Figure 2:
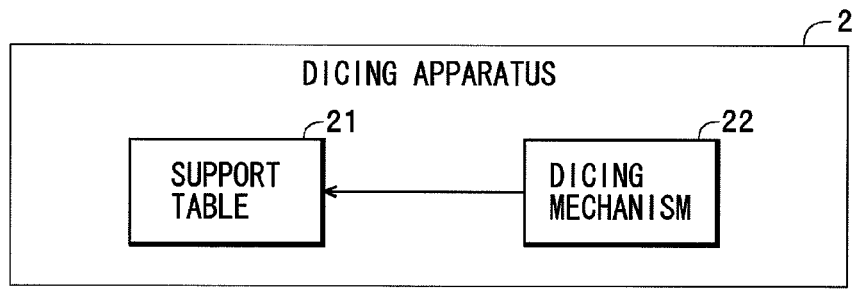
FIG. 2 is a diagram showing the construction of a dicing apparatus.

As shown in FIG. 2, the dicing apparatus 2 includes a support table 21 and a dicing mechanism 22 and carries out a dicing process that dices the multi-substrate panel 500 to divide the multi-substrate panel 500 into a plurality of the substrates 400. Here, the support table 21 is constructed so as to be capable of supporting the multi-substrate panel 500 that is supplied (mounted) by a substrate supplying apparatus, not shown. The dicing mechanism 22 dices the multi-substrate panel 500 by rotating a dicing blade and bringing the dicing blade into contact with the multi-substrate panel 500 mounted on the support table 21.

Figure 3:
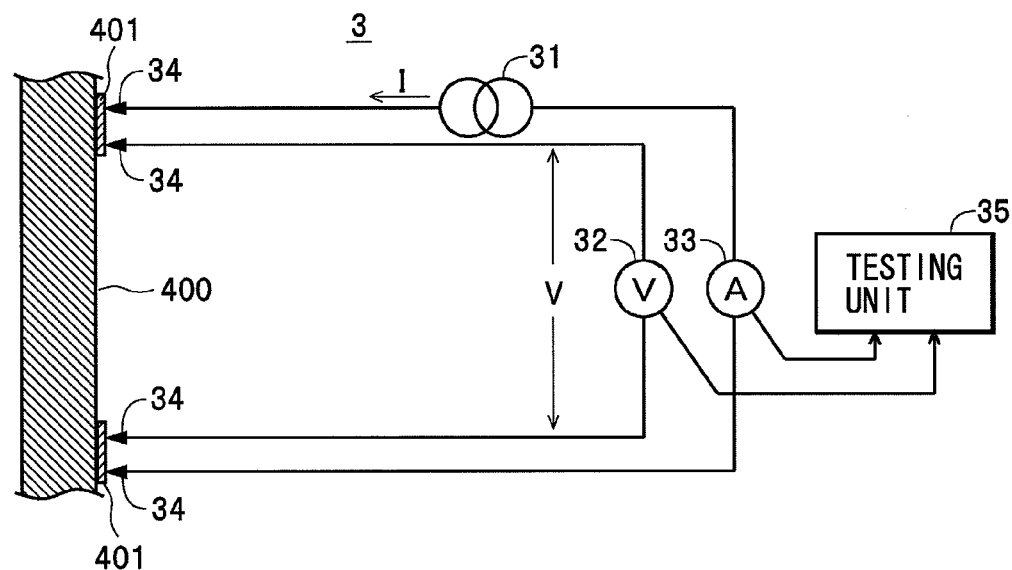
FIG. 3 is a diagram showing the construction of a testing apparatus.

As shown in FIG. 3, the testing apparatus 3 includes a power supply unit 31, a voltage detecting unit 32, a current detecting unit 33, a plurality of probes 34, and a testing unit 35, and by carrying out electrical testing on a substrate 400, judges whether the substrate 400 is defective or non-defective (more specifically, whether broken wires, shorting, and the like are present in a conductive pattern, not shown, formed on the substrate 400). Here, the power supply unit 31 outputs a test current I (as one example, a DC current). The voltage detecting unit 32 detects a voltage V produced between the terminals 401 presently being tested when the test current I is supplied via the probes 34 to such terminals 401, and the current detecting unit 33 detects the test current I being supplied. The testing unit 35 measures the resistance between the terminals 401 based on the voltage V detected by the voltage detecting unit 32 and the test current I detected by the current detecting unit 33 and judges, based on the measured resistance, whether broken wires, shorting, and the like are present in the conductive pattern, that is, whether the substrate 400 is defective or non-defective.

Figure 28:
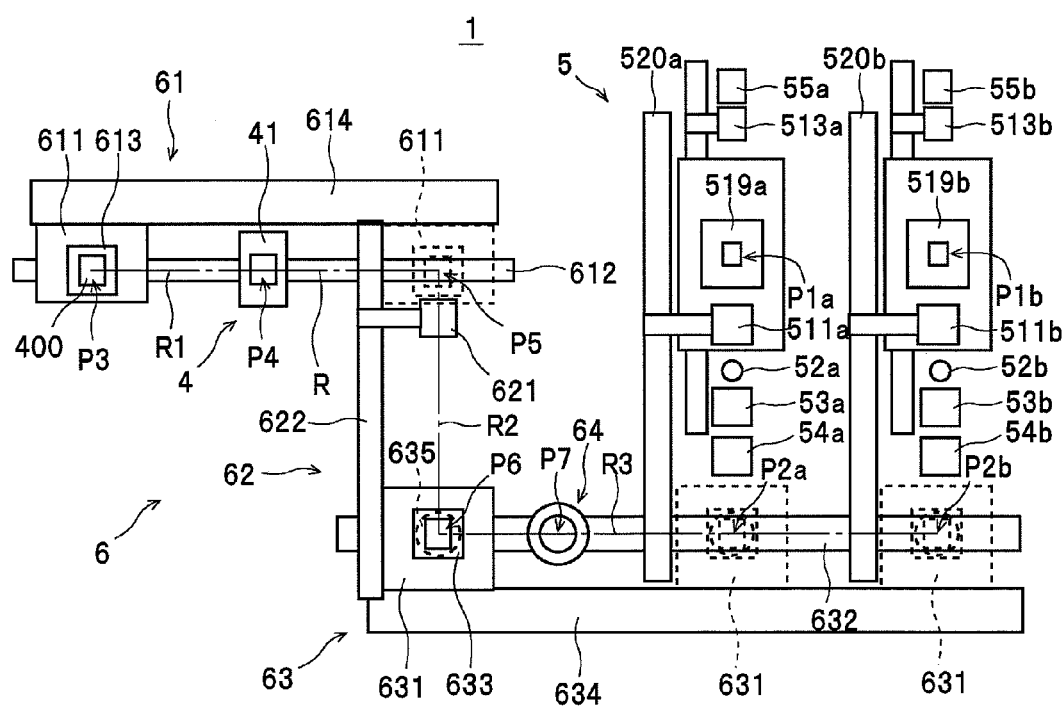
FIG. 28 is a schematic diagram useful in explaining the layout of the flux applying apparatus, the solder ball mounting apparatus, and the conveying apparatus.

As shown in FIG. 28, the flux applying apparatus 4 is disposed at an application position P4 located between a supply position P3, where a substrate 400 that has been judged to be non-defective by the testing apparatus 3 is supplied, and a second mounting position P2b described later. The flux applying apparatus 4 is constructed so as to be capable of carrying out an applying process that applies flux F (see FIG. 12) onto the surface of the substrate 400. More specifically, as shown in FIG. 7, the flux applying apparatus 4 includes a metal mask 41, an applying unit 42, a flux supplying unit 43, an applying mechanism 44, and a substrate conveying mechanism 45.

The metal mask 41 is constructed with a large area that includes a part of the substrate 400 where the ball grid array is to be formed (hereinafter also referred to as the "BGA formation portion") set as an application area Pa (see FIG. 11) and limits the area where the flux F is applied so that the flux F is applied to only the application area Pa. More specifically, as shown in FIGS. 11 to 14, the metal mask 41 is formed of a thin plate of a metal material such as stainless steel and as described later has an opening 411 that is rectangular when viewed from above formed therein so as to expose the application area Pa (that is, the large area including the BGA formation portion described above) where the flux F will be applied when the metal mask 41 has been pressed onto the surface (application surface) of the substrate 400. The thickness of the metal mask 41 is set in accordance with the applied thickness of the flux F to be applied on the application area Pa (that is, the amount of the flux F to be applied). Note that the mask used during the applying process that applies the flux F is not limited to the metal mask 41 described above and it is also possible to use a resin mask (i.e., a mask made of resin).

Figure 7:
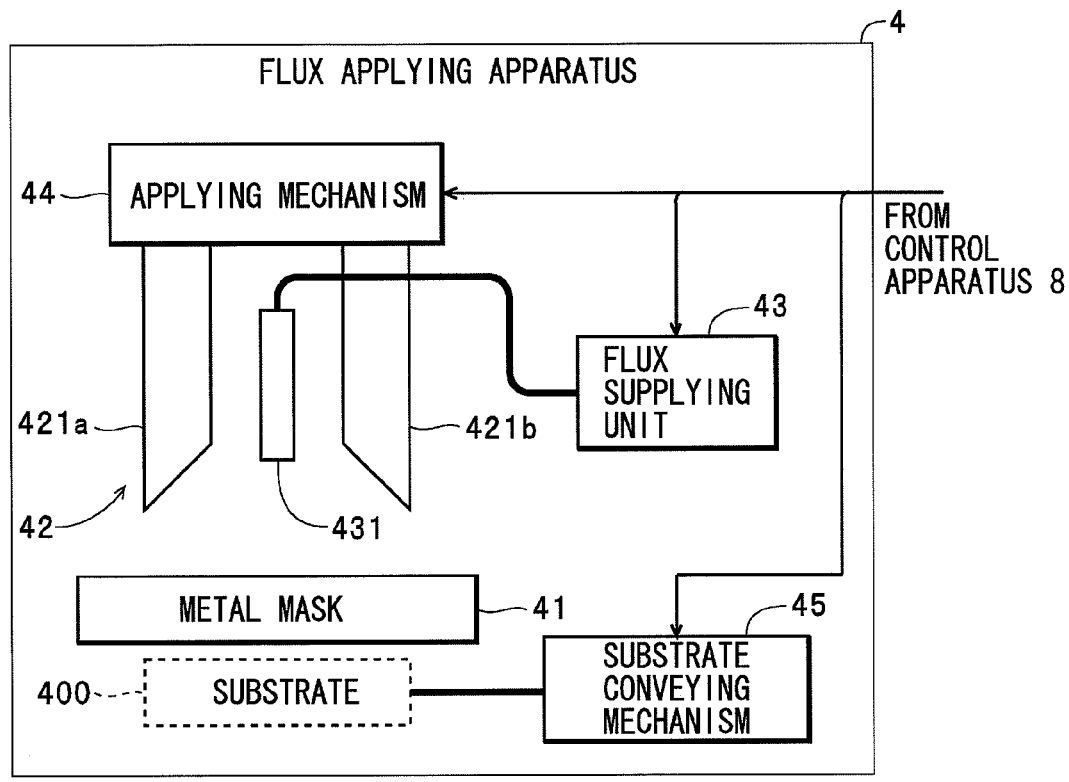
FIG. 7 is a diagram showing the construction of a flux applying apparatus.
Figure 8:
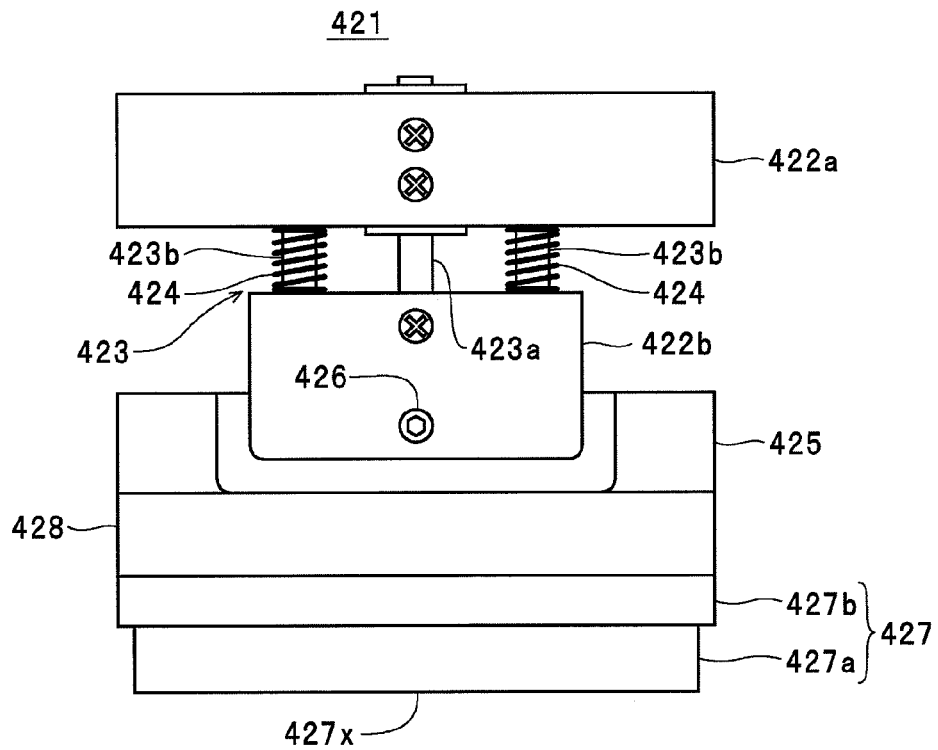
FIG. 8 is a front view of a squeegee unit.
Figure 9:
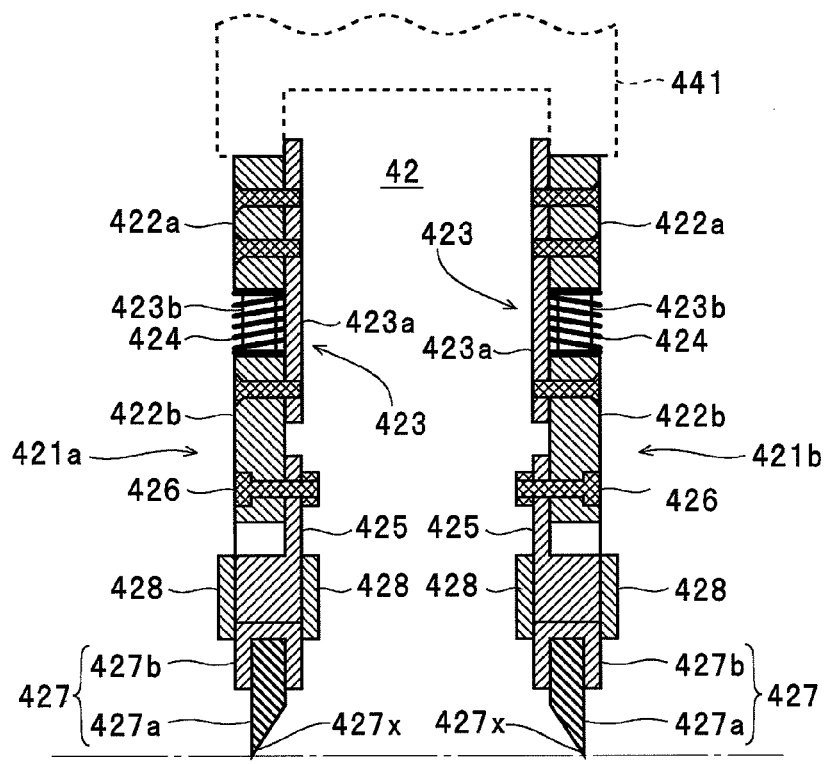
FIG. 9 is a cross-sectional view of the squeegee unit in a state where the squeegee unit has been attached to an attachment portion.

As shown in FIG. 7, as one example the applying unit 42 includes a pair of squeegee units 421a, 421b, and a nozzle 431 that sprays the flux F supplied from the flux supplying unit 43. The squeegee units 421a, 421b (hereinafter collectively referred to as the "squeegee units 421" when no distinction is required) are components for spreading out the flux F supplied from the flux supplying unit 43 and sprayed out from the nozzle 431 across the application area Pa of the substrate 400, and as shown in FIGS. 8 and 9, each include base portions 422a, 422b, a linear guide mechanism 423, springs 424, 424, a base portion 425, a rotational shaft 426, a squeegee main body 427, and attachment plates 428, 428.

The base portions 422a, 422b respectively correspond to a first base portion and a second base portion for the present invention and are connected to one another by the linear guide mechanism 423. The linear guide mechanism 423 is one example of a connecting mechanism for the present invention and connects the base portions 422a, 422b together while tolerating movement of the base portion 422b relative to the base portion 422a along an up-down direction (the direction of the arrow A shown in FIG. 10: a direction along a "first direction" that is a direction in which the squeegee units 421 are pressed onto the metal mask 41 by the applying mechanism 44). As shown in FIGS. 8 and 9, the linear guide mechanism 423 includes a shaft 423a disposed at the center in the width direction of the base portions 422a, 422b, and a pair of shafts 423b, 423b disposed at the respective ends in the width direction of the base portions 422a, 422b. In addition, springs 424 (coil springs: one example of "energizing members" for the present invention) that energize the base portions 422a, 422b so as to move apart are respectively attached around the shafts 423b.

Together with the squeegee main body 427, the base portion 425 constructs a so-called "squeegee".

Figure 10:
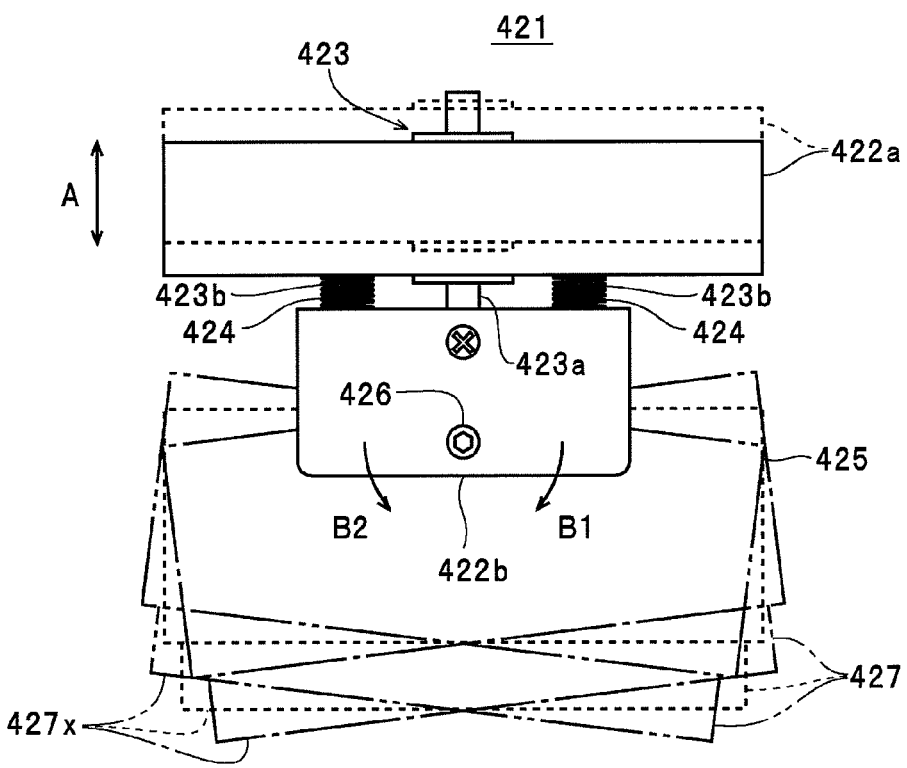
FIG. 10 is a schematic diagram useful in explaining the construction of the squeegee unit.

The base portion 425 corresponds to a third base portion for the present invention and is attached to the base portion 422b via the rotational shaft 426. Here, the rotational shaft 426 is disposed so that the axis thereof is aligned in a direction in which the applying mechanism 44 moves the squeegee units 421 during the applying process for the flux F carried out by the flux applying apparatus 4 (the direction of the arrow C shown in FIGS. 12 and 13 and the direction of the arrow D shown in FIG. 14: one example of the "second direction" for the present invention) and connects the base portions 422b, 425 together. Accordingly, as shown in FIG. 10, in each squeegee unit 421, the base portion 425 and the squeegee main body 427 (i.e., the squeegee) are capable of swinging in the direction of the arrows B1 and B2 with respect to the base portions 422a, 422b, and the like. By doing so, with the squeegee units 421, as described later, each position in the width direction of a front end portion 427x of the squeegee main body 427 is pressed with a uniform force onto the surface of the metal mask 41.

The squeegee main body 427 is formed separately to the base portion 425 and as shown in FIG. 9, is detachably attached to the base portion 425 so as to be sandwiched by the pair of attachment plates 428. Also, as one example, the squeegee main body 427 is constructed so that a plate-shaped portion 427a formed of a resin material (such as polyurethane) in the shape of a flat plate and a holder 427b that holds the plate-shaped portion 427a are integrated. The front end portion 427x of the plate-shaped portion 427a described above of the squeegee main body 427 is shaped like a straight line when viewed from above and is tapered so as to make line contact with the metal mask 41 or the substrate 400. Note that in place of a plate-shaped portion 427a made of resin, it is also possible to construct the squeegee main body 427 by holding a plate-shaped portion formed of various materials such as metal or ceramics using the holder 427b. It is also possible to construct the squeegee main body 427 by integrally forming the plate-shaped portion and the holder of a variety of materials such as a resin material, metal, or ceramics.

As shown in FIG. 7, the nozzle 431 is connected to the flux supplying unit 43, is disposed between the squeegee units 421a, 421b, and sprays the flux F supplied from the flux supplying unit 43 between the squeegee units 421a, 421b. By pumping a set amount of the flux F toward the applying unit 42 in accordance with control by the control apparatus 8, the flux supplying unit 43 supplies the flux F from the nozzle 431 onto the application surface of the substrate 400 (i.e., the surface of the metal mask 41 pressed onto the application surface: see FIG. 12).

As shown in FIG. 9, the applying mechanism 44 includes an attachment portion 441 for attaching the applying unit 42 (the squeegee units 421a, 421b and the nozzle 431), and moves the applying unit 42 relative to the metal mask 41 and the substrate 400 in accordance with control by the control apparatus 8. More specifically, as described later, the applying mechanism 44 lowers the applying unit 42 described above (the squeegee units 421) toward the substrate 400 that has been conveyed to an applying process position for the flux F by the substrate conveying mechanism 45 so as to press the front end portions 427x of the squeegee main bodies 427 onto the surface of the metal mask 41 (one example of a construction where the expression "at least one of the squeegee unit and the substrate that has a mask pressed thereupon" refers to "the squeegee units 421 (the applying unit 42)"). The applying mechanism 44 also moves both the squeegee units 421 in a state where the respective front end portions 427x of the squeegee main bodies 427 have been pressed onto the surface of the metal mask 41 in the direction of the arrow C shown in FIGS. 11 to 13 or the direction of the arrow D shown in FIGS. 11 and 14 to spread out the flux F onto the application area Pa of the substrate 400.

The substrate conveying mechanism 45 conveys the substrate 400 onto which the flux F is to be applied to the applying process position in accordance with control by the control apparatus 8 and conveys the substrate 400 on which the application of the flux F has been completed from the applying process position. The flux applying apparatus 4 is subjected to overall control by the control apparatus 8. More specifically, the control apparatus 8 outputs a control signal to the substrate conveying mechanism 45 to cause the substrate conveying mechanism 45 to convey the substrate 400 to the applying process position. As one example, the flux applying apparatus 4 uses a construction where the metal mask 41 is fixed at the applying process position and the substrate conveying mechanism 45 positions the substrate 400 at the applying process position by pressing the application surface onto the rear surface of the metal mask 41. The control apparatus 8 also outputs a control signal to the applying mechanism 44 to cause the applying mechanism 44 to move the applying unit 42 above the substrate 400 (i.e., above the metal mask 41) and outputs a control signal to the flux supplying unit 43 to cause the flux supplying unit 43 to supply the flux F. In addition, the control apparatus 8 controls the applying mechanism 44 to cause the applying mechanism 44 to move the applying unit 42 to thereby carry out the applying process that applies (spreads out) the flux F on the application surface of the substrate 400.

Figure 18:
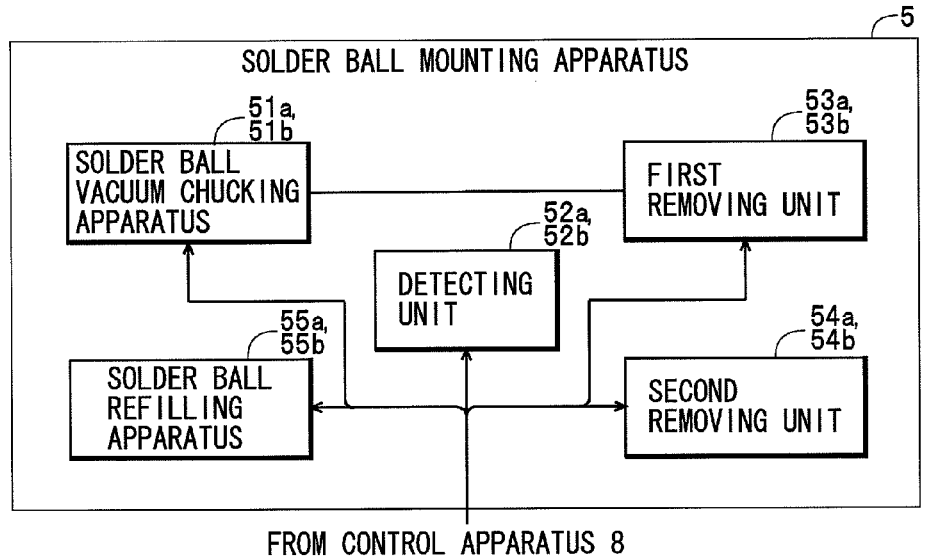
FIG. 18 is a diagram showing the construction of a solder ball mounting apparatus.

The solder ball mounting apparatus 5 is constructed so as to be capable of carrying out a mounting process (a first mounting process and a second mounting process, described later) that mounts the solder balls 300a and 300b onto the terminals 401 of the substrate 400. More specifically, as shown in FIG. 18, the solder ball mounting apparatus 5 includes solder ball vacuum chucking apparatuses (ball vacuum chucking apparatuses) 51a, 51b (hereinafter collectively referred to as the "solder ball vacuum chucking apparatus 51" when no distinction is required), detecting units 52a, 52b (hereinafter collectively referred to as the detecting unit 52 when no distinction is required), first removing units 53a, 53b (hereinafter collectively referred to as the "first removing unit 53" when no distinction is required), second removing units 54a, 54b (hereinafter collectively referred to as the "second removing unit 54" when no distinction is required), and solder ball refilling apparatuses 55a, 55b (hereinafter collectively referred to as the "solder ball refilling apparatus 55" when no distinction is required).

Figure 19:
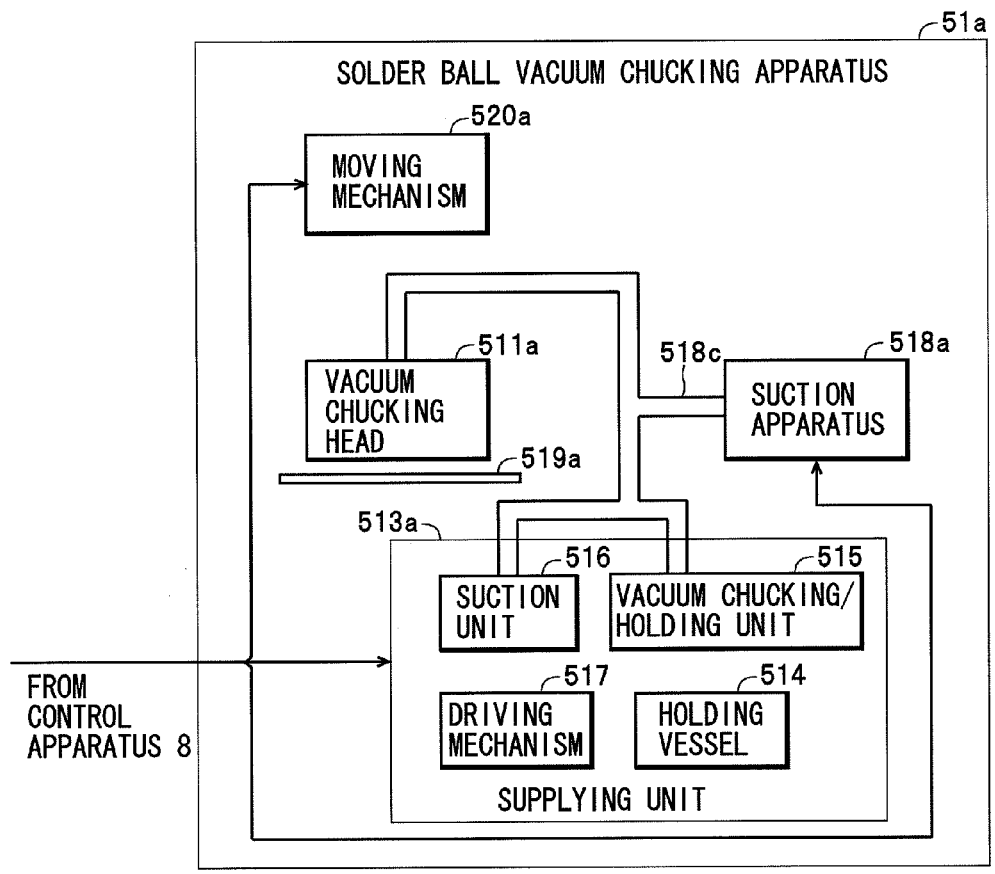
FIG. 19 is a diagram showing the construction of a solder ball vacuum chucking apparatus.
Figure 20:
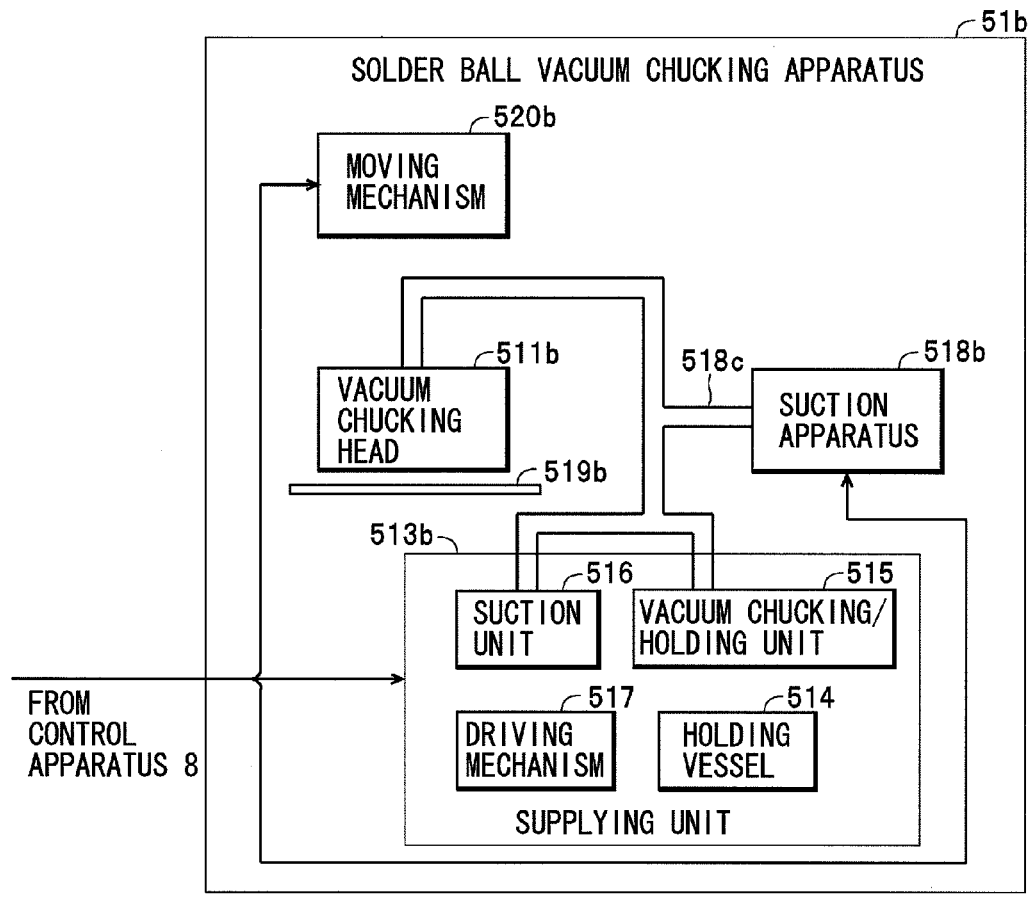
FIG. 20 is a diagram showing the construction of a solder ball vacuum chucking apparatus.

As shown in FIG. 19, the solder ball vacuum chucking apparatus 51a includes a vacuum chucking head 511a, a supplying unit 513a, a suction apparatus 518a, an alignment plate 519a, and a moving mechanism 520a, and chucks the solder balls 300a by suction by carrying out a supplying process and a suction process, described later. Similarly, as shown in FIG. 20, the solder ball vacuum chucking apparatus 51b includes a vacuum chucking head 511b (the vacuum chucking heads 511a, 511b are hereinafter collectively referred to as the "vacuum chucking head 511" when no distinction is required), a supplying unit 513b (the supplying units 513a, 513b are hereinafter collectively referred to as the "supplying unit 513" when no distinction is required), a suction apparatus 518b (the suction apparatuses 518a, 518b are hereinafter collectively referred to as the "suction apparatus 518" when no distinction is required), an alignment plate 519b (the alignment plates 519a, 519b are hereinafter collectively referred to as the "alignment plate 519" when no distinction is required), and a moving mechanism 520b (the moving mechanisms 520a, 520b are hereinafter collectively referred to as the "moving mechanism 520" when no distinction is required), and chucks the solder balls 300b by suction by carrying out a supplying process and a suction process. Here, a mounting unit for the present invention is constructed by the supplying units 513a, 513b, the alignment plates 519a, 519b, and the moving mechanism 520a, 520b.

Figure 21:
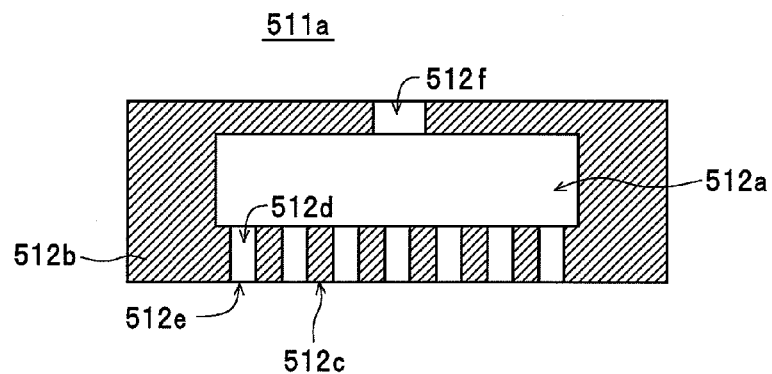
FIG. 21 is a cross-sectional view showing the construction of a vacuum chucking head.
Figure 22:
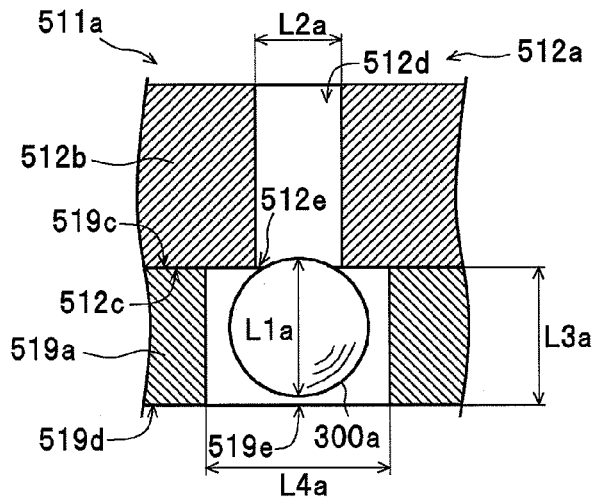
FIG. 22 is a cross-sectional view showing the construction of a bottom wall of the vacuum chucking head and an alignment plate.
Figure 23:
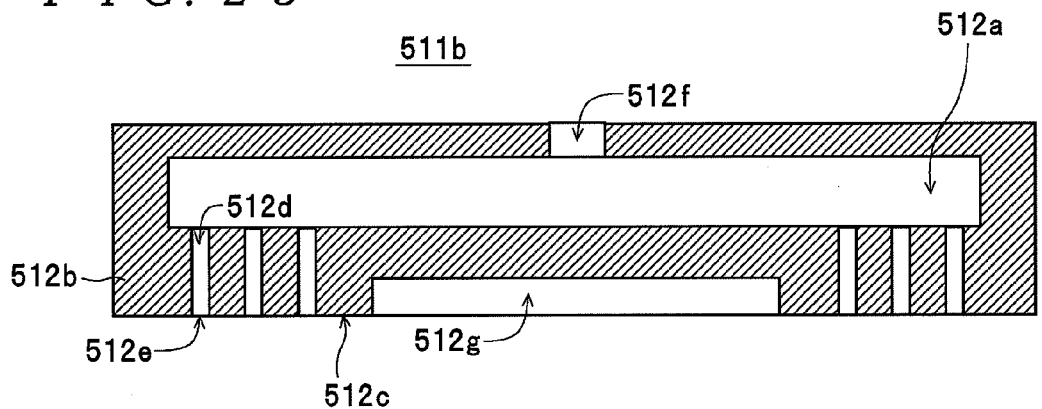
FIG. 23 is a cross-sectional view showing the construction of a vacuum chucking head.

The vacuum chucking heads 511a, 511b carry out a vacuum chucking process (holding process) to chuck and hold a plurality of solder balls 300 using suction. More specifically, as shown in FIGS. 21 and 23, as one example the vacuum chucking heads 511a, 511b are constructed in the form of boxes that have hollows 512a formed inside. Also, as shown in FIGS. 22 and 24, in a bottom wall 512b of each of the vacuum chucking heads 511a, 511b, a plurality of suction holes 512d that connect to the hollow 512a and are open on the outer surface (a surface that functions as a vacuum chucking surface, hereinafter also referred to as the "vacuum chucking surface 512c") of the bottom wall 512b are formed along the thickness direction of the bottom wall 512b (in both drawings only one of such suction holes 512d is shown). Note that the openings of the suction holes 512d on the vacuum chucking surface 512c correspond to suction inlets for the present invention (and are hereinafter also referred to as the "suction inlets 512e"). Also, as shown in FIG. 23, a concave 512g is formed in the vacuum chucking head 511b to avoid contact with the solder balls 300a that have already been mounted on the substrate 400 during execution of the second mounting process.

As shown in FIG. 22, the diameter L2a of the suction holes 512d (that is, the diameter of the suction inlets 512e) on the vacuum chucking head 511a is set corresponding to the diameter L1a of the solder balls 300a. More specifically, the diameter L2a is set at around 40 μm that is shorter than the diameter L1a (in this example, 70 μm). Also, as shown in FIG. 24, the diameter L2b of the suction holes 512d in the vacuum chucking head 511b is set corresponding to the diameter L1b of the solder balls 300b. More specifically, the diameter L2b is set at around 30 μm that is shorter than the diameter L1b (in this example, 50 μm). Also, as shown in FIGS. 21 and 23, an outlet 512f for evacuating the air inside the hollow 512a are formed on each of the vacuum chucking heads 511a, 512b. With the vacuum chucking heads 511a, 511b, the inside of the hollow 512a is placed at negative pressure by evacuating the air inside the hollow 512a, and due to air being drawn from the suction inlets 512e as a result, it is possible to chuck and hold the solder balls 300 by suction on the edge of the suction inlets 512e on the vacuum chucking surface 512c (see FIGS. 22 and 24).

As shown in FIGS. 19 and 20, the supplying units 513a, 513b respectively include a holding vessel 514, a vacuum chucking/holding unit 515, a suction unit 516, and a driving mechanism 517. In accordance with control by the control apparatus 8, the supplying unit 513 carries out a supplying process that supplies the solder balls 300 to the vacuum chucking head 511 by moving the vacuum chucking/holding unit 515 and the suction unit 516 along the alignment plate 519 (the vacuum chucking surface 512c) in a state where a front end portion 515a of the vacuum chucking/holding unit 515 that holds the solder balls 300 has been brought close to the alignment plate 519 (the vacuum chucking surface 512c of the vacuum chucking head 511 to which the alignment plate 519 is attached) and also carries out a suction process that removes solder balls 300 (hereinafter also referred to as the "excess solder balls 300") aside from the solder balls 300 that are chucked by suction at the edges of the suction inlets 512e of the vacuum chucking surface 512c (hereinafter also referred to as "solder balls 300 to be mounted").

Figure 26:
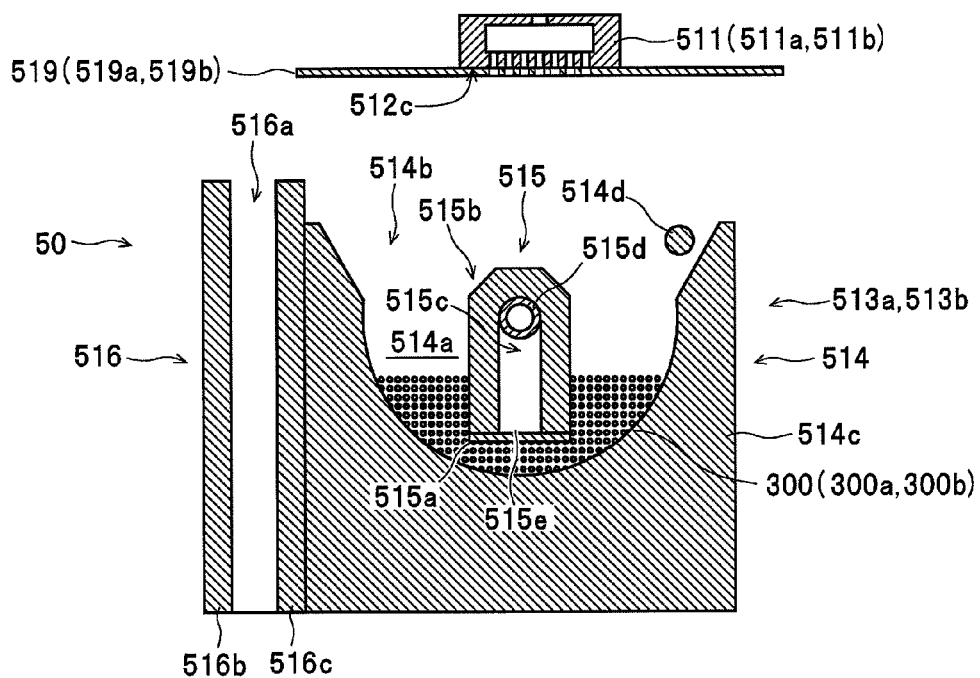
FIG. 26 is a cross-sectional view showing the construction of a solder ball vacuum chucking apparatus.
Figure 27:
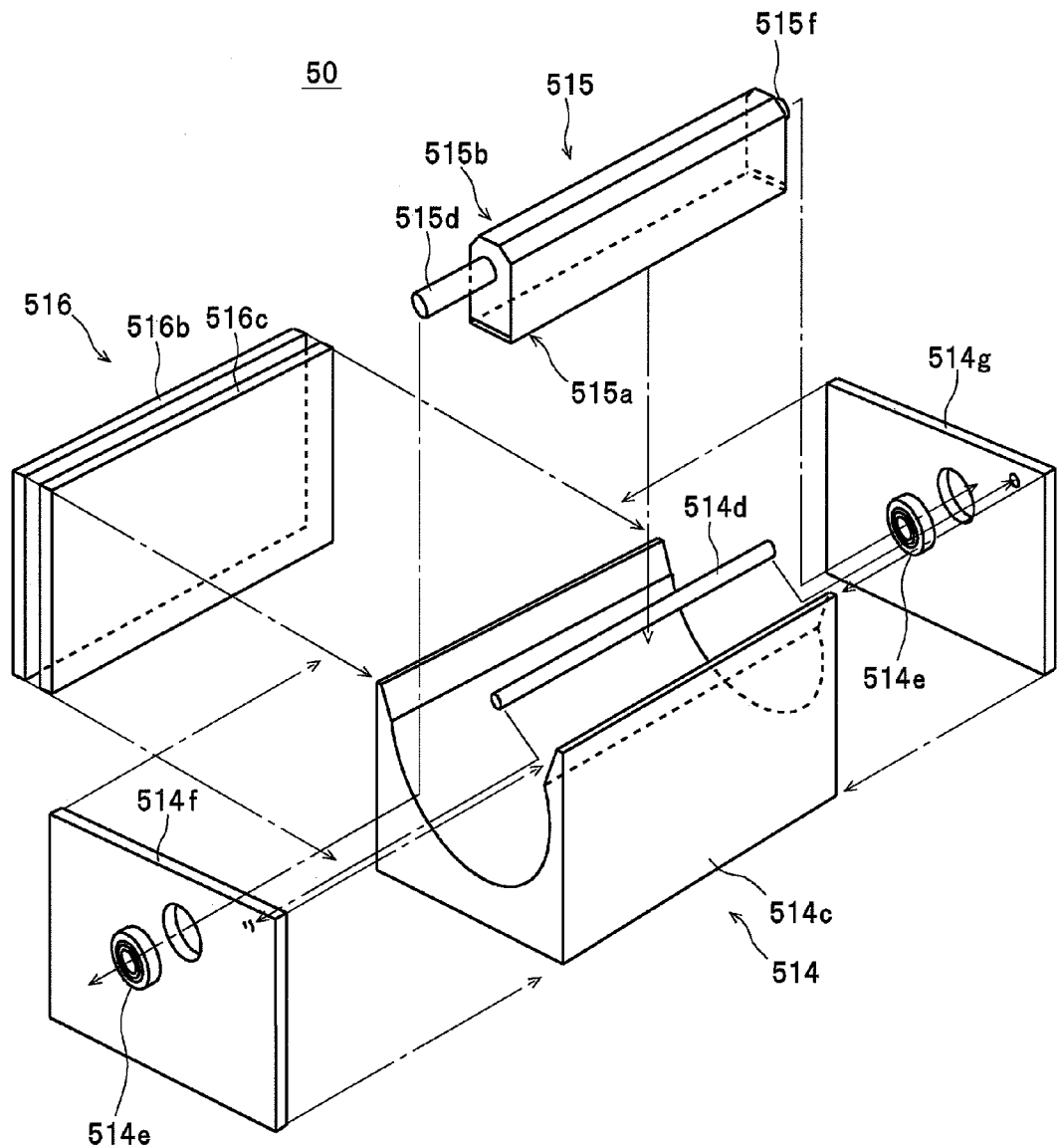
FIG. 27 is an exploded perspective view of the main unit composed of the holding vessel, the vacuum chucking/holding unit, and the suction unit.

As shown in FIGS. 26 and 27, the holding vessel 514 includes a vessel main body 514c whose internal surface is curved so as to be semicircular in cross-section and two side walls 514f, 514g (see FIG. 27) disposed on both sides of the vessel main body 514c, and is constructed so that the solder balls 300 can be held inside a hold 514a (see FIG. 26) formed by the vessel main body 514c and the side walls 514f, 514g. Also, a wiper 514d that is supported at both ends by the side walls 514f, 514g is disposed on an opening 514b-side (see FIG. 26) of the holding vessel 514. Bearings 514e (see FIG. 27) for rotatably supporting the vacuum chucking/holding unit 515 are also disposed on the side walls 514f, 514g. Here, the holding vessel 514 is disposed so that the opening 514b faces the vacuum chucking surface 512c of the vacuum chucking head 511 when the supplying process is carried out (see FIG. 26).

As shown in FIG. 27, the vacuum chucking/holding unit 515 is formed in the overall shape of a rectangular cuboid, has a suction path 515c that reaches a front end portion 515a thereof from a base end portion 515b side formed inside as shown in FIG. 26, and is capable of chucking and holding the solder balls 300 held inside the hold 514a of the holding vessel 514 by suction on the front end portion 515a. A permeable sheet 515e is attached to the front end portion 515a of the vacuum chucking/holding unit 515. By rotatably supporting a shaft 515f and a suction tube 515d disposed on the base end portion 515b side with the bearings 514e disposed on the side walls 514f, 514g of the holding vessel 514, the vacuum chucking/holding unit 515 is disposed on the opening 514b side of the holding vessel 514 so as to be rotatable about the base end portion 515b.

Figure 40:
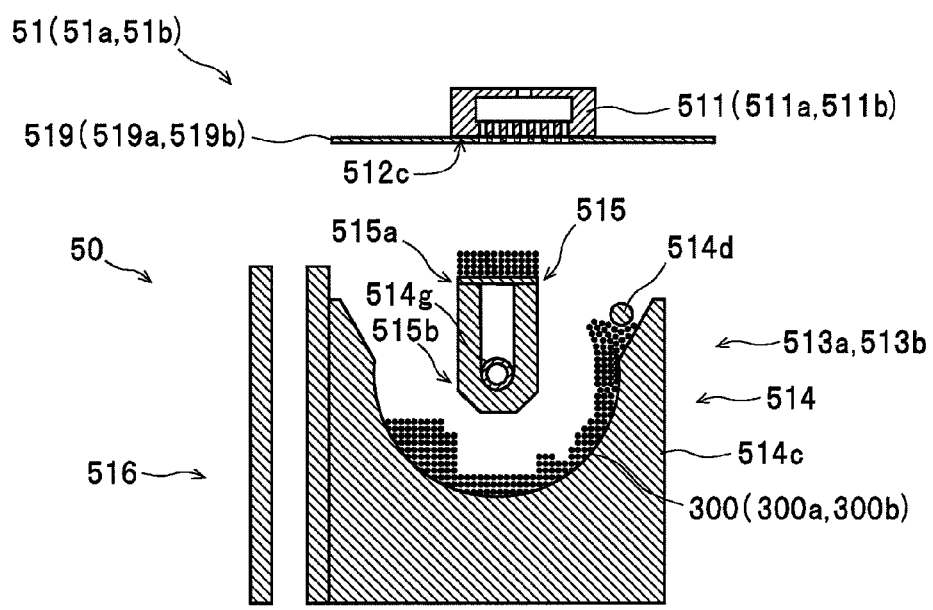
FIG. 40 is a second schematic diagram useful in explaining the operation of the solder ball vacuum chucking apparatus.

As shown in FIG. 26, when the front end portion 515a of the vacuum chucking/holding unit 515 faces the bottom of the vessel main body 514c of the holding vessel 514, the solder balls 300 held in the hold 514a of the holding vessel 514 are chucked and held by suction on the front end portion 515a. Also, as shown in FIG. 40, when carrying out the supplying process, the vacuum chucking/holding unit 515 is rotated by the driving mechanism 517 so that the front end portion 515a that holds the solder balls 300 faces the vacuum chucking surface 512c of the vacuum chucking head 511.

Figure 25:
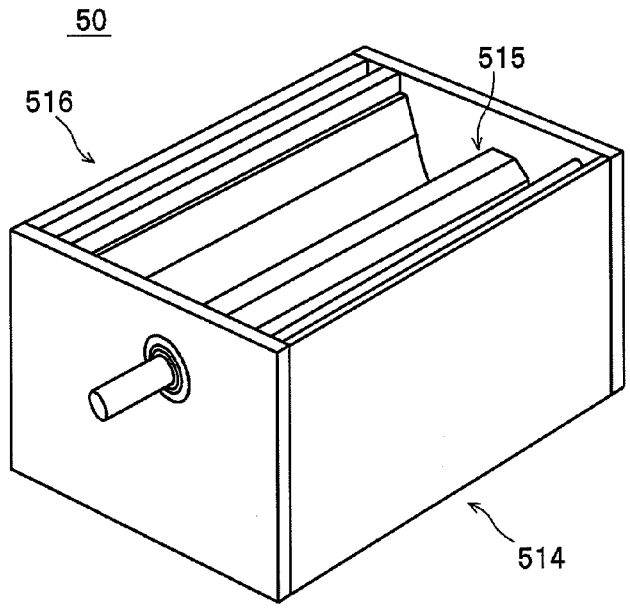
FIG. 25 is a perspective view of a main unit composed of a holding vessel, a vacuum chucking/holding unit, and a suction unit.

As shown in FIGS. 26 and 27, the suction unit 516 includes two partition walls 516b, 516c and is constructed so as to be capable of sucking away the solder balls 300 via a suction path 516a (see FIG. 26) formed by the two side walls 514f, 514g of the holding vessel 514 and the partition walls 516b, 516c. In the solder ball mounting apparatus 5, by constructing the holding vessel 514, the vacuum chucking/holding unit 515, and the suction unit 516 as described above, such components are integrally constructed (see FIG. 25: hereinafter the integrated holding vessel 514, vacuum chucking/holding unit 515, and suction unit 516 are collectively referred to as the "main unit 50").

The driving mechanism 517 functions as a moving mechanism for the present invention, and moves the main unit 50 (i.e., the integrated holding vessel 514, the vacuum chucking/holding unit 515, and the suction unit 516) in accordance with control by the control apparatus 8. The driving mechanism 517 also functions as a rotating mechanism for the present invention and rotates the vacuum chucking/holding unit 515 in accordance with control by the control apparatus 8.

The suction apparatuses 518a, 518b each include a suction pump and a solenoid valve (neither of which is shown). Also, as shown in FIGS. 19 and 20, the suction apparatuses 518a, 518b are respectively connected via suction tubes 518c to the vacuum chucking heads 511a, 511b (i.e., the outlets 512f of the vacuum chucking heads 511a, 511b), the vacuum chucking/holding unit 515 (i.e., the suction tube 515d that connects to the suction path 515c of the vacuum chucking/holding unit 515), and the suction unit 516 (i.e., the suction path 516a of the suction unit 516). The suction apparatuses 518a, 518b operate in accordance with control by the control apparatus 8 and place the hollows 512a of the vacuum chucking heads 511a, 511b at negative pressure so as to draw in air through the suction inlets 512e, also draw in air from the suction path 515c of the vacuum chucking/holding unit 515, and draw in air (i.e., pull away solder balls by suction) via the suction path 516a of the suction unit 516.

The alignment plates 519a, 519b are constructed so as to be detachably attached to the vacuum chucking heads 511. As shown in FIGS. 22 and 24, through-holes 519e that connect to the suction inlets 512e of the vacuum chucking heads 511 when the alignment plates 519a, 519b have been attached so that upper surfaces 519c thereof contact the vacuum chucking surfaces 512c of the vacuum chucking heads 511 are formed in the alignment plates 519a, 519b. Here, as shown in FIG. 22, the thickness L3a of the alignment plate 519a is set at around 80 μm so that the solder balls 300a that have been chucked by suction at the edges of the suction inlets 512e do not protrude out from the lower surface 519d. The diameter L4a of the through-holes 519e in the alignment plate 519a is set at around 90 μm to enable the solder balls 300 to pass therethrough. As shown in FIG. 24, the thickness L3b of the alignment plate 519b is set at around 60 μm so that the solder balls 300b chucked by suction at the edges of the suction inlets 512e do not protrude from the lower surface 519d. The diameter L4b of the through-holes 519e in the alignment plate 519b is set at around 70 μm to enable the solder balls 300b to pass therethrough. Also, as shown in FIG. 26, each alignment plate 519 is disposed at a position above the disposed position of the main unit 50.

In accordance with control by the control apparatus 8, the moving mechanisms 520a, 520b carry out a moving process that moves the vacuum chucking heads 511a, 511b toward the substrate 400. As shown in FIG. 28, the moving mechanism 520a moves the vacuum chucking head 511a between a chucking position P1a (a disposed position of the alignment plate 519a) where the vacuum chucking process (holding process) that chucks and holds the solder balls 300a by suction is carried out and the first mounting position P2a where the first mounting process that mounts the solder balls 300a on the substrate 400 is carried out. Also, as shown in FIG. 28, the moving mechanism 520b moves the vacuum chucking head 511b between a chucking position P1b (a disposed position of the alignment plate 519b) where the vacuum chucking process (holding process) that chucks and holds the solder balls 300b by suction is carried out and the second mounting position P2b where the second mounting process that mounts the solder balls 300b on the substrate 400 is carried out. In this way, the solder ball mounting apparatus 5 is constructed so as to include the same number (in this example, two) of moving mechanisms 520 as the number of vacuum chucking heads 511 and carries out processes where one moving mechanism 520 moves one vacuum chucking head 511 toward the substrate 400 as the moving process (that is, the solder ball mounting apparatus 5 carries out the moving process separately for each vacuum chucking head 511).

As shown in FIG. 28, the detecting unit 52a is disposed between the chucking position P1a and the first mounting position P2a and the detecting unit 52b is disposed between the chucking position P1b and the first mounting position P2b. The detecting unit 52a includes a camera (not shown) that photographs the vacuum chucking surface 512c side of the vacuum chucking head 511a and the detecting unit 52b includes a camera (not shown) that photographs the vacuum chucking surface 512c side of the vacuum chucking head 511b. Here, the detecting units 52a, 52b each function as a first detecting unit for the present invention and, by performing image analysis on the images photographed by the cameras, carry out a first detecting process that detects excesses and insufficiencies of the solder balls 300a, 300b on the vacuum chucking heads 511a, 511b after the vacuum chucking process has been carried out. The detecting units 52a, 52b also function as a second detecting unit for the present invention and, by performing image analysis on the images photographed by the cameras, carry out a second detecting process that detects whether adhering matter, such as the flux F and the solder balls 300a, 300b, adheres to the vacuum chucking heads 511a, 511b after the mounting process has been carried out.

Figure 29:
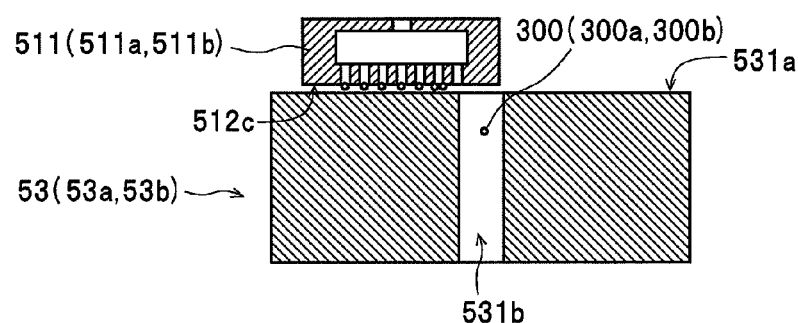
FIG. 29 is a cross-sectional view showing the construction of a first removing unit.

As shown in FIG. 29, the first removing units 53a, 53b are each constructed in a plate-like shape. A suction path 531b that is open on an upper surface 531a is formed in the center of each first removing unit 53. Here, as shown in FIG. 28, the first removing unit 53a is disposed between the chucking position P1a and the first mounting position P2a and by using suction to pull away, via the suction path 531b, the solder balls 300a that are vacuum-chucked on the vacuum chucking head 511a after the vacuum chucking process has been carried out and the solder balls 300a that adhere to the vacuum chucking head 511a after the mounting process has been carried out, carries out a first removing process that removes the solder balls 300a from the vacuum chucking head 511a. Similarly, as shown in FIG. 28, the first removing unit 53b is disposed between the chucking position P1b and the first mounting position P2b and by using suction to pull away, via the suction path 531b, the solder balls 300b that are vacuum-chucked by the vacuum chucking head 511b after the vacuum chucking process has been carried out and the solder balls 300b that adhere to the vacuum chucking head 511b after the mounting process has been carried out, carries out the first removing process that removes the solder balls 300b from the vacuum chucking head 511b.

Figure 30:
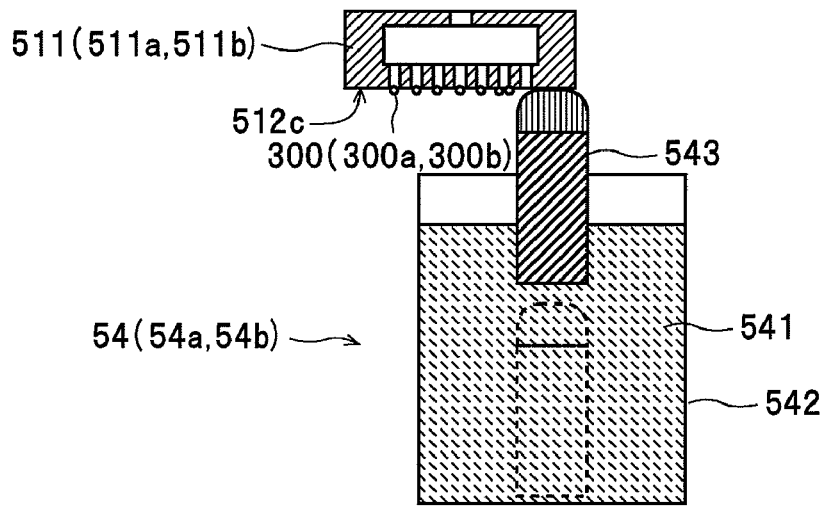
FIG. 30 is a cross-sectional view showing the construction of a second removing unit.

As shown in FIG. 30, the second removing units 54a, 54b each include a reservoir tank 542 that stores removal liquid (for example, solvent) 541 that is capable of dissolving and removing the flux F, a removal member 543 that has an absorbent material (for example, cloth or sponge) attached to the front end portion thereof and is disposed so as to be capable of moving up and down inside the reservoir tank 542, and a moving mechanism, not shown, that moves the removal member 543 up and down. Here, as shown in FIG. 28, the second removing unit 54a is disposed between the chucking position P1a and the first mounting position P2a and carries out a second removing process that removes the flux F adhering to the vacuum chucking head 511a after the mounting process has been carried out and the solder balls 300a that adhere to the vacuum chucking head 511a due to the adhering flux F. Similarly, as shown in FIG. 28, the second removing unit 54b is disposed between the chucking position P1b and the first mounting position P2b and carries out a second removing process that removes the flux F adhering to the vacuum chucking head 511b after the mounting process has been carried out and the solder balls 300b that adhere to the vacuum chucking head 511b due to the adhering flux F.

Figure 31:
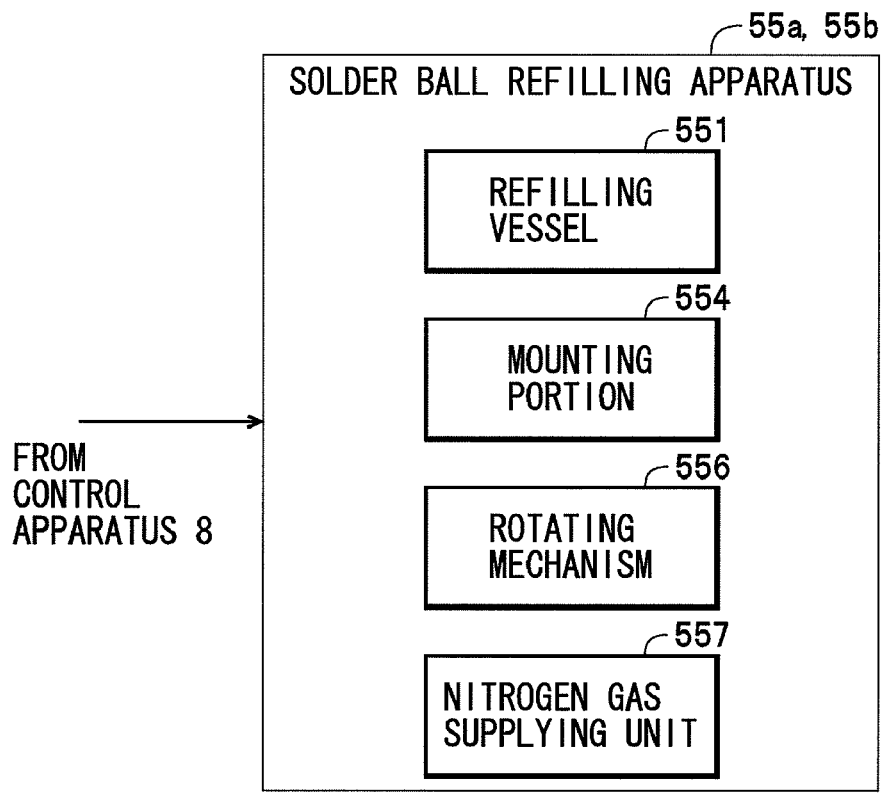
FIG. 31 is a diagram showing the construction of a solder ball refilling apparatus.

The solder ball refilling apparatuses 55a, 55b are one example of ball refilling apparatuses for the present invention, and as shown in FIG. 31, each include a refilling vessel 551, a mounting portion 554, a rotating mechanism 556, and a nitrogen gas supplying unit 557. The solder ball refilling apparatuses 55a, 55b respectively carry out refilling processes that refill the holding vessels 514 of the supplying units 513a, 513b with the solder balls 300a, 300b. When doing so, in one refilling process, the solder ball refilling apparatuses 55a, 55b refill the holding vessels 514 with appropriate amounts of the solder balls 300a, 300b that are set in advance. The solder ball refilling apparatuses 55a, 55b carry out the refilling processes in accordance with execution instructions issued from the control apparatus 8 when preset conditions are satisfied. As shown in FIG. 28, the solder ball refilling apparatuses 55a, 55b are disposed so that in a standby state (initial state), refilling openings 554f (see FIG. 52) formed on respective edge portions 554b of the mounting portions 554 are positioned above a position where the holding vessels 514 of the supplying units 513a, 513b (the main unit 50) are standing by.

Figure 33:
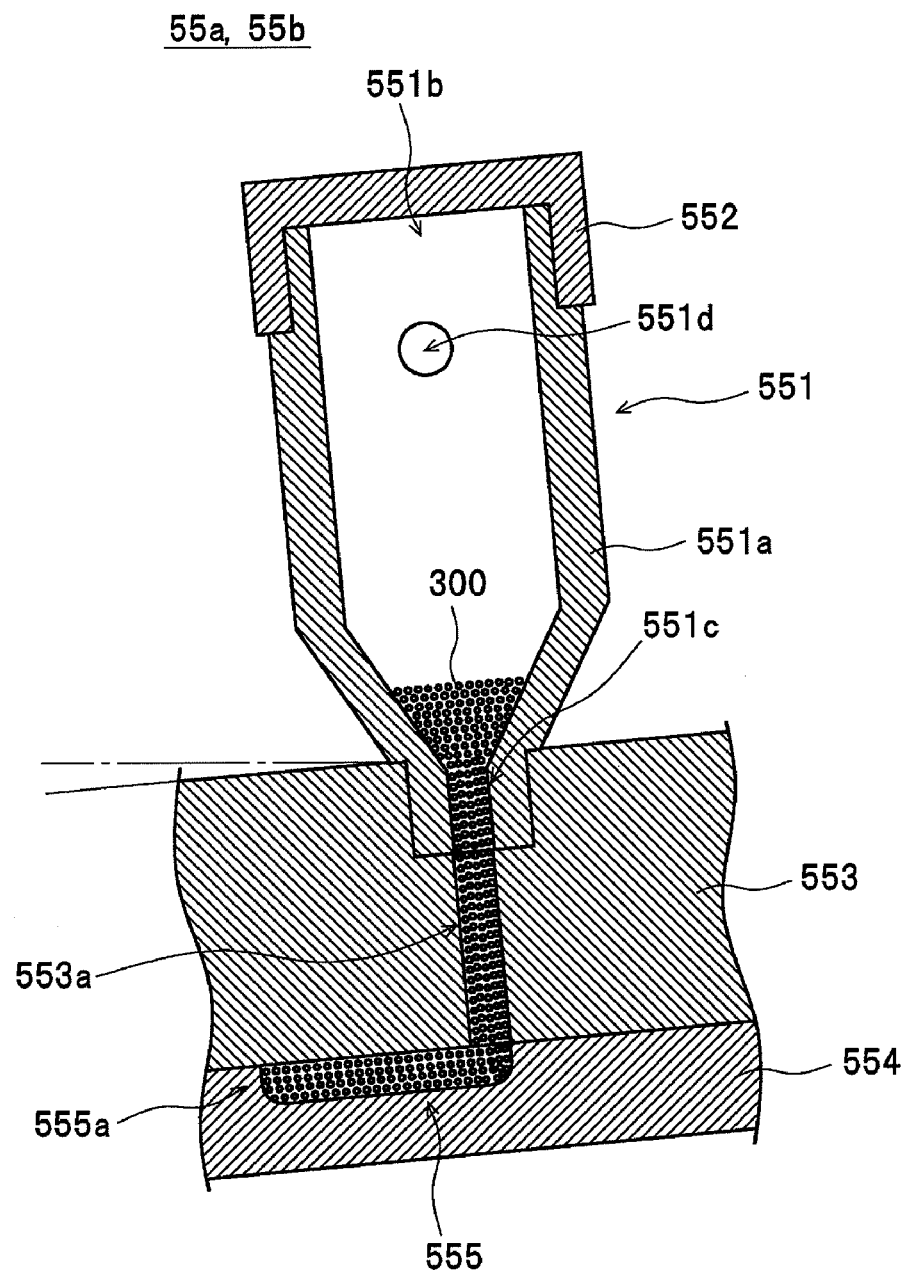
FIG. 33 is a cross-sectional view of a refilling vessel and a mounting portion.

As shown in FIG. 33, the refilling vessels 551 each include a main body 551a and a cover portion 552 that are both formed of a resin that transmits light, and are each constructed so as to be capable of holding the solder balls 300. The main body 551a is formed so that an external form of a lower part thereof has a smaller diameter than the external form of an upper part thereof. An opening 551b for introducing the solder balls 300 is formed in the upper part of the main body 551a and a discharge opening 551c that discharges the solder balls 300 is formed in the lower part of the main body 551a. An inlet 551d for introducing nitrogen gas supplied from the nitrogen gas supplying unit 557 into the main body 551a is formed in a side surface of the main body 551a. As shown in FIG. 28, the cover portion 552 is constructed so as to be capable of fitting onto the upper part of the main body 551a and seals the opening 551b of the main body 551a when fitted thereupon.

Figure 32:
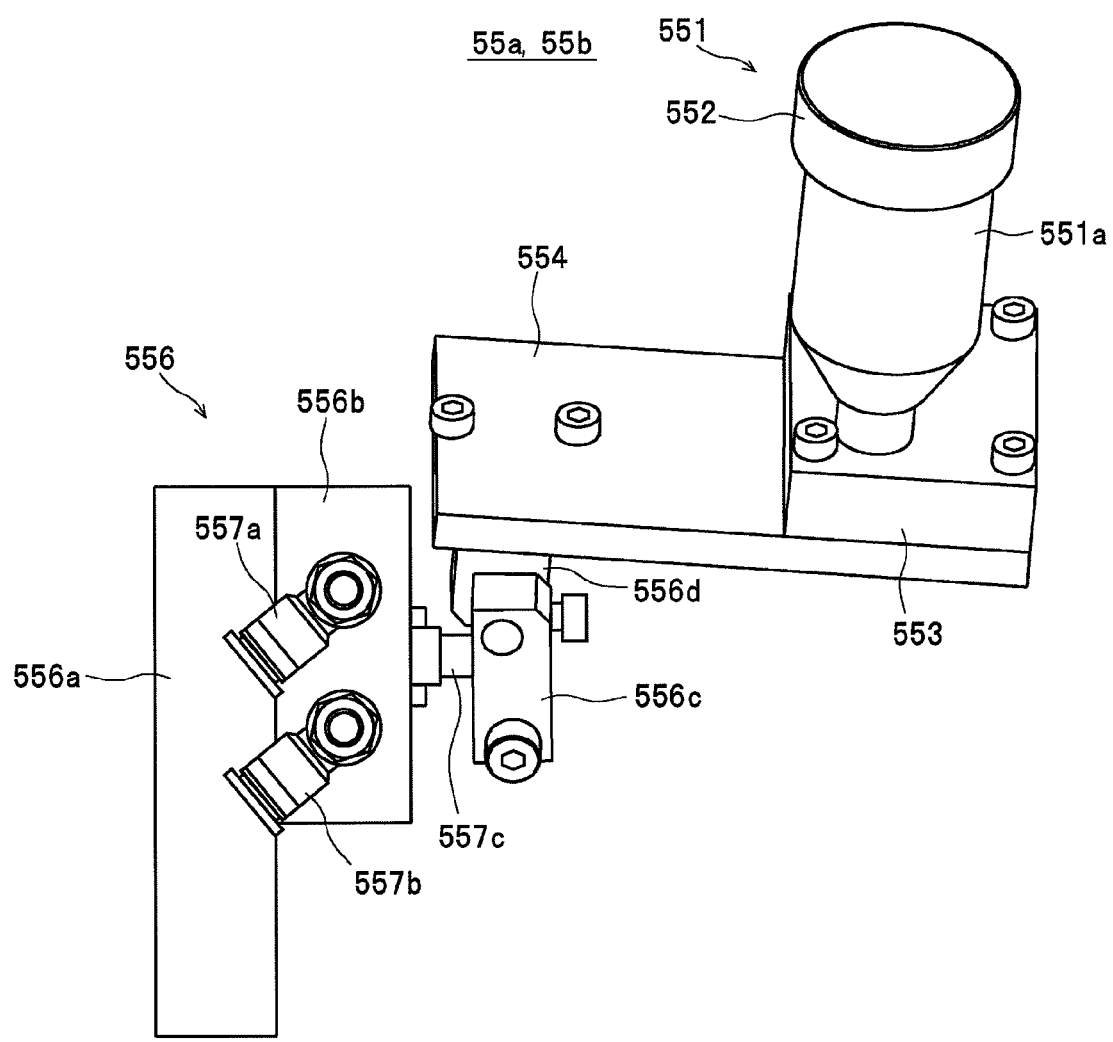
FIG. 32 is a perspective view showing the construction of the solder ball refilling apparatus.
Figure 53:
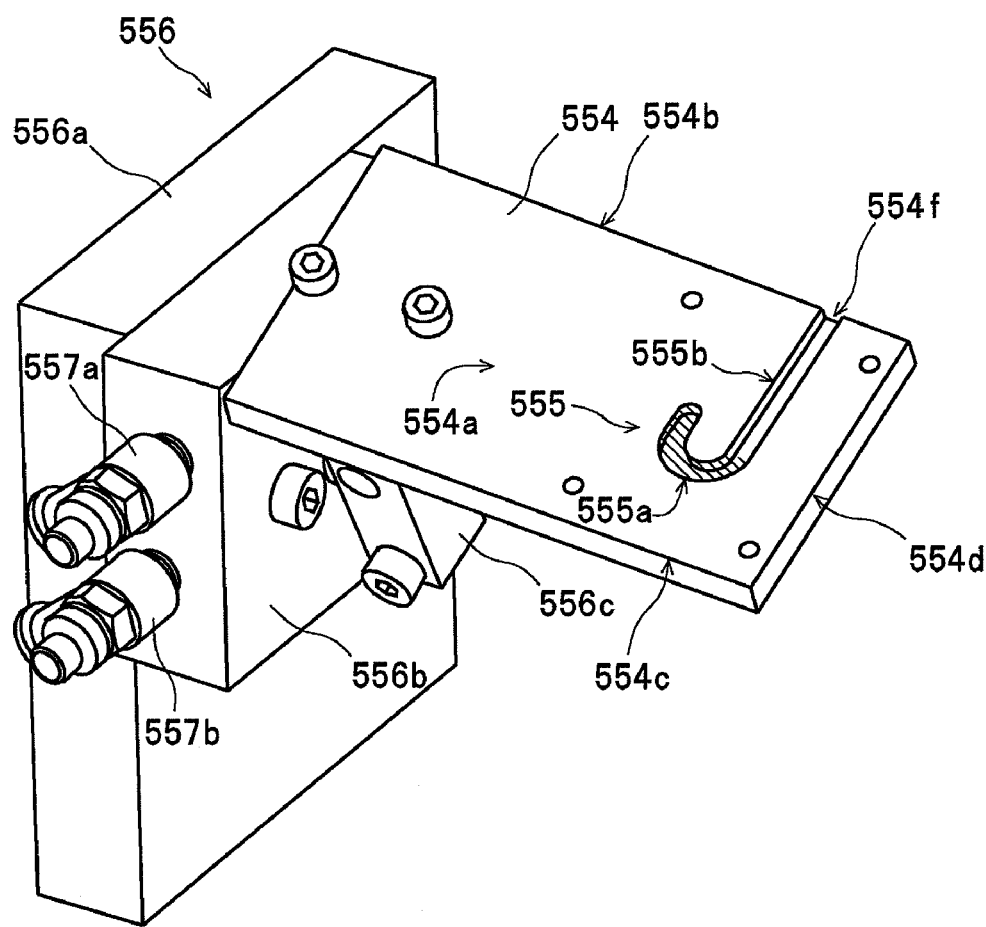
FIG. 53 is a second schematic diagram useful in explaining the operation of the solder ball refilling apparatus.

As shown in FIGS. 52 to 55, as one example the mounting portion 554 is made of resin in the form of a rectangular plate, and has the refilling vessel 551 mounted upon the upper surface 554a side thereof with a spacer 553 in between in a state where the discharge opening 551c of the refilling vessel 551 faces downward (see FIG. 32). Note that in FIGS. 52 to 55, a state is shown where the refilling vessel 551 and the spacer 553 have been removed. A channel 555 is formed in the upper surface 554a of the mounting portion 554 as a hold. Here, the opening of the channel 555 is closed by the spacer 553 and by doing so, it is possible to hold the solder balls 300 without the solder balls 300 leaking out. As shown in FIGS. 52 and 53, the channel 555 includes a storage portion 555a and a movement path 555b and is formed in an overall J-shape when viewed from above.

The storage portion 555a is formed in a U-shape when viewed from above and functions so as to store the appropriate amount of the solder balls 300 mentioned above (that is, the storage portion 555a measures the appropriate amount of the solder balls 300). The movement path 555b is formed in a straight line when viewed from above and connects one end of the storage portion 555a and a refilling opening 554f formed in the edge portion 554b of the mounting portion 554. During the refilling process, the movement path 555b functions so as to allow the solder balls 300 stored in the storage portion 555a to move (slide down) toward the refilling opening 554f. The other end of the storage portion 555a is connected to the discharge opening 551c of the main body 551a of the refilling vessel 551 via a discharge hole 553a formed in the spacer 553 (see FIGS. 33 and 56). The storage portion 555a has a width and a depth that are set so as to produce a volume capable of storing an appropriate amount of the solder balls 300.

Figure 54:
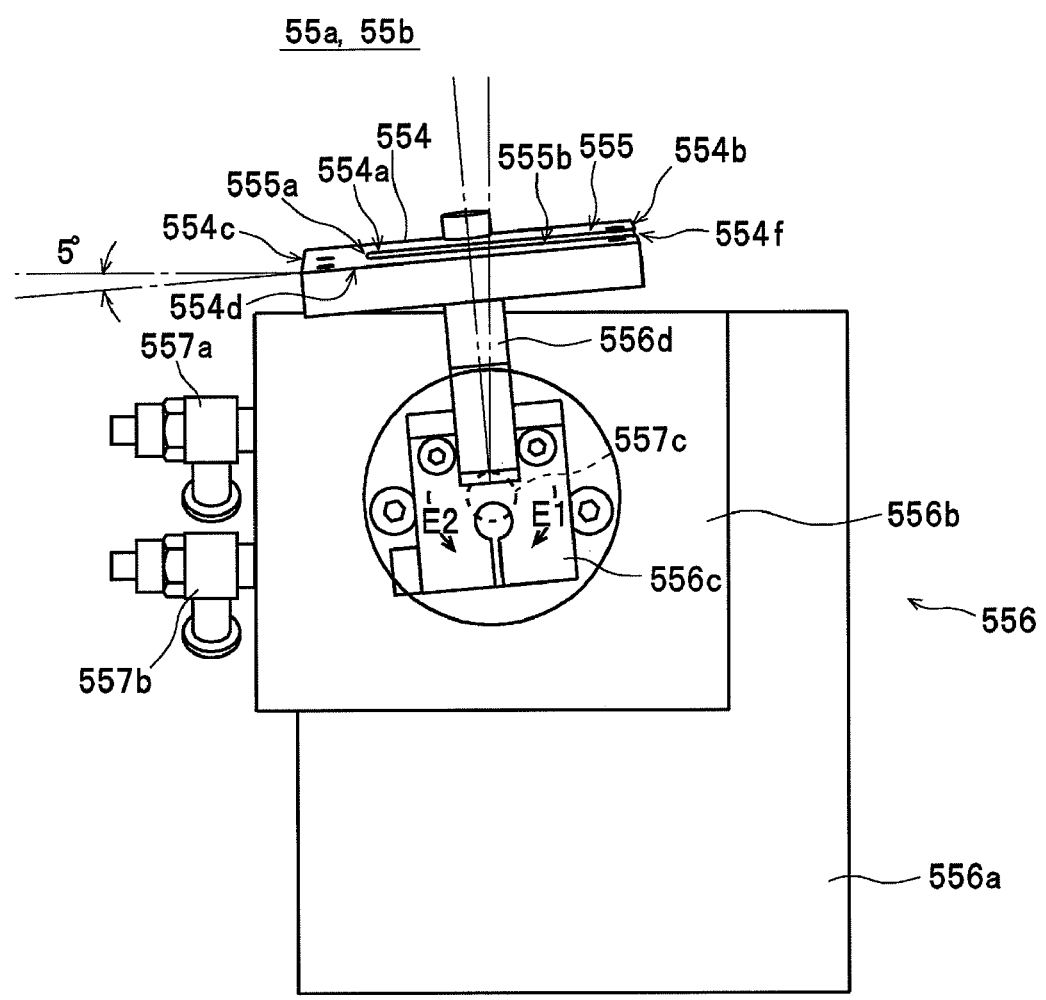
FIG. 54 is a third schematic diagram useful in explaining the operation of the solder ball refilling apparatus.

As shown in FIGS. 52 to 55, the rotating mechanism 556 includes a support plate 556a, a rotary actuator 556b, and connecting portions 556c, 556d. The support plate 556a is erected in the vertical direction and supports the rotary actuator 556b. The rotary actuator 556b operates due to air being supplied to couplers 557a, 557b, and rotates a rotating shaft 557c (see FIGS. 54 and 55). As shown in FIGS. 52 and 54, the connecting portion 556c is formed in the shape of a plate with a cutaway part formed in an upper part thereof. The connecting portion 556c is attached to the rotating shaft 557c and rotates when the rotating shaft 557c is rotated.

Figure 55:
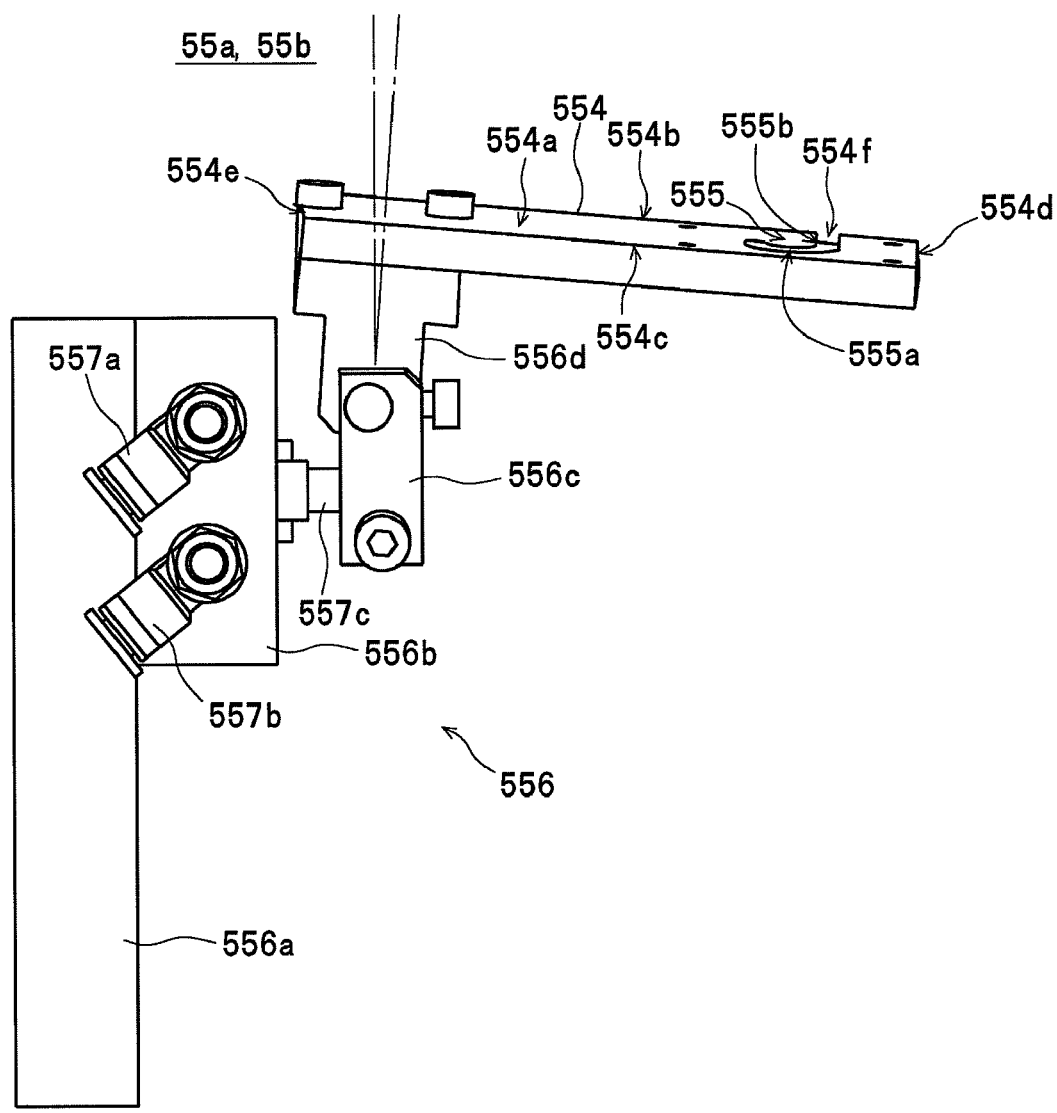
FIG. 55 is a fourth schematic diagram useful in explaining the operation of the solder ball refilling apparatus.

As shown in FIGS. 52 and 55, the connecting portion 556d is formed in the shape of a plate with a wide upper part. A lower end part of the connecting portion 556d is connected to the connecting portion 556c so that the upper part of the connecting portion 556d is capable of rotating toward and away from the support plate 556a. The mounting portion 554 is fixed to an upper end of the connecting portion 556d. As shown in FIGS. 52 and 53, each solder ball refilling apparatus 55 is constructed so that by having the rotary actuator 556b of the rotating mechanism 556 rotate the rotating shaft 557c, the connecting portion 556c will rotate. As a result, the mounting portion 554 fixed to the upper end of the connecting portion 556*d* connected to the connecting portion 556*c* will also rotate and the angle of inclination of the mounting portion 554 will change in accordance with the rotation of the connecting portion 556*c*.

Here, with each solder ball refilling apparatus 55, as shown in FIG. 54, the connecting portion 556*c* is fixed to the rotating shaft 557*c* of the rotary actuator 556*b* so that in a standby state (a state where the rotary actuator 556*b* is not operating), the entire connecting portion 556*c* is inclined to the left in FIG. 54 with respect to the vertical. This means that the mounting portion 554 fixed to the upper end of the connecting portion 556*d* connected to the connecting portion 556*c* is kept in a posture (hereinafter, this posture is also referred to as the "first posture") that is inclined by around 5° for example to the horizontal so that the storage portion 555*a* of the channel 555 formed in the upper surface 554*a* of the mounting portion 554 (i.e., the edge portion 554*c* side that is opposite the edge portion 554*b*) is positioned lower than the refilling opening 554*f* formed in the edge portion 554*b*.

Also, as shown in FIG. 55, in each solder ball refilling apparatus 55, the connecting portion 556*d* is fixed so as to be inclined with respect to the vertical so that the upper part of the connecting portion 556*d* is rotated away from the support plate 556*a*. This means that for the mounting portion 554 that is fixed to the upper end of the connecting portion 556*d*, the edge portion 554*d* that is located on the far side with respect to the support plate 556*a* is positioned below the edge portion 554*e* that is located on the near side with respect to the support plate 556*a*. Also, as shown in FIG. 52, each solder ball refilling apparatus 55 is constructed so that by having the rotary actuator 556*b* of the rotating mechanism 556 rotate the rotating shaft 557*c* during a refilling process, the mounting portion 554 will rotate so as to assume a posture (hereinafter, this posture is also referred to as the "second posture") where the upper surface 554*a* is inclined by around 15° for example to the horizontal with the refilling opening 554*f* (the edge portion 554*b*) positioned lower than the storage portion 555*a* of the channel 555 (i.e., the edge portion 554*c* side).

The nitrogen gas supplying unit 557 includes a nitrogen gas cylinder (not shown) that is filled with nitrogen gas as one example of an oxidization preventing gas. Also, the nitrogen gas supplying unit 557 is connected, via a supply pipe, not shown, to the inlet 551*d* of the main body 551*a* of the refilling vessel 551 and supplies the nitrogen gas into the main body 551*a*.

In accordance with control by the control apparatus 8, the conveying apparatus 6 conveys the substrates 400, which have been produced by dividing the multi-substrate panel 500 in the dicing process carried out by the dicing apparatus 2, to the testing apparatus 3. The conveying apparatus 6 also conveys substrates 400 that have been judged to be non-defective by the testing apparatus 3 to the supply position P3. In addition, as shown in FIG. 28, the conveying apparatus 6 conveys the substrates 400 along a conveying route R that joins the supply position P3 and the second mounting position P2*b*. Here, as shown in FIG. 28, the conveying apparatus 6 includes a first conveying mechanism 61, a second conveying mechanism 62, a third conveying mechanism 63, and a detecting unit 64, with the conveying mechanisms 61 to 63 conveying the substrate 400 along divided paths produced by dividing the conveying route R into a plurality of paths (for example, three paths referred to here as a first route R1, a second route R2, and a third route R3, described later).

As shown in FIG. 28, the first conveying mechanism 61 carries out a first conveying process that conveys the substrate 400 along the first conveying route R1 (part of the conveying route R) that joins the supply position P3 and a transfer position P5. More specifically, the first conveying mechanism 61 includes a stage 611, a rail 612, a vacuum chucking table 613, and a moving mechanism 614. The stage 611 is moved on the rail 612 that is disposed along the first conveying route R1 by the moving mechanism 614. The vacuum chucking table 613 is fixed onto the stage 611 and vacuum-chucks and holds a substrate 400 as a vacuum-chucked object that has been mounted (supplied) thereupon.

As shown in FIG. 28, the second conveying mechanism 62 carries out a second conveying process that conveys the substrate 400 along the second conveying route R2 (another part of the conveying route R) that joins the transfer position P5 and a handover position P6. More specifically, as shown in FIG. 28, the second conveying mechanism 62 includes a vacuum chucking unit 621 and a moving mechanism 622. The vacuum chucking unit 621 holds the substrate 400. The moving mechanism 622 moves the vacuum chucking unit 621 up and down and also moves the vacuum chucking unit 621 along the second conveying route R2.

As shown in FIG. 28, the third conveying mechanism 63 carries out a second conveying process that conveys the substrate 400 along the third conveying route R3 (another part of the conveying route R) that joins the handover position P6 and the second mounting position P2*b*. More specifically, the third conveying mechanism 63 includes a stage 631, a rail 632, a vacuum chucking table 633, a moving mechanism 634, and a correcting mechanism 635. The stage 631 is moved on the rail 632 that is disposed along the third conveying route R3 by the moving mechanism 634. The vacuum chucking table 633 is constructed in the same way as the vacuum chucking table 613 of the first conveying mechanism 61 described above and chucks and holds the substrate 400 mounted thereupon by suction. The correcting mechanism 635 is disposed below the vacuum chucking table 633 and, based on the result of a detecting process, described later, carried out by the detecting unit 52, carries out a correcting process that corrects any positional displacement of the substrate 400 held by the vacuum chucking table 633 by rotating the vacuum chucking table 633 about a rotational axis that passes through the vacuum chucking table 633 in the up-down direction.

The detecting unit 64 includes a camera, not shown, that photographs the surface of the substrate 400 held on the vacuum chucking table 633 of the third conveying mechanism 63 and, as shown in FIG. 28, is disposed at a predetermined position (the detection position P7 shown in FIG. 28) between the handover position P6 and the first mounting position P2*a*. The detecting unit 64 carries out a detecting process that performs image analysis on the photographed image of the substrate 400 to detect any rotational displacement of the substrate 400 about a rotational axis that passes through the substrate 400 in the up-down direction.

Figure 51:
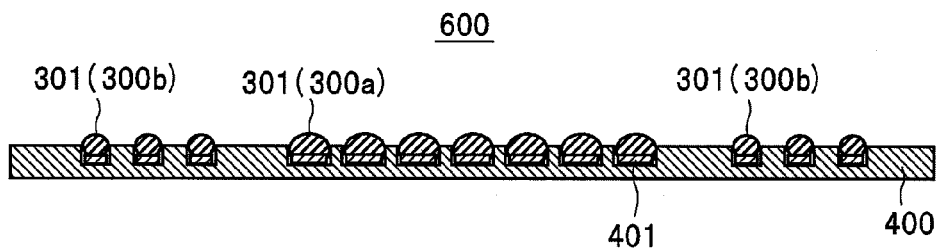
FIG. 51 is a cross-sectional view showing the construction of a solder-mounted substrate.

The melting apparatus 7 carries out a reflow process (melting process) on the substrate 400 on which the solder balls 300 have been mounted by the solder ball mounting apparatus 5 to melt the solder balls 300 and attach the solder balls 300 to the terminals 401 of the substrate 400 as shown in FIG. 51.

The control apparatus 8 controls the dicing apparatus 2, the testing apparatus 3, the flux applying apparatus 4, the solder ball mounting apparatus 5, the conveying apparatus 6, and the melting apparatus 7, as well as the various components that construct such apparatuses.

Next, a method of manufacturing a solder-mounted substrate 600 (that is, a substrate manufacturing method) using the manufacturing apparatus 1 and the operation of the manufacturing apparatus 1 when doing so will be described with reference to the drawings.

First, before the manufacturing apparatus 1 is operated, the solder balls 300*a* and the solder balls 300*b* are respectively held inside the holds 514*a* of the holding vessels 514 of the supplying units 513*a*, 513*b* of the solder ball mounting apparatus 5. The solder balls 300*a* and the solder balls 300*b* are also respectively stored inside the main bodies 551*a* of the respective refilling vessels 551 of the solder ball refilling apparatuses 55*a*, 55*b* of the solder ball mounting apparatus 5. Here, in the solder ball refilling apparatuses 55, during the standby state (initial state), the mounting portion 554 is kept in the first posture which is inclined to the horizontal so that the storage portion 555*a* of the channel 555 formed in the upper surface 554*a* of the mounting portion 554 is positioned lower than the refilling opening 554*f* formed in the edge portion 554*b* (see FIG. 54) and the edge portion 554*d* of the mounting portion 554 is positioned lower than the edge portion 554*e* (see FIG. 55). This means that as shown in FIG. 33, the solder balls 300 stored inside the main body 551*a* of the refilling vessel 551 are discharged from the discharge opening 551*c* under their own weight and pass via the discharge hole 553*a* of the spacer 553 so as to become held in the channel 555.

As shown in FIG. 53, since the U-shaped convex part of the storage portion 555*a* is positioned lower than other parts, the solder balls 300 that have been introduced become stored in a region from the end of the storage portion 555*a* that is connected to the discharge opening 551*c* across the U-shaped convex part (i.e., in the diagonally shaded region in FIG. 53). Here, the region in which the solder balls 300 are stored (i.e., the amount of solder balls 300 that are stored) is determined by the angle of inclination of the mounting portion 554 in the first posture and the difference in height in the up-down direction between the edge portions 554*d*, 554*e*.

Accordingly, by adjusting the angle of inclination and/or the difference in height, it is possible to set the amount of solder balls 300 stored in the storage portion 555*a* at an appropriate amount. That is, in the solder ball refilling apparatus 55, by adjusting the angle of inclination of the mounting portion 554 and/or the difference in height between the edge portions 554*d*, 554*e*, it is possible to precisely measure an appropriate amount of the solder balls 300 using the storage portion 555*a*.

Next, nitrogen gas is supplied from the nitrogen gas supplying unit 557 of each solder ball refilling apparatus 55. When doing so, the nitrogen gas is introduced into the main body 551*a* from the inlet 551*d* of the refilling vessel 551, thereby preventing oxidization of the solder balls 300 held inside the main body 551*a* and reliably preventing a situation where the solder balls 300 become joined together to form lumps.

After this, an operation unit, not shown, is operated and the manufacturing apparatus 1 starts to operate. At this time, the control apparatus 8 instructs the dicing apparatus 2, the testing apparatus 3, the flux applying apparatus 4, the solder ball mounting apparatus 5, the conveying apparatus 6, and the melting apparatus 7 to carry out various processes. In accordance with this, the dicing apparatus 2 carries out the dicing process. In this dicing process, the support table 21 of the dicing apparatus 2 holds the multi-substrate panel 500 (see FIG. 5) supplied by a substrate supplying apparatus, not shown. After this, the dicing mechanism 22 of the dicing apparatus 2 dices the multi-substrate panel 500 by rotating the dicing blade and placing the dicing blade in contact with the multi-substrate panel 500. By doing so, as shown in FIG. 6, the multi-substrate panel 500 is split into the substrates 400.

Next, the conveying apparatus 6 conveys the substrates 400 that have been produced by the dicing process carried out by the dicing apparatus 2 in accordance with the instructions to carry out processing given by the control apparatus 8. After this, the testing apparatus 3 carries out electrical testing in accordance with the instructions from the control apparatus 8. During this electrical testing, as shown in FIG. 3, the testing apparatus 3 supplies the test current I outputted by the power supply unit 31 to the terminals 401 to be tested via the probes 34. Next, the voltage detecting unit 32 of the testing apparatus 3 detects the voltage V produced between the terminals 401 due to the supplying of the test current I and the current detecting unit 33 of the testing apparatus 3 detects the test current I. After this, the testing unit 35 of the testing apparatus 3 measures the resistance between the terminals 401 based on the voltage V and the test current I, and judges whether broken wires, shorting, and the like are present in a conductive pattern, not shown, based on the measured resistance. Here, the testing unit 35 judges that the substrate 400 is non-defective when broken wires and shorting are not present and judges that the substrate 400 is defective when broken wires and shorting are present.

In this case, the manufacturing apparatus 1 carries out electrical testing on the substrate 400 after the dicing process has been carried out as described above. This means that with the manufacturing apparatus 1, it is possible to select out substrates 400 for which broken wires and shorting have occurred in the conductive pattern during manufacturing of the multi-substrate panel 500 as defective products and also possible to select out substrates 400 for which broken wires and shorting have occurred in the conductive pattern due to vibration and the like during the dicing process as defective products.

Next, by carrying out the conveying process, the conveying apparatus 6 conveys only the substrates 400 judged to be non-defective during the electrical testing described above to the supply position P3 shown in FIG. 28 and mounts (supplies) the substrate 400 onto the vacuum chucking table 613 of the first conveying mechanism 61 of the conveying apparatus 6. Also, the conveying apparatus 6 conveys the substrates 400 judged to be defective during the electrical testing described above to a predetermined storage location. Note that in this state (the initial state), as shown in FIG. 28, the stage 611 of the first conveying mechanism 61 of the conveying apparatus 6 is positioned at the supply position P3 and the stage 631 of the third conveying mechanism 63 of the conveying apparatus 6 is positioned at the handover position P6.

Figure 35:
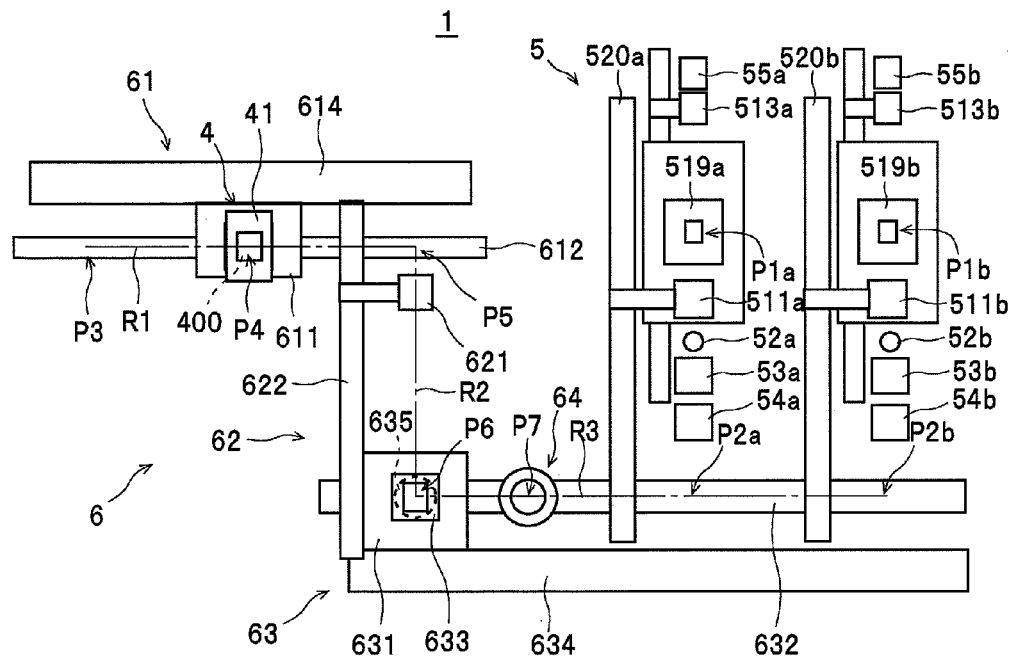
FIG. 35 is a first schematic diagram useful in explaining the operation of the solder ball mounting apparatus and the conveying apparatus.

After this, the conveying apparatus 6 carries out the first conveying process. In this first conveying process, the vacuum chucking table 613 of the first conveying mechanism 61 holds the supplied (mounted) substrate 400. Next, as shown in FIG. 35, the moving mechanism 614 moves the stage 611 on the rail 612 disposed along the first conveying route R1. After this, the moving mechanism 614 stops the movement when the stage 611 is positioned at the application position P4.

Next, the flux applying apparatus 4 carries out the applying process. During the applying process, the control apparatus 8 controls the substrate conveying mechanism 45 to convey (move) the substrate 400 mounted on the stage 611 positioned at the application position P4 to the applying process position. When doing so, the substrate conveying mechanism 45 raises the substrate 400 so as to press the application surface of the substrate 400 onto the rear surface of the metal mask 41. After this, the control apparatus 8 controls the applying mechanism 44 to move the applying unit 42 to a position outside the opening 411 of the metal mask 41 (as one example, to the position shown by the solid line in FIG. 11). The control apparatus 8 then controls the applying mechanism 44 as shown in FIG. 12 to lower the applying unit 42 toward the surface of the metal mask 41 (the application surface of the substrate 400) and press the front end portions 427x of the squeegee main bodies 427 of both squeegee units 421 onto the surface of the metal mask 41.

Here, as one example, if the squeegee main body 427 of the squeegee unit 421a is inclined as shown by the dot-dash line in FIG. 10, when the applying unit 42 is lowered, one end in the width direction of the front end portion 427x will make contact with the surface of the metal mask 41 first (in this example, the left end in FIG. 10). After this, when the applying unit 42 is lowered further by the applying mechanism 44, the base portion 425 of the squeegee unit 421a will rotate with respect to the base portion 422b in the direction of the arrow B1 about the rotational shaft 426, so that the entire front end portion 427x in the width direction will make contact with the surface of the metal mask 41. By doing so, as shown by the broken line in FIG. 10, the inclination of the squeegee main body 427 of the squeegee unit 421a is corrected.

Similarly, if the squeegee main body 427 of the squeegee unit 421b is inclined as shown by the dot-dot-dash line in FIG. 10, when the applying unit 42 is lowered, one end in the width direction of the front end portion 427x will make contact with the surface of the metal mask 41 first (in this example, the right end in FIG. 10). After this, when the applying unit 42 is lowered further by the applying mechanism 44, the base portion 425 of the squeegee unit 421b will rotate with respect to the base portion 422b in the direction of the arrow B2 about the rotational shaft 426, so that the entire front end portion 427x in the width direction will make contact with the surface of the metal mask 41. By doing so, as shown by the broken line in FIG. 10, the inclination of the squeegee main body 427 of the squeegee unit 421b is corrected.

In addition, when the metal mask 41 and/or the substrate 400 that the squeegee units 421 are pressed onto are inclined (not shown), when the applying unit 42 is lowered, one end in the width direction of the front end portion 427x will make contact with the surface of the metal mask 41 first. After this, when the applying unit 42 is lowered further by the applying mechanism 44, the base portion 425 of the squeegee units 421 will rotate with respect to the base portion 422b in the direction of the arrow B1 or the arrow B2 about the rotational shaft 426, so that the squeegee main bodies 427 will become inclined in the same way as the inclination of the metal mask 41 and/or the substrate 400. By doing so, the entire width of the front end portions 427x will contact the surface of the metal mask 41.

Next, when the applying unit 42 is lowered even further by the applying mechanism 44, the base portions 422a of both squeegee units 421 are guided by the linear guide mechanism 423 so as to move linearly (downward) toward to the base portions 422b in the direction of the arrow A in FIG. 10. When doing so, as the base portions 422a move downward, both springs 424 elastically deform so as to become compressed and the base portions 422b are energized toward the metal mask 41 (the substrate 400). By doing so, with both squeegee units 421a, 421b, the front end portion 427x of the squeegee main body 427 that is connected to the base portion 422b via the base portion 425 is pressed onto the surface of the metal mask 41 with a desired pressing force.

Figure 12:
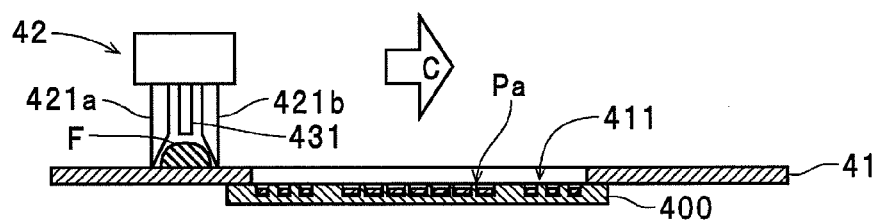
FIG. 12 is a cross-sectional view of a state where the squeegee unit has been placed in contact with the metal mask.
Figure 13:
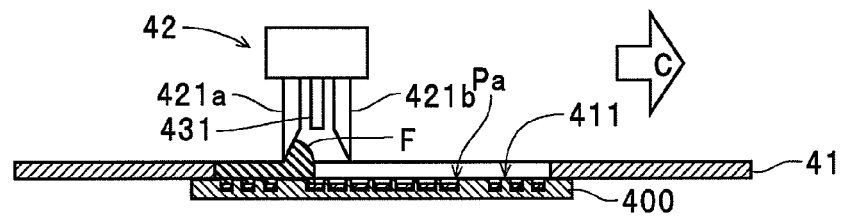
FIG. 13 is a cross-sectional view of a state where the squeegee unit is being moved to apply flux.

After this, the control apparatus 8 controls the flux supplying unit 43 so as to pump the flux F toward the nozzle 431. When doing so, as shown in FIG. 12, the flux F is supplied from the nozzle 431 between the squeegee units 421a, 421b. Next, the control apparatus 8 controls the applying mechanism 44 and moves the applying unit 42 across the application surface of the substrate 400 (the surface of the metal mask 41) in the direction of the arrow C. When doing so, as shown in FIG. 13, the flux F supplied from the nozzle 431 is moved in the direction of the arrow C by the squeegee unit 421a in accordance with the movement of the applying unit 42 and at the edge of the opening 411 is moved from the metal mask 41 onto the application surface of the substrate 400. At this time, in a state where the squeegee unit 421a is positioned above the opening 411, as shown in FIG. 12, the front end portions 427x are kept at substantially the same height as the surface of the metal mask 41 and so are separated from the substrate 400 (the application surface). This means that the flux F that is moved across the application surface as the squeegee unit 421a moves is smoothly spread out and remains on the application surface with only the thickness of the metal mask 41.

Figure 11:
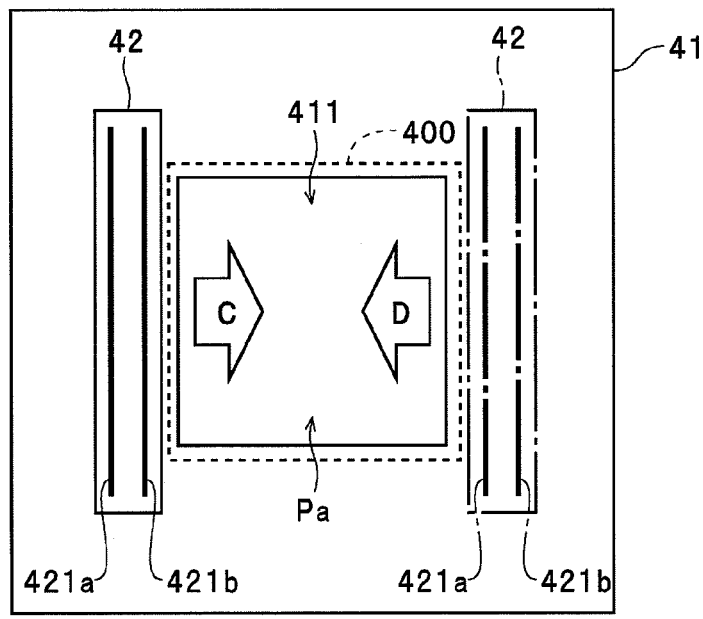
FIG. 11 is a plan view of the substrate, a metal mask, and an applying unit (squeegee unit)
Figure 14:
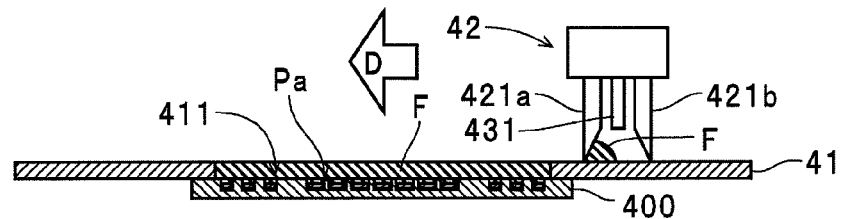
FIG. 14 is a cross-sectional view of a state where application of the flux onto the application region of the substrate has been completed.

Next, the applying unit 42 is moved even further in the direction of the arrow C toward the position shown by the dot-dash line in FIG. 11. When doing so, as shown in FIG. 14, out of the flux F moved over the application surface due to the movement of the squeegee unit 421a, excess flux F that has not been applied onto the application area Pa is moved from the application surface onto the metal mask 41. By doing so, the applying process that applies the flux F onto the application area Pa of the application surface of a first substrate 400 is completed. After this, the control apparatus 8 controls the substrate conveying mechanism 45 to convey (move) the substrate 400 for which the applying process has been completed from the applying process position to the stage 611 of the first conveying mechanism 61 that is positioned at the application position P4. Also, when the stage 611 on which a substrate 400 onto which the flux F is to be applied next is mounted has been positioned at the application position P4, the control apparatus 8 controls the flux supplying unit 43 to supply the flux F from the nozzle 431 between the squeegee units 421a, 421b and then controls the applying mechanism 44 to move the applying unit 42 in the direction of the arrow D. By doing so, in place of the squeegee unit 421a in the example described above where the applying unit 42 is moved in the direction of the arrow C, the flux F is spread out on the application area Pa of the substrate 400 by the squeegee unit 421b. By doing so, the applying process that applies the flux F onto a second substrate 400 is completed.

Figure 15:
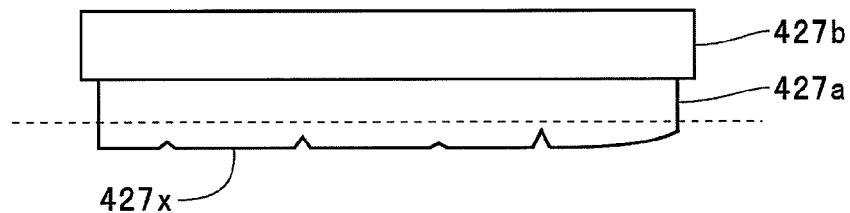
FIG. 15 is a front view of a squeegee main body in a state where gaps have been produced or abrasion has occurred at a front end portion.

When the applying process that applies the flux F onto a plurality of the substrates 400 has been carried out repeatedly, as shown in FIG. 15, in some cases gaps (damage) are produced and/or abrasion occurs at the front end portions 427x of the squeegee main bodies 427 of both squeegee units 421. When a squeegee main body 427 for which gaps have been produced or abrasion has occurred is used, it is difficult to uniformly apply the flux F to the entire application area Pa of the substrate 400, and streaks (stripe-like inconsistencies in application), i.e., regions where the application thickness of the flux F is thicker than the set thickness, are formed along the direction in which the applying unit 42 is moved by the applying mechanism 44. Accordingly, the flux applying apparatus 4 is constructed so that when gaps have been produced or abrasion has occurred for the front end portion 427x, the squeegee main body 427 that is constructed separately to the base portion 425 can be removed and the front end portion 427x can be ground up to the position shown by the broken line in FIG. 15. Note that the size of the gaps and abrasion that have occurred at the front end portion 427x are exaggerated in FIG. 15.

Figure 16:
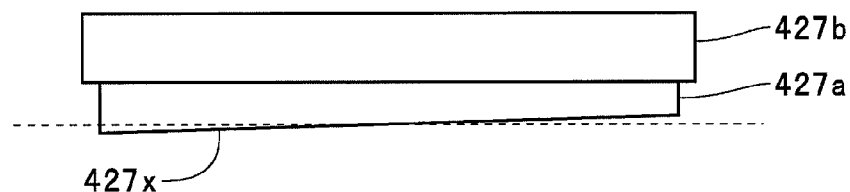
FIG. 16 is a front view of the squeegee main body in a state where grinding of the front end portion has been completed.
Figure 17:
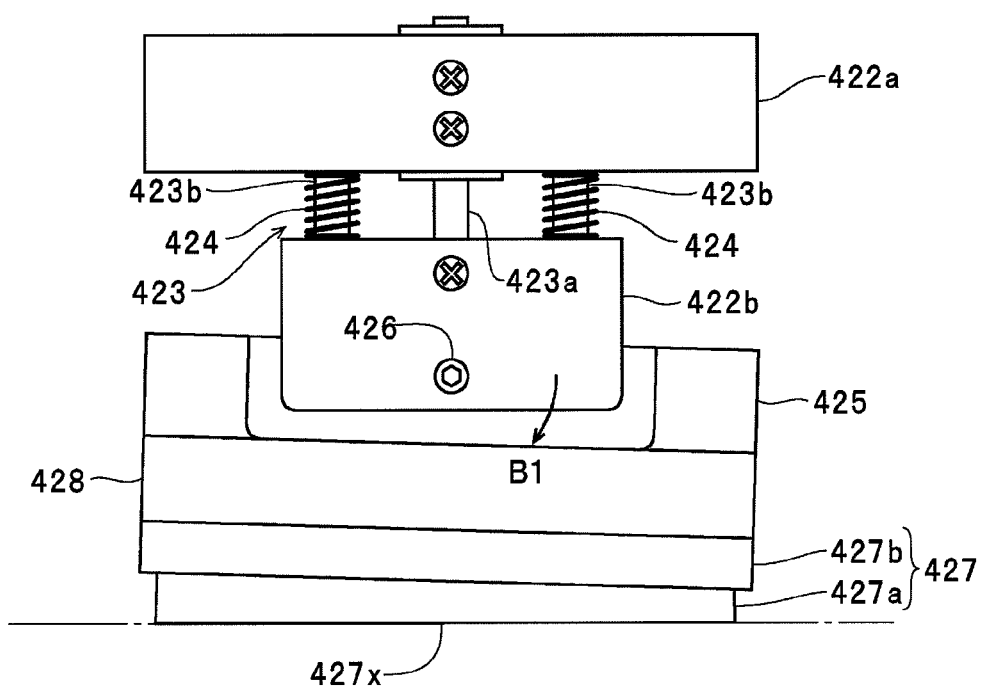
FIG. 17 is a front view of a squeegee unit in a state where a squeegee main body has been attached after the grinding of the front end portion has been completed.

Here, although it is preferable when grinding the squeegee main body 427 to make the front end portion 427x of the plate-shaped portion 427a parallel to the base end portion side thereof (i.e., the part held by the holder 427b), as shown in FIG. 16, in some cases the front end portion 427x will be ground so as to become slanted with respect to the base end portion. Note that the extent to which the front end portion 427x has become slanted due to the grinding has been exaggerated in FIG. 16. If a squeegee unit 421 to which a squeegee main body 427 that has been ground into such state has been attached is used during the applying process that applies the flux F, when the applying unit 42 is lowered by the applying mechanism 44, one end in the width direction of the front end portion 427x after grinding will contact the surface of the metal mask 41 first (in this example, the left end in FIG. 16). After this, when the applying unit 42 is lowered further by the applying mechanism 44, as shown in FIG. 17, the base portion 425 will rotate with respect to the base portion 422b in the direction of the arrow B1 about the rotational shaft 426, so that the entire front end portion 427x in the width direction will make contact with the surface of the metal mask 41. By doing so, as shown in FIG. 17, since the entire width of the front end portion 427x that became slanted due to the grinding will press the surface of the metal mask 41 substantially uniformly, a situation where the flux F is applied inconsistently is avoided.

Next, the moving mechanism 614 of the first conveying mechanism 61 moves the stage 611 toward the transfer position P5 and stops such movement when the stage 611 has been positioned at the transfer position P5. By doing so, the substrate 400 is conveyed by the first conveying mechanism 61 along the first conveying route R1 that joins the supply position P3 and the transfer position P5.

Figure 36:
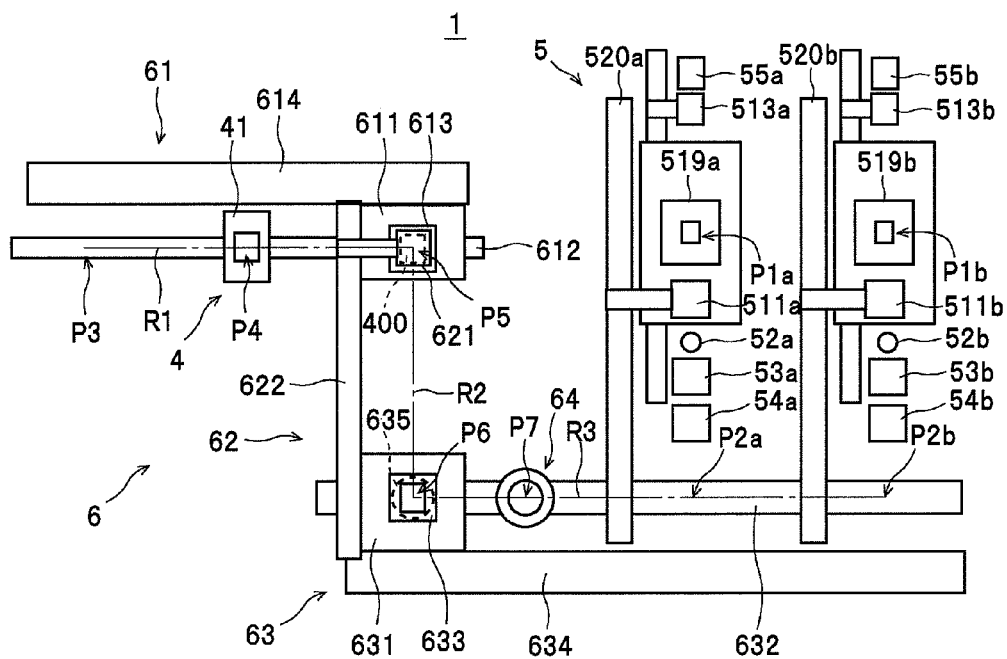
FIG. 36 is a second schematic diagram useful in explaining the operation of the solder ball mounting apparatus and the conveying apparatus.

After this, the control apparatus 8 causes the second conveying mechanism 62 of the conveying apparatus 6 to carry out the second conveying process. In the second conveying process, as shown in FIG. 36, the moving mechanism 622 of the second conveying mechanism 62 moves the vacuum chucking unit 621 above the transfer position P5. Next, by lowering the vacuum chucking unit 621, the moving mechanism 622 moves the vacuum chucking unit 621 close to the substrate 400 held by the vacuum chucking table 613 of the first conveying mechanism 61. After this, the control apparatus 8 causes the vacuum chucking table 613 to release the chucking of the substrate 400. By doing so, the substrate 400 is vacuum-chucked by the vacuum chucking unit 621 and is thereby transferred from the first conveying mechanism 61 to the second conveying mechanism 62. Next, after raising the vacuum chucking unit 621, the moving mechanism 622 moves the vacuum chucking unit 621 along the second conveying route R2 to position the vacuum chucking unit 621 above the handover position P6. After this, by lowering the vacuum chucking unit 621, the moving mechanism 622 mounts the substrate 400 onto the upper surface of the vacuum chucking table 633 of the third conveying mechanism 63 of the conveying apparatus 6. By doing so, the substrate 400 is conveyed by the second conveying mechanism 62 along the second conveying route R2 that joins the transfer position P5 and the handover position P6.

Figure 37:
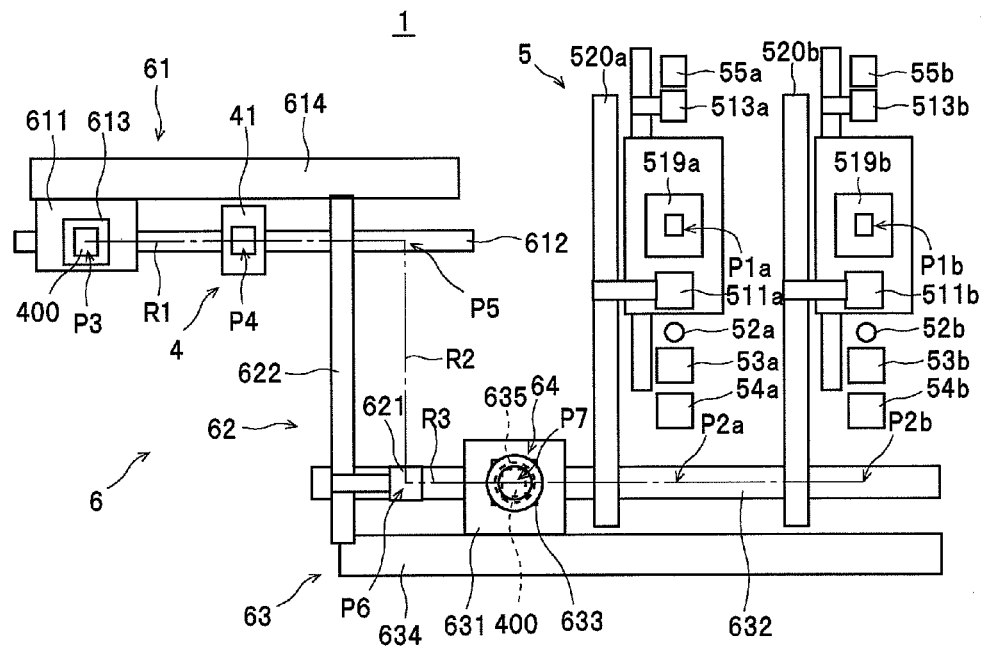
FIG. 37 is a third schematic diagram useful in explaining the operation of the solder ball mounting apparatus and the conveying apparatus.

As shown in FIG. 37, when the substrate 400 has been transferred from the first conveying mechanism 61 to the second conveying mechanism 62, the moving mechanism 614 of the first conveying mechanism 61 also moves the stage 611 from the transfer position P5 to the supply position P3 (i.e., the stage 611 is returned to the initial position).

Next, the control apparatus 8 causes the third conveying mechanism 63 of the conveying apparatus 6 to carry out the third conveying process. In the third conveying process, the vacuum chucking table 633 of the third conveying mechanism 63 vacuum-chucks and holds the substrate 400 that has been mounted by the second conveying mechanism 62 and, as shown in FIG. 37, the moving mechanism 634 moves the stage 631 on the rail 632 disposed along the third conveying route R3. After this, as shown in FIG. 37, the moving mechanism 634 stops such movement when the stage 631 is positioned at the detection position P7.

Next, the control apparatus 8 causes the detecting unit 64 to carry out the detecting process. In this detecting process, the detecting unit 64 photographs the substrate 400 held by the vacuum chucking table 633 of the third conveying mechanism 63 from above the vacuum chucking table 633 and carries out image analysis on the photographed image to detect any positional displacement of the substrate 400 in the rotational direction about a center axis that passes through the substrate 400 in the up-down direction.

After this, the control apparatus 8 causes the correcting mechanism 635 of the third conveying mechanism 63 to carry out the correcting process. In this correcting process, based on the detection result of the detecting unit 64, the correcting mechanism 635 rotates the vacuum chucking table 633 about the center axis that passes through the vacuum chucking table 633 in the up-down direction to correct the positional displacement of the substrate 400 held by the vacuum chucking table 633.

Figure 38:
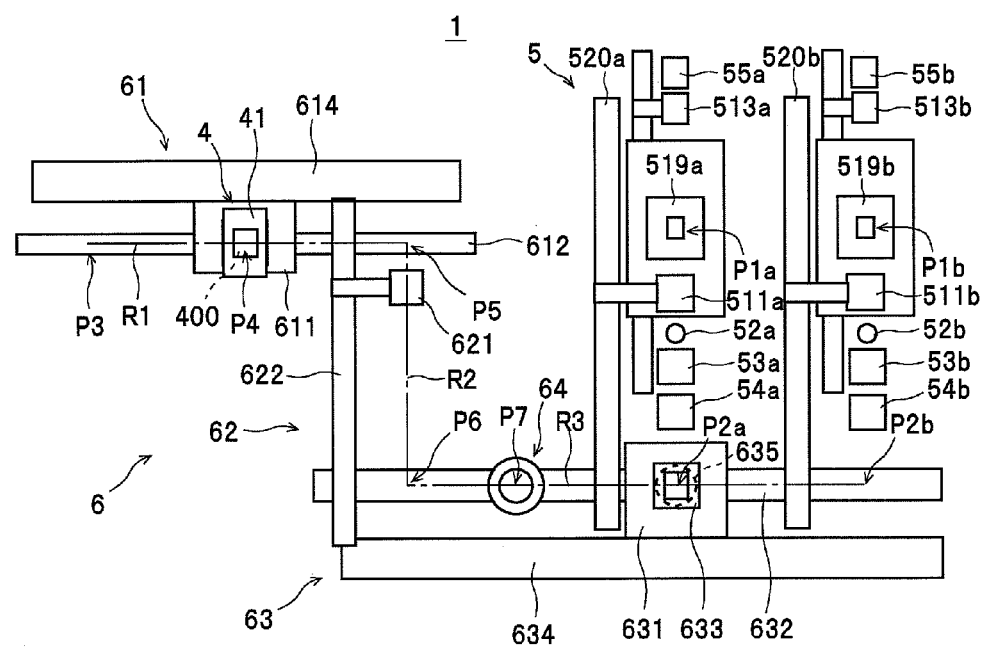
FIG. 38 is a fourth schematic diagram useful in explaining the operation of the solder ball mounting apparatus and the conveying apparatus.

Next, as shown in FIG. 38, the moving mechanism 634 of the third conveying mechanism 63 moves the stage 631 toward the first mounting position P2a and stops such movement when the stage 631 has been positioned at the first mounting position P2a. By doing so, the substrate 400 is conveyed by the third conveying mechanism 63 along the third conveying route R3 that joins the handover position P6 and the first mounting position P2a. Also, as shown in FIG. 38, when a predetermined time has passed from the start of the third conveying process, the control apparatus 8 causes the second conveying mechanism 62 to move the vacuum chucking unit 621 to a position in the vicinity of the transfer position P5 (i.e., the vacuum chucking unit 621 is returned to an initial position).

Figure 34:
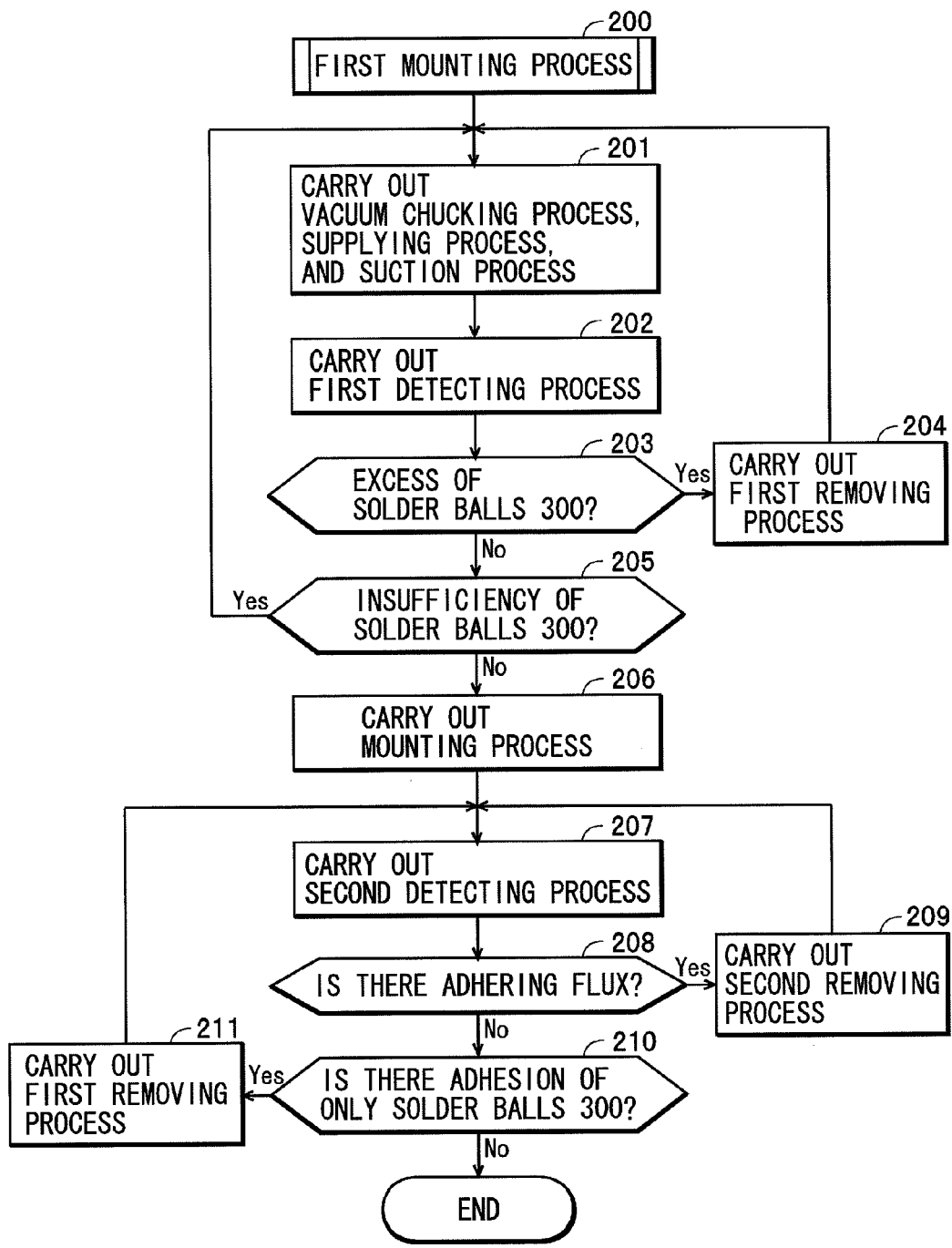
FIG. 34 is a flowchart showing a first mounting process.

On the other hand, as one example, when a predetermined time has passed from the start of the first conveying process described above, the control apparatus 8 starts a first mounting process 200 shown in FIG. 34. Note that in the initial state, as shown in FIG. 26, it is assumed that the front end portion 515a of the vacuum chucking/holding unit 515 of each solder ball vacuum chucking apparatus 51 of the solder ball mounting apparatus 5 faces the bottom of the vessel main body 514c of the holding vessel 514 (i.e., the front end portion 515a faces downward). In the first mounting process 200, the control apparatus 8 controls the moving mechanism 520a of the solder ball vacuum chucking apparatus 51a of the solder ball mounting apparatus 5 as shown in FIG. 26 to convey the vacuum chucking head 511a to the disposed position of the alignment plate 519a. When doing so, as shown in FIG. 22, the vacuum chucking surface 512c of the bottom wall 512b of the vacuum chucking head 511a and the upper surface 519c of the alignment plate 519a come into contact.

After this, the control apparatus 8 causes the vacuum chucking head 511a of the solder ball vacuum chucking apparatus 51a to carry out the vacuum chucking process and causes the supplying unit 513a to carry out the supplying process and the suction process (step 201). More specifically, the control apparatus 8 operates the suction apparatus 518a of the solder ball vacuum chucking apparatus 51a. By doing so, the inside of the hollow 512a of the vacuum chucking head 511a is placed at negative pressure and air starts to be drawn through the suction inlets 512e. Air also starts to be drawn through the suction path 515c of the vacuum chucking/holding unit 515 of the supplying unit 513a and through the suction path 516a of the suction unit 516 of the supplying unit 513a.

Figure 39:
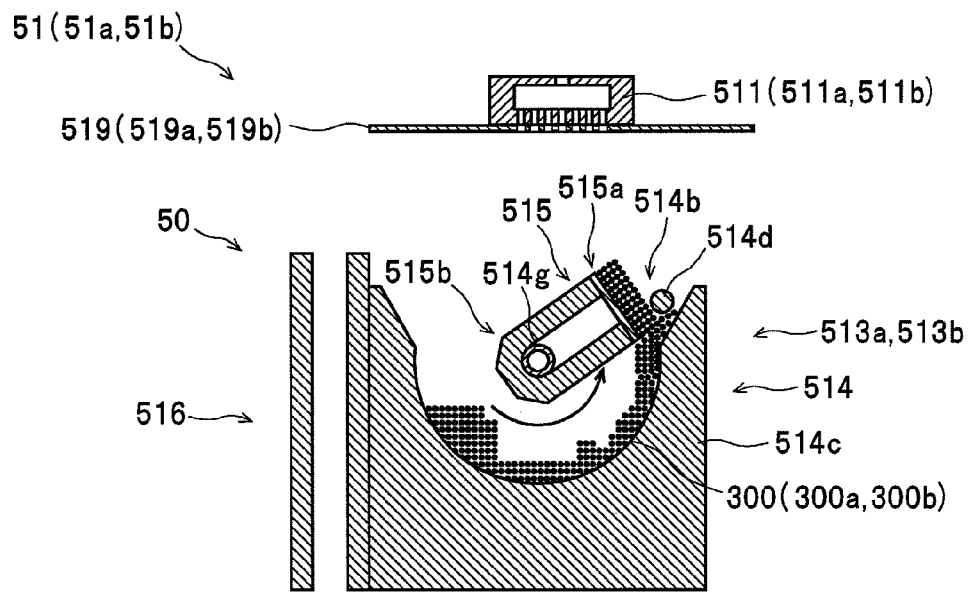
FIG. 39 is a first schematic diagram useful in explaining the operation of the solder ball vacuum chucking apparatus.

Next, due to the air being drawn through the suction path 515c of the vacuum chucking/holding unit 515, the solder balls 300a held in the holding vessel 514 of the supplying unit 513a are chucked and held by suction on the front end portion 515a of the vacuum chucking/holding unit 515. After this, the control apparatus 8 controls the driving mechanism 517 to rotate the suction tube 515d attached to the base end portion 515b of the vacuum chucking/holding unit 515 and, as shown in FIG. 39, thereby rotates the vacuum chucking/holding unit 515 about the base end portion 515b. At this time, due to the rotation of the vacuum chucking/holding unit 515, the solder balls 300a held in the front end portion 515a are moved toward the opening 514b of the holding vessel 514. Some of the solder balls 300a that have been moved toward the opening 514b are wiped off by the wiper 514d disposed at the opening 514b. As a result, the amount (number) of solder balls 300a supplied to the vacuum chucking head 511a is limited to an appropriate amount.

Figure 41:
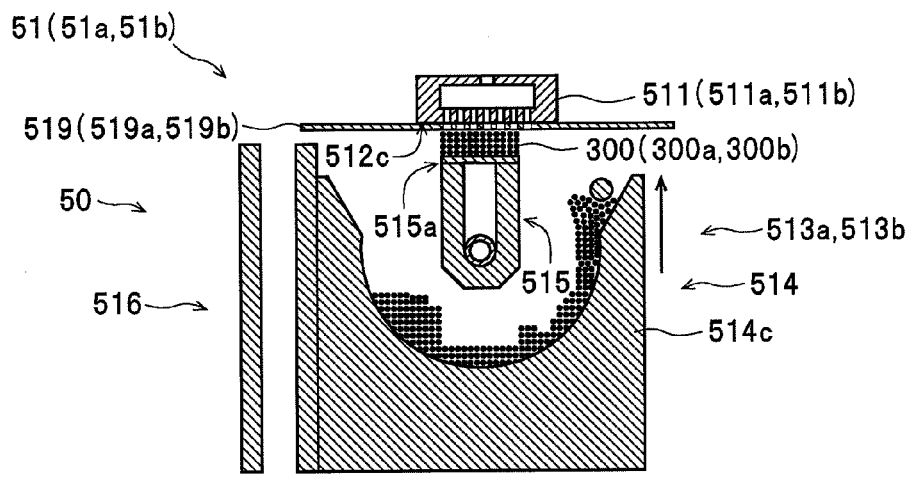
FIG. 41 is a third schematic diagram useful in explaining the operation of the solder ball vacuum chucking apparatus.

Next, as shown in FIG. 40, when the front end portion 515a of the vacuum chucking/holding unit 515 faces the vacuum chucking surface 512c of the vacuum chucking head 511a (i.e., when the vacuum chucking/holding unit 515 has rotated by)180°), the control apparatus 8 controls the driving mechanism 517 to stop the rotation of the suction tube 515d. After this, as shown in FIG. 41, the control apparatus 8 controls the driving mechanism 517 to move the main unit 50 toward the vacuum chucking surface 512c of the vacuum chucking head 511a (the alignment plate 519a) (i.e., the main unit 50 is moved upward in FIG. 41) and thereby move the front end portion 515a close to one end of the alignment plate 519a (the vacuum chucking surface 512c). When doing so, the solder balls 300a positioned on the alignment plate 519a side (upper side) out of all the solder balls 300a held on the front end portion 515a that has been moved close to the alignment plate 519a are pulled against the suction force of the vacuum chucking/holding unit 515 so as to be drawn onto the vacuum chucking head 511a due to the suction force that accompanies the drawing of air through the suction inlets 512e of the vacuum chucking head 511a, thereby supplying the solder balls 300a to the vacuum chucking head 511a. Here, some of the solder balls 300a that have been supplied are drawn toward the suction inlets 512e and pass through the through-holes 519e of the alignment plate 519a to become chucked by suction on the edges of the suction inlets 512e of the vacuum chucking surface 512c of the vacuum chucking head 511a.

Figure 42:
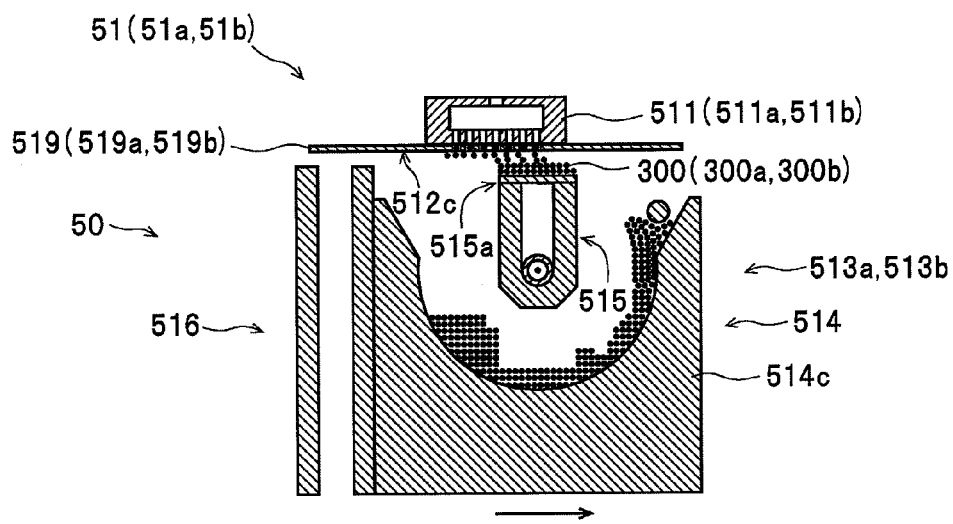
FIG. 42 is a fourth schematic diagram useful in explaining the operation of the solder ball vacuum chucking apparatus.

Next, the control apparatus 8 controls the driving mechanism 517 and, as shown in FIG. 42, in a state where the front end portion 515a has approached the alignment plate 519a, moves the main unit 50 toward the other end (the right end in FIG. 42) of the alignment plate 519a (i.e., in the direction of the arrow in FIG. 42) along the alignment plate 519a (the vacuum chucking surface 512c). When doing so, as described above, the solder balls 300a positioned near the alignment plate 519a out of the solder balls 300a held on the front end portion 515a are pulled onto the vacuum chucking head 511a against the suction force of the vacuum chucking/holding unit 515 by the suction force of the vacuum chucking head 511a, thereby supplying the solder balls 300a to the vacuum chucking head 511a, with some of such solder balls 300a passing through through-holes 519e of the alignment plate 519a and being chucked by suction at the edges of the suction inlets 512e of the vacuum chucking surface 512c of the vacuum chucking head 511a. By doing so, the solder balls 300a held on the front end portion 515a of the vacuum chucking/holding unit 515 are gradually supplied to the vacuum chucking head 511a as the vacuum chucking/holding unit 515 moves (i.e., the solder balls 300a is distributed), so that some of the solder balls 300a that have been supplied are chucked by suction one at a time at the edges of the suction inlets 512e of the vacuum chucking surface 512c of the vacuum chucking head 511a.

Here, since the solder balls 300a are tiny as described above, the attractive forces that act between the solder balls 300a due to static electricity and intermolecular forces between the solder balls become large relative to the weight of the solder balls. This means that the additional (excess) solder balls 300a will stick to the solder balls 300a to be mounted that are chucked by suction on the edges of the suction inlets 512e. Here, in the solder ball mounting apparatus 5, as described above, the thickness L3a of the alignment plate 519a is set at around 80 μm that is somewhat thicker than the diameter L1a of the solder balls 300a and the diameter L4a of the through-holes 519e is set at 90 μm that is somewhat larger than the diameter L1a of the solder balls 300a. Accordingly, only the solder balls 300a to be mounted are held inside the through-holes 519e and the excess solder balls 300a adhere in a state where the excess solder balls 300a partially (in terms of volume) or entirely protrude outward (i.e., downward) from the lower surface 519d of the through-holes 519e. Also, as described above, in the solder ball mounting apparatus 5, since the solder balls 300a held on the front end portion 515a are supplied in a distributed manner, excessive supplying of the solder balls 300a is prevented and the adhesion of excess solder balls 300a is suppressed.

Figure 43:
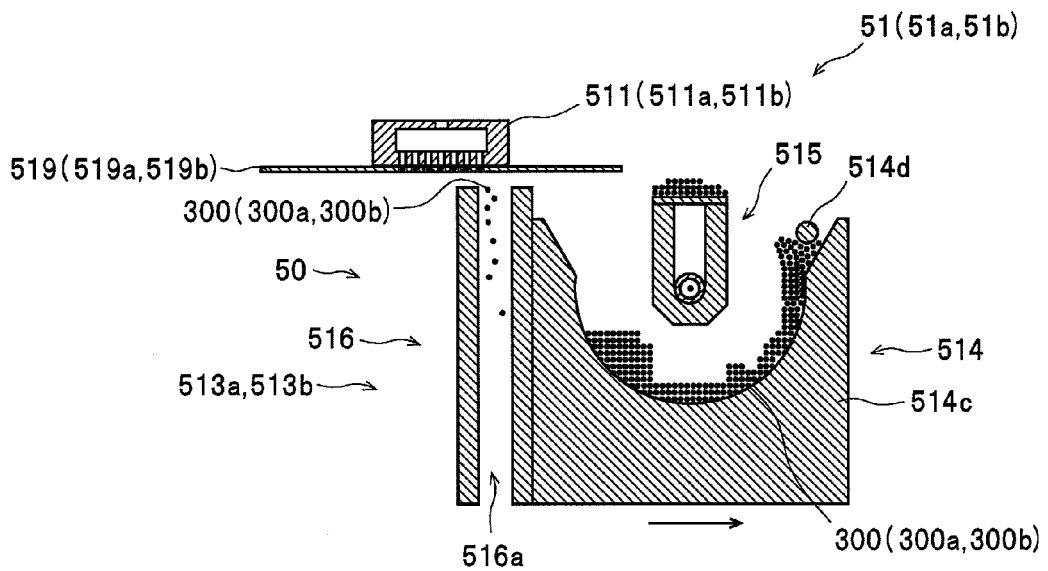
FIG. 43 is a fifth schematic diagram useful in explaining the operation of the solder ball vacuum chucking apparatus.

After this, the control apparatus 8 controls the driving mechanism 517 and, as shown in FIG. 43, moves the main unit 50 further along the alignment plate 519a (in the direction of the arrow in FIG. 43). When doing so, as shown in FIG. 43, the suction unit 516 moves following the vacuum chucking/holding unit 515 and the excessive solder balls 300a become sucked away due to suction through the suction path 516a of the suction unit 516. This means that even if strong attractive forces act between the solder balls 300a to be mounted and the excessive solder balls 300a, all of the excess solder balls 300a will still be forcibly pulled away from the solder balls 300a to be mounted and reliably removed from the vacuum chucking head 511a or the alignment plate 519a.

Figure 44:
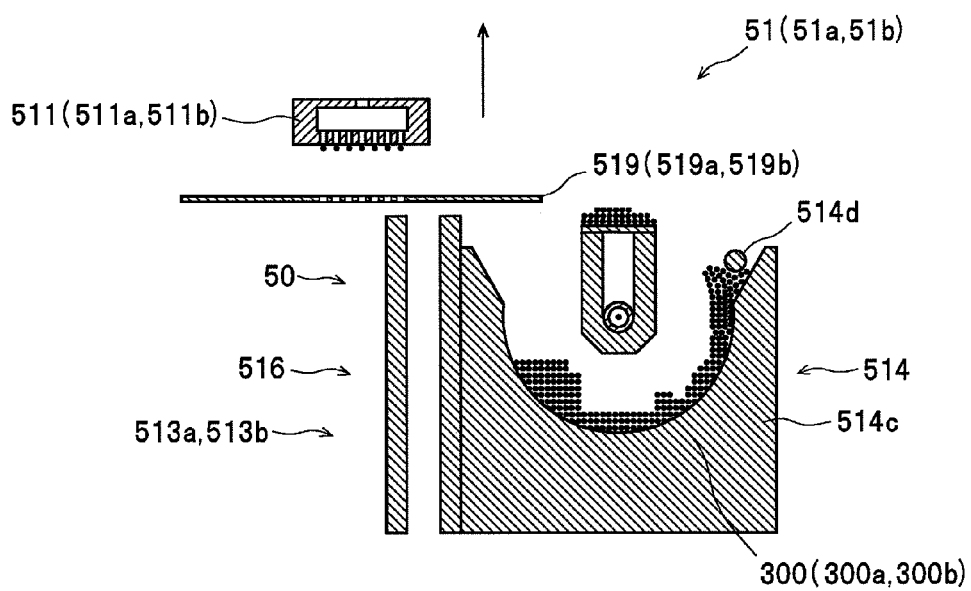
FIG. 44 is a sixth schematic diagram useful in explaining the operation of the solder ball vacuum chucking apparatus.

Next, the control apparatus 8 controls the moving mechanism 520a as shown in FIG. 44 to move the vacuum chucking head 511a in the direction of the arrow in FIG. 44 so that the vacuum chucking head 511a becomes separated from the alignment plate 519a. After this, the control apparatus 8 controls the moving mechanism 520a to convey the vacuum chucking head 511a above the disposed position of the detecting unit 52a. Next, the control apparatus 8 causes the detecting unit 52a to carry out the first detecting process (step 202 of the first mounting process 200). Here, the detecting unit 52a photographs the vacuum chucking surface 512c side of the vacuum chucking head 511a using a camera, not shown, and by carrying out image analysis of the photographed image produced by the camera, detects any excess or insufficiency of the solder balls 300a on the vacuum chucking head 511a after the vacuum chucking process has been carried out.

After this, the control apparatus 8 judges whether excessive solder balls 300a have been detected in the first detecting process (whether a plurality of solder balls 300 have been vacuum-chucked at the edge portion of one suction hole 512e (i.e., whether a "double ball" is present) (step 203). Here, on judging that excess solder balls 300a have been detected, the control apparatus 8 controls the moving mechanism 520a to convey the vacuum chucking head 511a to the disposed position of the first removing unit 53*a*. Next, the control apparatus 8 controls the moving mechanism 520*a* as shown in FIG. 29 to move the vacuum chucking head 511*a* along the upper surface 531*a* in a state where the vacuum chucking surface 512*c* of the vacuum chucking head 511*a* has been brought close to the upper surface 531*a* of the first removing unit 53*a*. At this time, as shown in FIG. 29, the solder balls 300*a* chucked by suction by the vacuum chucking head 511*a* are sucked away by the air drawn by a suction path 531*b*. By doing so, the first removing process that removes all of the solder balls 300*a* chucked by suction by the vacuum chucking head 511*a* from the vacuum chucking head 511*a* is carried out (step 204). Next, after the first removing process has been carried out, the control apparatus 8 controls the moving mechanism 520*a* to convey the vacuum chucking head 511*a* to the disposed position of the alignment plate 519*a*, has the vacuum chucking process, the supplying process, and the suction process described above repeated (step 201), and then carries out step 202 and step 203 described above.

On judging in step 203 described above that excess solder balls 300*a* have not been detected, the control apparatus 8 judges whether insufficient solder balls 300*a* have been detected in the first detecting process (i.e., whether any suction inlets 512*e* where solder balls 300*a* have not been chucked at the edges are present) (step 205). Here, on judging that insufficient solder balls 300*a* have been detected, the control apparatus 8 controls the moving mechanism 520*a* to convey the vacuum chucking head 511*a* to the disposed position of the alignment plate 519*a*, has the vacuum chucking process, the supplying process, and the suction process described above repeated (step 201), and then carries out step 202 and step 203 described above.

Figure 45:
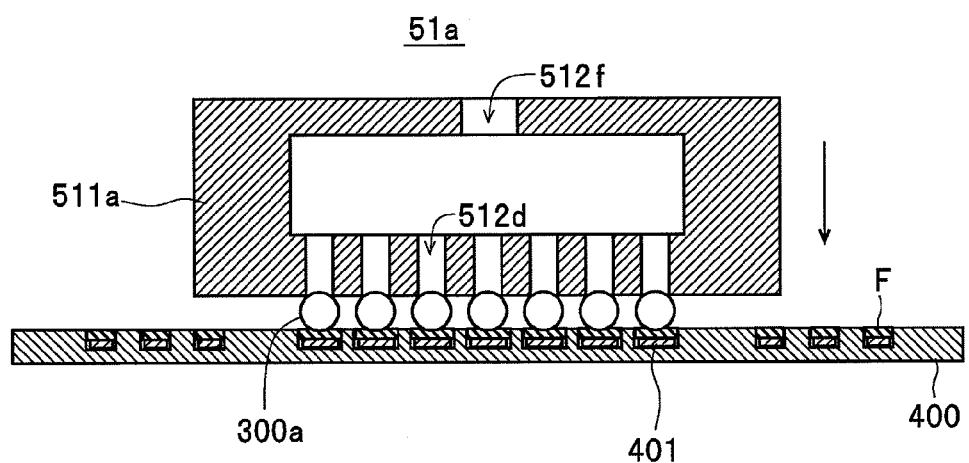
FIG. 45 is a seventh schematic diagram useful in explaining the operation of the solder ball vacuum chucking apparatus.

On the other hand, on judging in step 203 described above that excess solder balls 300*a* have not been detected and judging in step 205 that insufficient solder balls 300*a* have not been detected (that is, when the solder balls 300*a* are chucked by suction on the vacuum chucking head 511*a* with no excess or insufficiency of solder balls 300*a*), the control apparatus 8 causes the solder ball mounting apparatus 5 to carry out the first mounting process (mounting process) (step 206). During the first mounting process, the control apparatus 8 controls the moving mechanism 520*a* to convey the vacuum chucking head 511*a* that holds the solder balls 300*a* to the first mounting position P2*a* and then, as shown in FIG. 45, moves the vacuum chucking head 511*a* toward the substrate 400 (in the direction of the arrow in FIG. 45) so that the solder balls 300*a* chucked by suction on the vacuum chucking head 511*a* come into contact with the flux F applied onto the terminals 401 of the substrate 400.

Figure 46:
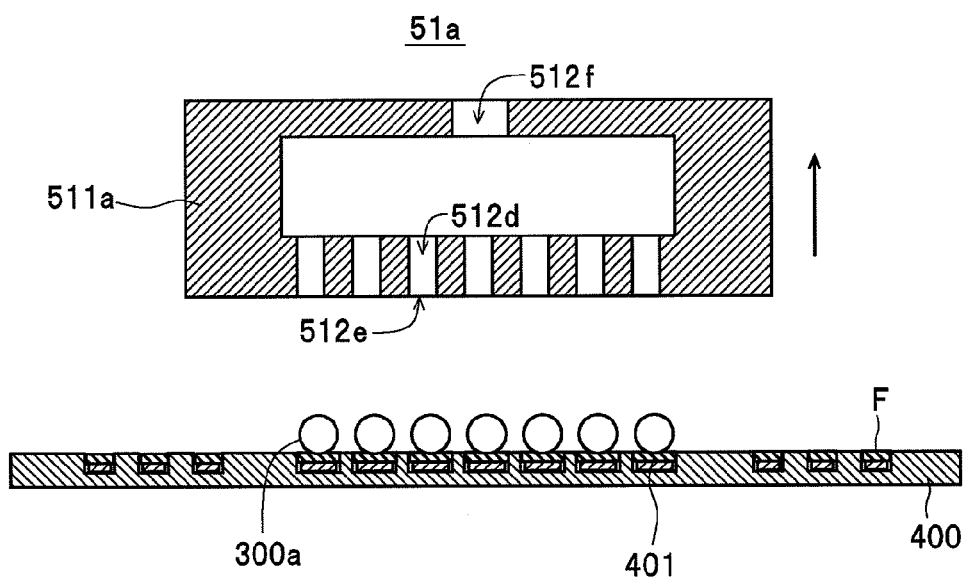
FIG. 46 is an eighth schematic diagram useful in explaining the operation of the solder ball vacuum chucking apparatus.

After this, the control apparatus 8 controls the suction apparatus 518*a* and stops the suction of air via the suction inlets 512*e* of the vacuum chucking head 511*a*. At this time, as shown in FIG. 46, the vacuum chucking of the solder balls 300*a* to the vacuum chucking head 511*a* is released and the solder balls 300*a* become mounted on the flux F applied to the terminals 401 of the substrate 400. By doing so, the first mounting process that mounts the solder balls 300*a* on the terminals 401 formed in the first area 400*a* of the substrate 400 is completed. With the solder ball mounting apparatus 5 described above, excessive supplying of solder balls 300*a* is prevented by carrying out the supplying process described above and excess solder balls 300*a* are reliably removed by carrying out the suction process described above. This means that with the solder ball mounting apparatus 5, mounting of excess solder balls 300*a* on the substrate 400 (that is, excessive mounting of solder balls 300*a* on the substrate 400) is reliably prevented.

Next, the control apparatus 8 controls the moving mechanism 520*a* as shown in FIG. 46 to move the vacuum chucking head 511*a* upward (in the direction of the arrow shown in FIG. 46) and then conveys the vacuum chucking head 511*a* above the disposed position of the detecting unit 52*a*. After this, the control apparatus 8 causes the detecting unit 52*a* to carry out the second detecting process (step 207). Here, by photographing the vacuum chucking surface 512*c* of the vacuum chucking head 511*a* using a camera, not shown, and carrying out image analysis on the image photographed by the camera, the detecting unit 52 detects whether adhering matter adheres to the vacuum chucking head 511*a* after the mounting process has been carried out (more specifically, whether only the flux F is adhering, whether the flux F and the solder balls 300*a* are adhering, and whether only the solder balls 300*a* are adhering).

Next, the control apparatus 8 judges whether the adhesion of flux F as adhering matter has been detected in step 207 (the second detecting process) (i.e., whether only the flux F is adhering or whether the flux F and the solder balls 300*a* are adhering) (step 208). On judging that the adhesion of flux F has been detected, the control apparatus 8 controls the moving mechanism 520*a* to convey the vacuum chucking head 511*a* to the disposed position of the second removing unit 54*a*. After this, the control apparatus 8 causes the second removing unit 54*a* to move the removal member 543 upward so that the front end portion of the removal member 543 protrudes further upward than the surface of the remover liquid 541. Next, as shown in FIG. 30, the control apparatus 8 controls the moving mechanism 520*a* to move the vacuum chucking head 511*a* while keeping the vacuum chucking surface 512*c* of the vacuum chucking head 511*a* in contact with the front end portion of the removal member 543 of the second removing unit 54*a*. When doing so, the flux F will dissolve due to the remover liquid 541 included in the front end portion of the removal member 543 so that the adhering matter that adheres to the vacuum chucking head 511*a* (i.e., the flux F and/or the solder balls 300*a*) will be wiped away (brushed off) by the front end portion of the removal member 543. By doing so, the second removing process that removes the flux F and/or the solder balls 300*a* from the vacuum chucking head 511*a* is carried out (step 209). After this, the control apparatus 8 carries out steps 207 and 208 described above.

Also, on judging that the adhesion of flux F has not been detected in step 208, the control apparatus 8 judges whether the adhesion of only solder balls 300*a* has been detected (step 210). Here, on judging that the adhesion of only solder balls 300*a* as adhering matter has been detected (that is, when the solder balls 300*a* have been detected as adhering matter without the flux F being detected as adhering matter), the control apparatus 8 controls the moving mechanism 520*a* to convey the vacuum chucking head 511*a* to the disposed position of the first removing unit 53*a* and has the first removing process described above (i.e., the removal of the solder balls 300*a* from the vacuum chucking head 511*a*) carried out (step 211). Next, the control apparatus 8 carries out steps 207, 208, and 210 described above. Here, on judging in step 210 that the adhesion of only solder balls 300*a* has not been detected, the control apparatus 8 controls the moving mechanism 520*a* to convey the vacuum chucking head 511*a* to the initial position. By doing so, the first mounting process 200 is completed.

Here, with the solder ball mounting apparatus 5 (the manufacturing apparatus 1), even if the solder balls 300*a* are excessively chucked by suction during the vacuum chucking process, such excessive chucking is detected by the first detecting process and after all the vacuum-chucked solder balls 300*a* have been removed based on the detection result, the vacuum chucking process and the supplying process are repeated. This means that with the solder ball mounting apparatus 5, it is possible to reliably prevent the excessive mounting of solder balls 300*a* on the terminals 401 of the substrate 400 due to the mounting process being carried out using the vacuum chucking head 511*a* in a state where excessive solder balls 300*a* have been vacuum-chucked. Also, with the solder ball mounting apparatus 5, even if insufficient solder balls 300*a* have been chucked by suction during the suction process, such insufficiency is detected by the first detecting process and the vacuum chucking process and the supplying process are repeated based on such detection result. This means that with the solder ball mounting apparatus 5, omission of solder balls 300*a* due to the mounting process being carried out using the vacuum chucking head 511*a* to which insufficient solder balls 300*a* have been vacuum chucked is reliably prevented.

Figure 47:
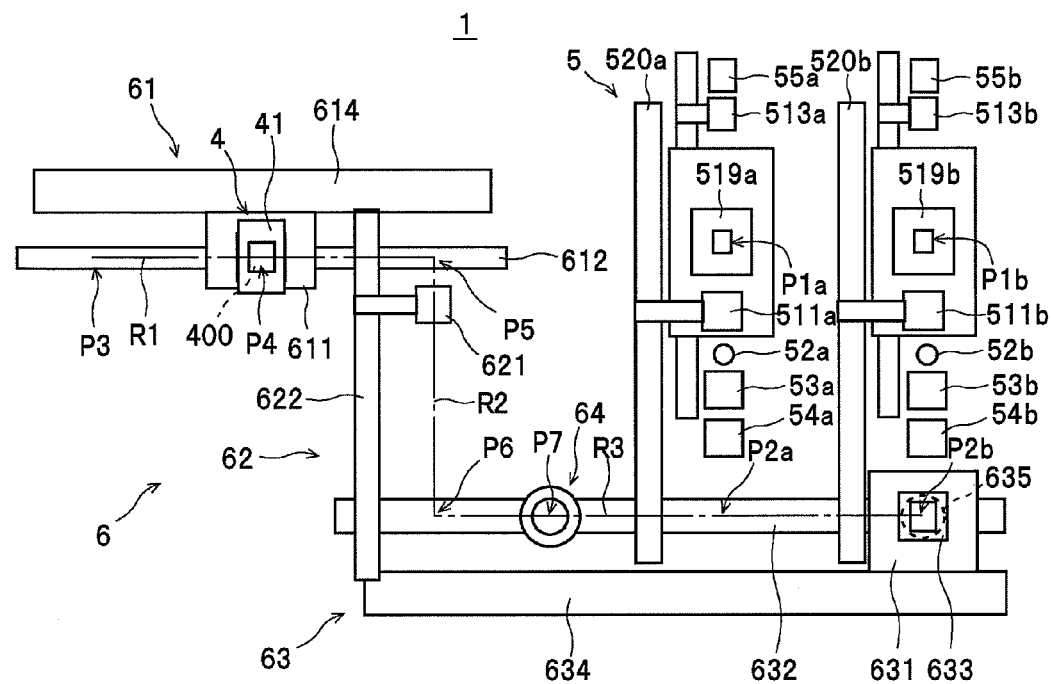
FIG. 47 is a ninth schematic diagram useful in explaining the operation of the solder ball vacuum chucking apparatus.

After this, as shown in FIG. 47, the moving mechanism 634 of the third conveying mechanism 63 of the conveying apparatus 6 moves the stage 631 toward the second mounting position P2*b* and stops the movement when the stage 631 is positioned at the second mounting position P2*b*.

On the other hand, at the start time of the first mounting process 200 or when a predetermined time has passed from the start of the first mounting process 200, the control apparatus 8 starts a second mounting process that is similar to the first mounting process 200. In this second mounting process, the control apparatus 8 controls the moving mechanism 520*b* to convey the vacuum chucking head 511*b* to the disposed position of the alignment plate 519*b* and places the vacuum chucking surface 512*c* of the bottom wall 512*b* of the vacuum chucking head 511*b* and the upper surface 519*c* of the alignment plate 519*b* in contact. Next, the control apparatus 8 causes the vacuum chucking head 511*b* to carry out the vacuum chucking process and causes the supplying unit 513*b* to carry out the supplying process and the suction process. After this, the control apparatus 8 causes the detecting unit 52*b* to carry out the first detecting process and, based on the detection result, has the first removing process, the vacuum chucking process, the supplying process, and the suction process carried out, repeated, or not carried out. Next, the control apparatus 8 causes the solder ball mounting apparatus 5 to carry out the second mounting process.

Figure 48:
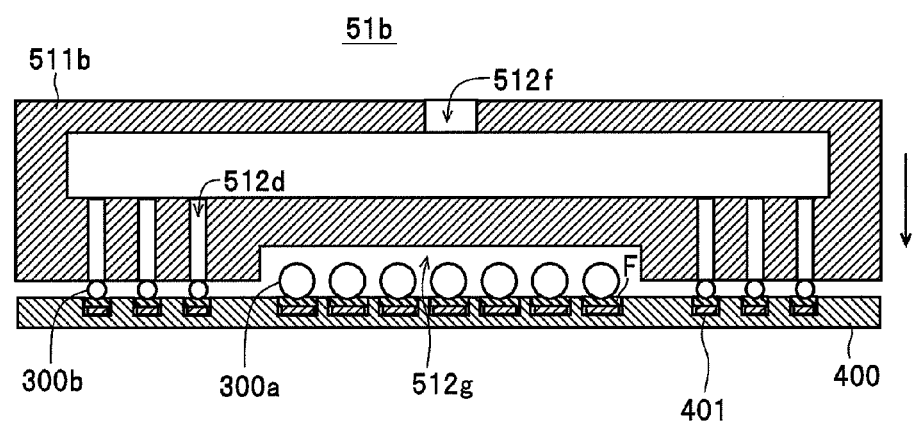
FIG. 48 is a tenth schematic diagram useful in explaining the operation of the solder ball vacuum chucking apparatus.

In the second mounting process, the control apparatus 8 controls the moving mechanism 520*b* to convey the vacuum chucking head 511*b* that holds the solder balls 300*b* to the second mounting position P2*b* and then, as shown in FIG. 48, moves the vacuum chucking head 511*b* toward the substrate 400 (in the direction of the arrow in FIG. 48) so that the solder balls 300*b* chucked by suction to the vacuum chucking head 511*b* come into contact with the flux F that has been applied onto the terminals 401 of the substrate 400.

Here, with the solder ball mounting apparatus 5, the second mounting process is carried out after the first mounting process so that the solder balls 300*b* with a small diameter are mounted by the solder ball mounting apparatus 5 after the solder balls 300*a* with a large diameter have been mounted. That is, the solder ball mounting apparatus 5 carries out the movement process for the vacuum chucking head 511*a* where the suction inlets 512*e* have a large diameter before the movement process for the vacuum chucking head 511*b* where the suction inlets 512*e* have a small diameter. In this case, as shown in FIG. 48, since the concave 512*g* is formed in the vacuum chucking head 511*b*, when the solder ball mounting apparatus 5 carries out the movement processes in the order described above, a situation where the solder balls 300*a* (the solder balls 300 with a large diameter) that have been mounted and the vacuum chucking surface 512*c* of the vacuum chucking head 511*b* come into contact is reliably avoided.

Figure 49:
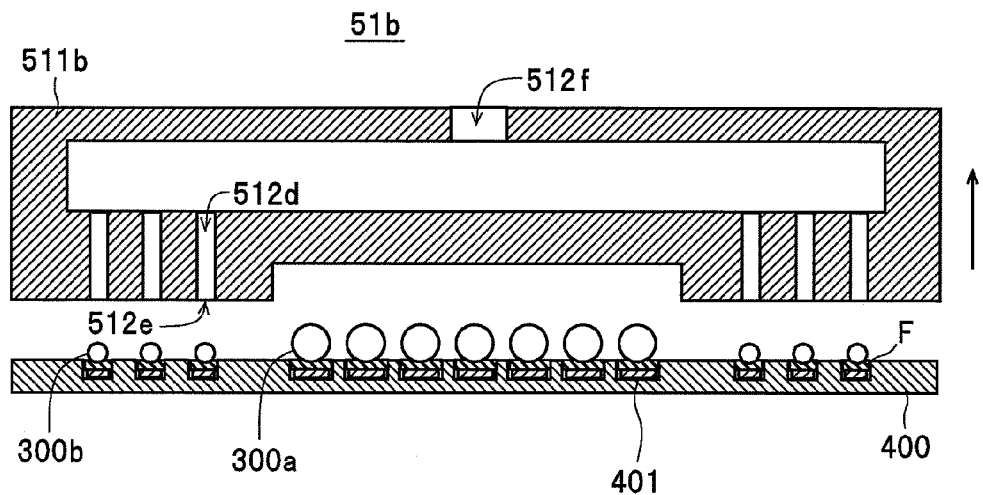
FIG. 49 is an eleventh schematic diagram useful in explaining the operation of the solder ball vacuum chucking apparatus.

Next, the control apparatus 8 controls the suction apparatus 518*b* to stop the drawing of air from the suction inlets 512*e* of the vacuum chucking head 511*b*. When doing so, as shown in FIG. 49, the vacuum chucking of the solder balls 300*b* to the vacuum chucking head 511*b* is released and the solder balls 300*b* are mounted onto the flux F that has been applied on the terminals 401 of the substrate 400.

By doing so, the second mounting process that mounts the solder balls 300*b* on the terminals 401 formed on the second area 400*b* of the substrate 400 is completed, and therefore the mounting of the solder balls 300 on all of the terminals 401 is completed.

After this, the control apparatus 8 controls the moving mechanism 520*b* to convey the vacuum chucking head 511*b* above the disposed position of the detecting unit 52*b*, causes the detecting unit 52*b* to carry out the second detecting process, and after having the second removing process or the first removing process carried out (or not carried out) based on the detection result, controls the moving mechanism 520*b* to convey the vacuum chucking head 511*b* to the initial position. By doing so, the second mounting process is completed.

Here, with the manufacturing apparatus 1 (manufacturing method), as described above, since the conveying process is carried out in accordance with the instructions of the control apparatus 8 and only the substrates 400 that have been judged to be non-defective in the electrical testing are conveyed to the supply position P3 by the conveying apparatus 6, the solder balls 300 are mounted by the solder ball mounting apparatus 5 on only the substrates 400 that have been judged to be non-defective. Accordingly, with the manufacturing apparatus 1, the mounting of the solder balls 300 on substrates 400 that are electrically defective is reliably avoided, and since wasteful consumption of the solder balls 300 is suppressed, it is possible to sufficiently lower the manufacturing cost.

Figure 58:
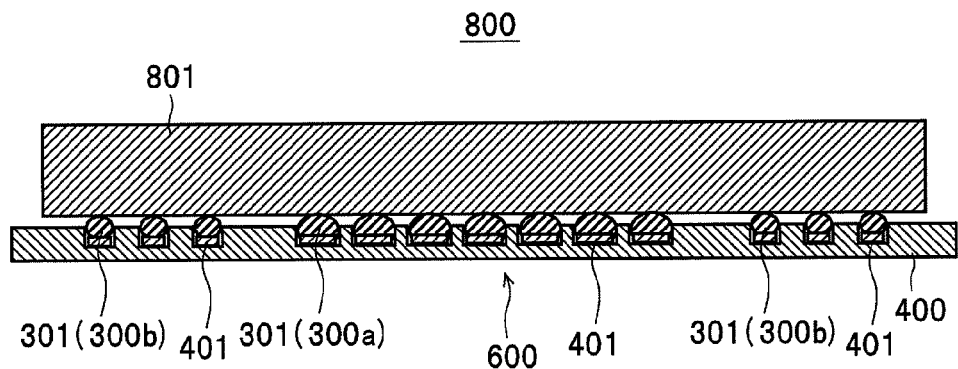
FIG. 58 is a cross-sectional view showing the construction of an electronic component-mounted substrate.
Figure 59:
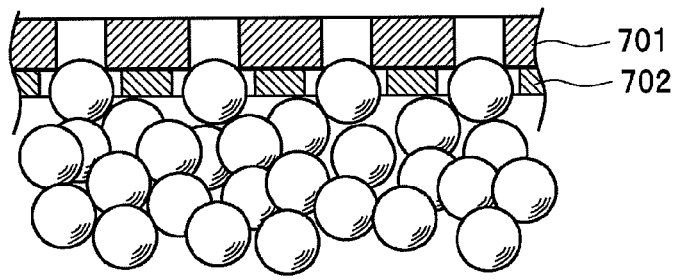
FIG. 59 is a first schematic diagram useful in explaining the operation of a conventional solder ball mounting apparatus.
Figure 60:
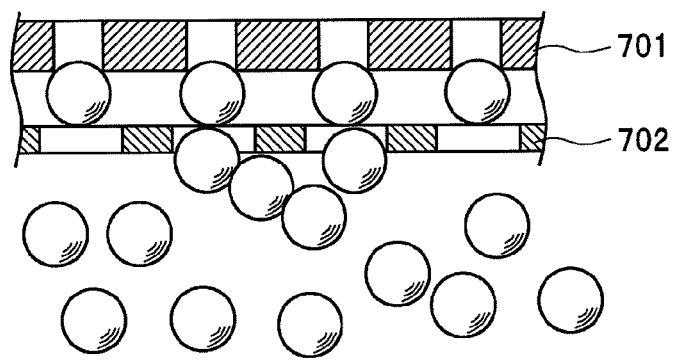
FIG. 60 is a second schematic diagram useful in explaining the operation of the conventional solder ball mounting apparatus.

Next, the control apparatus 8 controls the conveying apparatus 6 to convey the substrate 400, on which the mounting of the solder balls 300*a*, 300*b* has been completed, to the melting apparatus 7 and moves the stage 631 from the second mounting position P2*b* to the handover position P6 (i.e., returns the stage 631 to the initial position). After this, the melting apparatus 7 carries out the reflow process (melting process) on the substrates 400 on which the solder balls 300*a*, 300*b* have been mounted. When doing so, as shown in FIG. 51, the melted solder balls 300*a*, 300*b* become attached onto the terminals 401 of the substrate 400 in a state where the solder balls 300*a*, 300*b* have become hemispherical (the solder 301 shown in FIG. 51). A ball grid array (BGA) is constructed on the substrate 400 by the attached solder 301. By doing so, as shown in FIG. 51, the solder-mounted substrate 600 is completed. Next, the solder-mounted substrate 600 is conveyed to an electronic component mounting apparatus, not shown, and after this, an electronic component 801 is mounted on the solder-mounted substrate 600 by the electronic component mounting apparatus. Next, by carrying out a reflow process, for example, the solder balls 300 (the solder 301) attached to the terminals 401 of the substrate 400 on the solder-mounted substrate 600 are melted so that terminals, not shown, of the mounted electronic component 801 become connected to the terminals 401 of the substrate 400 via the melted solder balls 300 (the solder 301). By doing so, as shown in FIG. 58, an electronic component-mounted substrate 800 is manufactured.

On the other hand, while the first mounting process and the second mounting process described above are being carried out, the control apparatus 8 causes the first conveying mechanism 61 to start the first conveying process on the next substrate 400 and then causes the flux applying apparatus 4 to carry out the applying process on such substrate 400. That is, in the manufacturing apparatus 1, it is possible to carry out the applying process and the mounting process in parallel. To do so, the next substrate 400 is mounted onto the vacuum chucking table 633 (the stage 631) of the third conveying mechanism 63 without the vacuum chucking table 633 standing by at the handover position P6 for a long time. Also, when a predetermined time has passed from the start of the first conveying process on the next substrate 400, the control apparatus 8 causes the solder ball mounting apparatus 5 to start the first mounting process and the second mounting process (the vacuum chucking process, the supplying process, and the suction process) on the next substrate 400. This means that with the manufacturing apparatus 1, since the vacuum chucking process, the supplying process, and the suction process are completed (or substantially completed) while the next substrate 400 is being conveyed to the first mounting position P2*a* and the second mounting position P2*b*, it is possible to reduce the time that the vacuum chucking table 633 of the third conveying mechanism 63 stands by at the first mounting position P2*a* and/or the second mounting position P2*b*. Accordingly, with the manufacturing apparatus 1, since it is possible to sufficiently reduce the processing time per substrate 400, it is possible to sufficiently improve productivity.

On the other hand, when the mounting process has been completed a number of times set in advance (one example of "when a condition set in advance is satisfied"), the control apparatus 8 instructs the solder ball refilling apparatuses 55 to carry out the refilling process. The solder ball refilling apparatuses 55 then carries out the refilling process in accordance with such instructions. During this refilling process, the rotary actuator 556*b* of the rotating mechanism 556 of each solder ball refilling apparatus 55 rotates the rotating shaft 557*c* in the direction of the arrow E1 shown in FIG. 54. When doing so, the connecting portion 556*c* attached to the rotating shaft 557*c*, the connecting portion 556*d* connected to the connecting portion 556*c*, and the mounting portion 554 fixed onto the upper end of the connecting portion 556*d* are rotated in the direction of the arrow E1.

Figure 56:
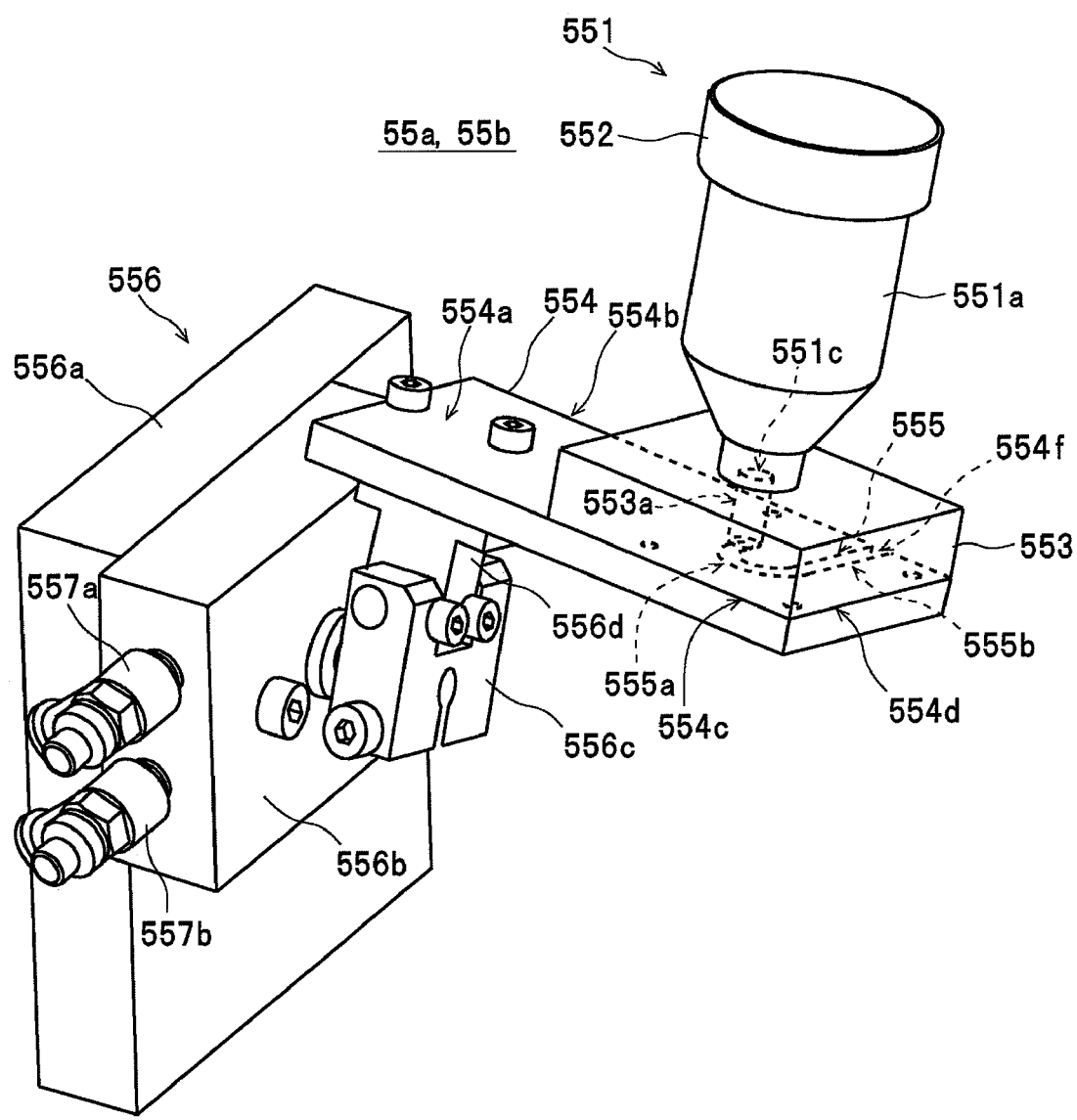
FIG. 56 is a fifth schematic diagram useful in explaining the operation of the solder ball refilling apparatus.

Next, as shown in FIG. 56, the rotary actuator 556*b* stops the rotation of the rotating shaft 557*c* when the upper surface 554*a* is in the second posture that is inclined by around 15° with respect to the horizontal with the refilling opening 554*f* (i.e., the edge portion 554*b* of the mounting portion 554) positioned lower than the storage portion 555*a* of the channel 555 (the edge portion 554*c* side). At this time, due to the inclination of the mounting portion 554, the solder balls 300 stored in the storage portion 555*a* of the channel 555 slide down the movement path 555*b*. After this, the solder balls 300 that have slid down the movement path 555*b* fall from the refilling opening 554*f* and refill the hold 514*a* of the holding vessel 514 of the solder ball mounting apparatus 5.

Here, with the solder ball refilling apparatus 55, an appropriate amount of solder balls 300 set in advance is stored in the storage portion 555*a* of the channel 555 during the standby state. This means that with the solder ball refilling apparatus 55, by merely rotating the mounting portion 554 to change the posture of the mounting portion 554 from the first posture to the second posture, the hold 514*a* of the holding vessel 514 of the solder ball mounting apparatus 5 can be reliably refilled with an appropriate amount of solder balls 300. Also, as shown in FIGS. 52 and 56, with the solder ball refilling apparatus 55, when the mounting portion 554 has been placed in the second posture, since the end of the storage portion 555*a* that is connected to the discharge opening 551*c* of the refilling vessel 551 will be positioned lower than the convex part of the U shape, the solder balls 300 discharged from the refilling vessel 551 will be held up by the end portion of the storage portion 555*a* and the spacer 553 that covers the opening of the channel 555. This means that a situation where solder balls 300 aside from the solder balls 300 stored in the storage portion 555*a* of the channel 555 cross the surface of the mounting portion 554 and fall from positions aside from the refilling opening 554*f* is reliably prevented.

Next, the rotary actuator 556*b* rotates the rotating shaft 557*c* in the direction of the arrow E2 shown in FIG. 54. When doing so, the connecting portion 556*c* attached to the rotating shaft 557*c*, the connecting portion 556*d* connected to the connecting portion 556*c*, and the mounting portion 554 fixed onto the upper end of the connecting portion 556*d* are rotated in the direction of the arrow E2. After this, the rotary actuator 556*b* stops the rotation of the rotating shaft 557*c* when the upper surface 554*a* is in the first posture that is inclined by around 5° with respect to the horizontal with the storage portion 555*a* of the channel 555 (the edge portion 554*c* side) positioned lower than the refilling opening 554*f* (i.e., the edge portion 554*b*). By doing so, the solder ball refilling apparatus 55 is returned to the standby state. Here, by returning the solder ball refilling apparatus 55 to the standby state, the solder balls 300 inside the refilling vessel 551 that are discharged from the discharge opening 551*c* are held in the channel 555 via the discharge hole 553*a* of the spacer 553. Also, as described above, an appropriate amount of the solder balls 300 that have been introduced will be stored in a region from the end of the storage portion 555*a* that is connected to the discharge opening 551*c* to the convex part of the U shape (the region that is diagonally shaded in FIG. 53). By doing so, the refilling process carried out by the solder ball refilling apparatus 55 is completed. After this, the control apparatus 8 instructs the solder ball refilling apparatus 55 to execute the refilling process whenever the mounting process has been completed a set number of times, and in accordance with such instructions, the solder ball refilling apparatus 55 carries out the refilling process.

Hereafter, by causing the various apparatuses (component elements) that construct the manufacturing apparatus 1 to carry out the various processes described above, the solder balls 300*a*, 300*b* are continuously mounted on the substrates 400 and the reflowing process is carried out on the substrates 400 on which the solder balls 300*a*, 300*b* have been mounted. By doing so, the solder-mounted substrates 600 are continuously manufactured.

In this way, with the solder-mounted substrate manufacturing apparatus 1 and the substrate manufacturing method described above, a supplying process is carried out where the solder balls 300 are supplied to the vacuum chucking head 511 by chucking and holding the solder balls 300 by suction on the front end portion 515*a* of the vacuum chucking/holding unit 515, bringing the vacuum chucking/holding unit 515 that holds the solder balls 300 on the front end portion 515*a* thereof and the vacuum chucking surface 512*c* of the vacuum chucking head 511 relatively close to one another, and drawing in air from the suction inlets 512*e*. This means that according to the solder-mounted substrate manufacturing apparatus 1 and the substrate manufacturing method described above, since it is possible to supply an appropriate amount of solder balls 300 to the vacuum chucking head 511 by holding the appropriate amount of solder balls 300 on the front end portion 515*a*, it is possible to reliably prevent the supplying of excess solder balls 300. As a result, it is possible to suppress the adhesion of excess solder balls 300. Therefore, according to the solder-mounted substrate manufacturing apparatus 1 and the substrate manufacturing method described above, since it is possible to hold the only the solder balls 300 to be mounted on the vacuum chucking head 511, it is possible to reliably prevent the mounting of excessive solder balls 300 on the substrate 400, that is, the excessive mounting of solder balls 300 on the substrate 400.

Also, with the solder-mounted substrate manufacturing apparatus 1 and the substrate manufacturing method described above, the suction process is carried out by moving the suction unit 516 that is capable of pulling away the solder balls 300 by suction and the vacuum chucking surface 512c of the vacuum chucking head 511 relatively close to one another and removing excess solder balls 300 by suction without removing the solder balls 300 that are vacuum-chucked at the edges of the suction inlets 512e. This means that according to the solder-mounted substrate manufacturing apparatus 1 and the substrate manufacturing method described above, even if strong attractive forces act between the solder balls 300 to be mounted and the excessive solder balls 300 due to static electricity and intermolecular forces, it will still be possible to reliably remove all of the excess solder balls 300 from the vacuum chucking head 511 by using suction by the suction unit to forcibly pull the excess solder balls 300 away from the solder balls 300 to be mounted. Therefore, according to the solder-mounted substrate manufacturing apparatus 1 and the substrate manufacturing method described above, since it is possible to cause the vacuum chucking head 511 to hold only the solder balls 300 to be mounted with greater reliability, it is possible to prevent the mounting of excess solder balls 300 on the substrate 400, that is, the excessive mounting of solder balls 300 on the substrate 400 with even greater reliability.

Also, according to the solder-mounted substrate manufacturing apparatus 1 and the substrate manufacturing method described above, the first detecting process is carried out after the vacuum chucking process has been carried out, and based on the result of the first detecting process, the first removing process is carried out by the first removing unit 53, the vacuum chucking process by the vacuum chucking head 511 is repeated, and the supplying process by the supplying unit 513 is also repeated. This means that even if solder balls 300 are excessively chucked during the vacuum chucking process, the chucked solder balls 300 will be removed and then the vacuum chucking process and the supplying process will be repeated. Similarly, if insufficient solder balls 300 are chucked during the vacuum chucking process, the vacuum chucking process and the supplying process will be repeated. Therefore, according to the solder-mounted substrate manufacturing apparatus 1 and the substrate manufacturing method described above, since it is possible to carry out the mounting process using the vacuum chucking head 511 on which the solder balls 300 have been vacuum-chucked with no excess or insufficiency, it is possible to reliably mount the solder balls 300 onto the terminals 401 of the substrate 400 with no excess or insufficiency.

Also, with the solder-mounted substrate manufacturing apparatus 1 and the substrate manufacturing method described above, an applying process that spreads out the flux F on the application surface of the substrate 400 is carried out using the squeegee units 421a, 421b that include the base portions 422a, 422b, the linear guide mechanism 423 that connects the base portions 422a, 422b while tolerating movement of the base portion 422b relative to the base portion 422a along the first direction (the direction of the arrow A shown in FIG. 4), and the springs 424 that energize the base portions 422a, 422b so as to move apart, with the squeegee units 421a, 421b also having squeegees (in this example, the base portions 425 and the squeegee main bodies 427) attached to the base portions 422b via the rotational shafts 426 that are disposed with the axes thereof along the direction of movement relative to the substrate 400 (the direction of the arrow C shown in FIGS. 11 to 13 and the direction of the arrow D shown in FIGS. 11 and 14: the second direction).

Therefore, according to the solder-mounted substrate manufacturing apparatus 1 and the substrate manufacturing method described above, even if the base portion 425 and the squeegee main body 427 (i.e., the squeegee) have been attached in an inclined state, if the metal mask 41 or the substrate 400 on which the squeegee main body 427 is pressed during the application of the flux F is inclined, or if the front end portion 427x has become slanted due to grinding, when the squeegee unit 421 (the applying unit 42) has been lowered by the applying mechanism 44 so that the front end portion 427x of the squeegee main body 427 contacts the surface of the metal mask 41, the base portion 425 and the squeegee main body 427 (i.e., the squeegee) will rotate with respect to the base portion 422b about the rotational shaft 426, and as a result, it is possible for the entire width of the front end portion 427x of the squeegee main body 427 to contact the metal mask 41. Also, when the squeegee unit 421 (the applying unit 42) is lowered further by the applying mechanism 44, the springs 424 will become compressed and the base portion 422b (the base portion 425 and the squeegee main body 427) will be pressed downward with respect to the base portion 422a. As a result, it is possible for the front end portion 427x of the squeegee main body 427 that is attached to the base portion 422b to press on the surface of the metal mask 41 with a sufficient pressing force. By doing so, according to the solder-mounted substrate manufacturing apparatus 1 and the substrate manufacturing method described above, since a complex operation that finely adjusts the fixed position of the squeegee unit 421 relative to the applying mechanism 44 to avoid inclination of the base portion 425 and the squeegee main body 427 (the squeegee) is not necessary, it is possible not only to easily attach the squeegee unit 421 to the applying mechanism 44 but also to spread out the flux F in a state where the entire width of the front end portion 427x is pressed onto the surface of the metal mask 41 with a uniform pressing force in the various states described above. As a result, it is possible to apply the flux F onto the application area Pa of the substrate 400 uniformly without inconsistencies in application.

Also, with the solder-mounted substrate manufacturing apparatus 1 and the substrate manufacturing method described above, during the supplying process, in a state where the vacuum chucking/holding unit 515 that holds the solder balls 300 on the front end portion 515a and the vacuum chucking surface 512c of the vacuum chucking head 511 have been brought relatively close together, at least one of the vacuum chucking head 511 and the vacuum chucking/holding unit 515 is moved so that the vacuum chucking/holding unit 515 moves relatively along the vacuum chucking surface 512c. This means that according to the solder-mounted substrate manufacturing apparatus 1 and the substrate manufacturing method described above, it is possible to supply the solder balls 300 held on the front end portion 515a of the vacuum chucking/holding unit 515 little by little in a distributed manner as the vacuum chucking/holding unit 515 moves. As a result, it is possible to prevent excessive supplying of the solder balls 300 even more reliably and to further suppress the adhesion of excess solder balls 300. Therefore, according to the solder-mounted substrate manufacturing apparatus 1 and the substrate manufacturing method described above, it is possible to reliably prevent the mounting of excess solder balls 300 on the substrate 400, that is, the excessive mounting of solder balls 300 on the substrate 400.

Also, according to the solder-mounted substrate manufacturing apparatus 1 and the substrate manufacturing method described above, the moving process is carried out separately for each of a plurality of vacuum chucking heads 511 that are constructed so that the suction inlets 512e that hold the solder balls 300 have different diameters and a plurality of types of solder balls 300 that have different diameters L1 corresponding to the diameters of the suction inlets 512e of the vacuum chucking heads 511 are mounted on a single substrate 400. This means that according to the solder-mounted substrate manufacturing apparatus 1 and the substrate manufacturing method described above, it is possible to reliably mount a plurality of types of solder balls 300 with different diameters L1 (i.e., different sizes) on a substrate 400 with a complex construction where the intervals between adjacent terminals 401 differ in different areas and/or the thickness of lead wires to be connected differs in different areas.

Also, with the solder-mounted substrate manufacturing apparatus 1 and the substrate manufacturing method described above, the channel 555, which is composed of the storage portion 555a that stores the solder balls 300 and the movement path 555b that joins the storage portion 555a and the refilling opening 554f, is formed in the mounting portion 554, and the refilling process that refills the holding vessel 514 of the solder ball vacuum chucking apparatus 51 of the solder ball mounting apparatus 5 with the solder balls 300 is carried out using the solder ball refilling apparatus 55 in which the rotating mechanism 556 keeps the mounting portion 554 in the first posture where the storage portion 555a is positioned lower than the refilling opening 554f during the standby state and rotates the mounting portion 554 to assume the second posture where the refilling opening 554f is positioned lower than the storage portion 555a during the refilling process. This means that according to the solder-mounted substrate manufacturing apparatus 1 and the substrate manufacturing method described above, without using a refilling vessel 551 that needs to be manufactured precisely, it is possible to store an appropriate amount of solder balls 300 that is set in advance in the storage portion 555a of the channel 555 in the standby state. Also, in spite of using a simple construction where the mounting portion 554 is rotated during the refilling process to change the posture of the mounting portion 554 from the first posture to the second posture, it is possible to reliably refill the hold 514a of the holding vessel 514 with an appropriate amount of solder balls 300. Therefore, according to the solder-mounted substrate manufacturing apparatus 1 and the substrate manufacturing method described above, it is possible to use a refilling vessel 551 and a rotating mechanism 556 of a simple construction, which means that it is possible to sufficiently reduce the manufacturing cost of the solder-mounted substrate manufacturing apparatus 1.

Also, with the solder-mounted substrate manufacturing apparatus 1 and the substrate manufacturing method described above, since the dicing process that dices the multi-substrate panel 500, where a plurality of substrates 400 are formed in an arrangement, into individual substrates 400 and the electrical testing on the individual substrates 400 are carried out in a predetermined order, the solder balls 300 are mounted on only the substrates 400 that have been judged to be non-defective in the electrical testing. This means that according to the solder-mounted substrate manufacturing apparatus 1 and the substrate manufacturing method described above, it is possible to reliably avoid the mounting of solder balls 300 onto substrates 400 that are electrically defective. By doing so, it is possible to reliably suppress wasteful consumption of the solder balls 300, and as a result, it is possible to sufficiently reduce the manufacturing cost.

Also, with the solder-mounted substrate manufacturing apparatus 1 and the substrate manufacturing method described above, the front end portion 515a of the vacuum chucking/holding unit 515 that is disposed on the opening 514b side of the holding vessel 514 is caused to face the bottom of the vessel main body 514c of the holding vessel 514 and to chuck and hold the solder balls 300 on the front end portion 515a by suction. During the supplying process, the vacuum chucking/holding unit 515 is rotated so that the front end portion 515a faces the vacuum chucking surface 512c of the vacuum chucking head 511. This means that according to the solder-mounted substrate manufacturing apparatus 1 and the substrate manufacturing method described above, in spite of using a simple construction where the vacuum chucking/holding unit 515 is merely rotated, it is possible to reliably supply an appropriate amount of solder balls 300 to the vacuum chucking head 511.

Also, with the solder-mounted substrate manufacturing apparatus 1 and the substrate manufacturing method described above, the supplying process is carried out using the holding vessel 514 and the vacuum chucking/holding unit 515 that are integrated. This means that according to the solder-mounted substrate manufacturing apparatus 1 and the substrate manufacturing method described above, compared to a construction and method that use a holding vessel 514 and a vacuum chucking/holding unit 515 which are constructed separately and move such components separately using a plurality of driving mechanisms, it is possible to move the holding vessel 514 and the vacuum chucking/holding unit 515 together using a single driving mechanism 517. As a result, it is possible to simplify the construction of the solder ball vacuum chucking apparatuses 51a, 51b, the solder ball mounting apparatus 5, and the solder-mounted substrate manufacturing apparatus 1 and to improve the processing efficiency thereof.

Also, with the solder-mounted substrate manufacturing apparatus 1 and the substrate manufacturing method described above, the supplying process and the suction process are carried out using the main unit 50 in which the holding vessel 514, the vacuum chucking/holding unit 515, and the suction unit 516 are integrally constructed. This means that according to the solder-mounted substrate manufacturing apparatus 1 and the substrate manufacturing method described above, compared to a construction and method that use a holding vessel 514, a vacuum chucking/holding unit 515, and a suction unit 516 which are separately constructed and move such components separately using a plurality of driving mechanisms, it is possible to move such components together using a single driving mechanism 517. As a result, it is possible to simplify the construction of the solder ball vacuum chucking apparatuses 51a, 51b, the solder ball mounting apparatus 5, and the solder-mounted substrate manufacturing apparatus 1 and to improve the processing efficiency thereof.

Also, with the solder-mounted substrate manufacturing apparatus 1 and the substrate manufacturing method described above, the supplying process and the suction process are carried out in a state where the alignment plate 519, in which the through-holes 519e that are connected to the suction inlets 512e and through which the solder balls 300 can pass are formed, has been attached to the vacuum chucking head 511. This means that according to the solder-mounted substrate manufacturing apparatus 1 and the substrate manufacturing method described above, it is possible to reliably supply the solder balls 300 one at a time to the respective suction inlets 512*e* of the vacuum chucking head 511 during the supplying process.

Also, with the solder-mounted substrate manufacturing apparatus 1 and the substrate manufacturing method described above, the detecting unit 52 carries out the second detecting process after execution of the mounting process and the control apparatus 8 controls execution of the second removing process by the second removing unit 54 based on the result of the second detecting process. This means that according to the solder-mounted substrate manufacturing apparatus 1 and the substrate manufacturing method described above, even if flux applied to the terminals 401 of the substrate 400 adheres to the vacuum chucking head 511 during the execution of the mounting process and/or solder balls 300 adhere to the vacuum chucking head 511 due to the adhesion of flux, it will still be possible to reliably remove such flux and/or solder balls 300 (adhering matter that includes at least one of flux and solder balls). As a result, it is possible to reliably prevent a situation where the execution of various subsequent processes is obstructed by adhering matter that adheres to the vacuum chucking head 511.

Also, with the solder-mounted substrate manufacturing apparatus 1 and the substrate manufacturing method described above, the detecting unit 52 carries out the second detecting process after execution of the mounting process and the control apparatus 8 controls execution of the first removing process by the first removing unit 53 based on the result of the second detecting process. This means that according to the solder-mounted substrate manufacturing apparatus 1 and the substrate manufacturing method described above, if, for example, only solder balls 300 adhere to the vacuum chucking head 511 with no adhesion of flux after execution of the mounting process, it will be possible to reliably remove such solder balls 300 by carrying out the first removing process that is less time-consuming than the second removing process that removes the flux. As a result, it is possible to sufficiently reduce the processing time.

Also, with the solder ball mounting apparatus 5, the concave 512*g* is formed in the vacuum chucking head 511*b* and the solder ball mounting apparatus 5 carries out the moving process for the vacuum chucking head 511*a* where the suction inlets 512*e* have a large diameter before the moving process for the vacuum chucking head 511*b* where the suction inlets 512*e* have a small diameter. This means that according to the solder ball mounting apparatus 5, it is possible to reliably avoid contact between the solder balls 300*a* that have already been mounted on the substrate 400 and the vacuum chucking head 511*b*, and as a result, it is possible to reliably avoid having the solder balls 300*a* that have been mounted knocked off by contact.

Also, according to the solder ball mounting apparatus 5, by including the same number of moving mechanisms 520 as the number of vacuum chucking heads 511 and having the moving mechanisms 520 separately move the vacuum chucking heads 511, compared to a construction where a plurality of vacuum chucking heads 511 are interchanged and moved by a single moving mechanism 520, it is possible to reduce the processing time by the time required to interchange the vacuum chucking heads, which makes it possible to sufficiently improve the processing efficiency.

Also, with the solder-mounted substrate manufacturing apparatus 1 and the substrate manufacturing method described above, the storage portion 555*a* is formed in a U shape when viewed from above and the movement path 555*b* is formed in a straight line when viewed from above. This means that with the solder-mounted substrate manufacturing apparatus 1 and the substrate manufacturing method described above, since the U-shaped convex part of the storage portion 555*a* becomes positioned lower when the mounting portion 554 is placed in the first posture, by connecting the discharge opening 551*c* of the refilling vessel 551 to the end of the storage portion 555*a*, it is possible to reliably store an appropriate amount of the solder balls 300 in a region that extends from such end to the U-shaped convex part. Also, when the mounting portion 554 is placed in the second posture, it is possible to cause the stored solder balls 300 to slide down the movement path 555*b* and reliably move toward the refilling opening 554*f*. In addition, since the end of the storage portion 555*a* that is connected to the discharge opening 551*c* of the refilling vessel 551 becomes positioned lower than the U-shaped convex part when the mounting portion 554 is placed in the second posture, the solder balls 300 discharged from the refilling vessel 551 will be blocked by the end of the storage portion 555*a* and the spacer 553 that covers the opening of the channel 555. As a result, it is possible to prevent solder balls 300 aside from the solder balls 300 stored in the storage portion 555*a* of the channel 555 from crossing the surface of the mounting portion 554 and falling from positions aside from the refilling opening 554*f*.

Also, with the solder-mounted substrate manufacturing apparatus 1 and the substrate manufacturing method described above, by including the nitrogen gas supplying unit 557 that supplies nitrogen gas inside the refilling vessel 551, it is possible to reliably prevent oxidization of the solder balls 300 held in the refilling vessel 551. This means that it is possible to reliably prevent a situation where the refilling process becomes difficult due to the solder balls 300 becoming joined together to form lumps.

Also, according to the solder-mounted substrate manufacturing apparatus 1 and the substrate manufacturing method described above, the control apparatus 8 causes the solder ball refilling apparatus 55 to carry out the refilling process every time a condition set in advance is satisfied. By having the refilling process carried out when the mounting process has been carried out a predetermined number of times as one example of when the condition set in advance is satisfied, it is possible to reliably prevent a situation where the number of solder balls 300 to be mounted on the substrate 400 is insufficient.

Also, according to the solder-mounted substrate manufacturing apparatus 1 and the substrate manufacturing method described above, by carrying out the applying process using squeegees that include the squeegee main body 427 and the base portion 425 that is attached to the base portion 422*b* via the rotational shaft 426 and is capable of being detached from the squeegee main body 427, it is possible during a grinding operation on the squeegee main body 427 (the plate-shaped portion 427*a*) to remove only the squeegee main body 427 from the base portion 425 without removing the entire squeegee unit 421 from the applying mechanism 44. Also, when the squeegee main body 427 (the plate-shaped portion 427*a*) has become short due to repeated grinding, by replacing only the squeegee main body 427 with a new component, it is possible to continue using the base portions 422*a*, 422*b*, 425, and the like. This makes it possible to sufficiently reduce the running cost of the solder-mounted substrate manufacturing apparatus 1.

Also, with the solder-mounted substrate manufacturing apparatus 1 and the substrate manufacturing method described above, the electrical testing is carried out after the dicing process has been carried out. This means that according to the solder-mounted substrate manufacturing apparatus 1 and the substrate manufacturing method described above, as one example, even if broken wires or shorting has occurred in the conductive pattern due to vibrations and the like during the dicing process, it will still be possible to reliably judge that the substrate 400 in question is defective. Therefore, according to the solder-mounted substrate manufacturing apparatus 1 and the substrate manufacturing method described above, in addition to it being possible to suppress the wasteful consumption of solder balls 300 due to the mounting of solder balls 300 on substrates 400 that have become defective during manufacturing of the multi-substrate panel 500, it is also possible to reliably suppress the wasteful consumption of solder balls 300 due to mounting of the solder balls 300 on substrates 400 that have become defective due to the dicing process. As a result, it is possible to significantly reduce the manufacturing cost.

The solder-mounted substrate 600 is manufactured by the solder-mounted substrate manufacturing apparatus 1 or the substrate manufacturing method described above. This means that with the solder-mounted substrate 600, the excessive mounting of the solder balls 300 on the substrate 400 is reliably prevented, and as a result, when the solder balls 300 are melted and attached to the terminals 401 of the substrate 400, a situation where excessively mounted solder balls 300 become connected to one another due to the melting of the solder balls 300 is avoided. Therefore, according to the solder-mounted substrate 600, when an electronic component is mounted, it is possible to reliably prevent the occurrence of defects whereby the terminals of the electronic components are short circuited via the connected solder balls 300 (the solder 301).

Also, with the electronic component-mounted substrate 800, the electronic component 801 that is connected via the solder balls 300 (the solder 301) attached to the solder-mounted substrate 600 described above is mounted on the solder-mounted substrate 600. This means that with the electronic component-mounted substrate 800, a situation where excessively mounted solder balls 300 become connected to one another due to the melting of the solder balls 300 is avoided, and as a result, when the electronic component 801 is mounted (installed), defects whereby the terminals of the electronic component 801 are short circuited via the connected solder balls 300 (the solder 301) are reliably prevented. Therefore, according to the electronic component-mounted substrate 800, it is possible to reliably prevent defects from occurring in products that use the electronic component-mounted substrate 800.

Note that the substrate manufacturing apparatus and the substrate manufacturing method are not limited to the example described above. For example, although a construction and method using the main unit 50 where the holding vessel 514, the vacuum chucking/holding unit 515, and the suction unit 516 are integrated have been described above, it is possible to apply the present invention to a construction and method that use a separate holding vessel 514, a vacuum chucking/holding unit 515, and a suction unit 516 and drive such components separately. It is also possible to apply the present invention to a construction and method where the holding vessel 514 and the vacuum chucking/holding unit 515 are integrated and the suction unit 516 is constructed separately and the integrated holding vessel 514 and vacuum chucking/holding unit 515 and the separately constructed suction unit 516 are driven separately. Also, although a construction and method that carry out a supply method and a suction method by moving the main unit 50 toward a vacuum chucking head 511 that is static have been described, it is also possible to apply the present invention to a construction and method that carry out the supplying process and the suction process by moving the vacuum chucking head 511 toward a static main unit 50 (or move both the vacuum chucking head 511 and the alignment plate 519). It is also possible to apply the present invention to a construction and method that carry out the supplying process and the suction process by moving both the vacuum chucking head 511 and the main unit 50. When the holding vessel 514, the vacuum chucking/holding unit 515, and the suction unit 516 are all separate, it is also possible to apply the present invention to a construction and method that carry out the supplying process by moving one or both of the holding vessel 514 and the vacuum chucking/holding unit 515 (that is, one or more out of such components) to place the solder balls 300 on the vacuum chucking/holding unit 515 and then moving one or both of the vacuum chucking head 511 and the holding vessel 514 (that is, one or more out of such components) and carry out the suction process by moving one or both of the vacuum chucking head 511 and the suction unit 516 (that is, one or more out of such components). When the holding vessel 514 and the vacuum chucking/holding unit 515 are integrated (hereinafter, a structure composed of both components is referred to as an "integrated structure") and the suction unit 516 is separately constructed, it is possible to apply the present invention to a construction and method where the supplying process is carried out by moving one or both of the vacuum chucking head 511 and the integrated structure (that is, one or more out of such components) and the suction process is carried out by moving one or both of the vacuum chucking heads 511 and the suction unit 516 (that is, one or more out of such components).

Also, although a construction and method that carry out the suction process to pull away and remove the excessive solder balls 300 by suction using the suction unit 516 have been described above, it is also possible to apply the present invention to a construction and method that are not equipped with the suction unit 516 and do not carry out the suction process. It is also possible to apply the present invention to a construction and method that is equipped, in place of the suction unit 516, with a squeegee mechanism that moves a squeegee across the vacuum chucking surface 512c of the vacuum chucking head 511 (or the lower surface 519d of the alignment plate 519), and wipes away and removes the excess solder balls 300 using the squeegee mechanism.

Also, although a construction and method have been described that supply the solder balls 300 to the vacuum chucking head 511 in the supplying process by moving the vacuum chucking/holding unit 515 that holds the solder balls 300 across the vacuum chucking surface 512c of the vacuum chucking head 511, it is also possible to apply the present invention to a construction and method that supply the solder balls 300 to the vacuum chucking head 511 by holding the solder balls 300 on a vacuum chucking/holding unit 515 whose front end portion 515a is formed with a similar size as the vacuum chucking surface 512c of the vacuum chucking head 511 and moving the front end portion 515a of the vacuum chucking/holding unit 515 close to the vacuum chucking surface 512c of the vacuum chucking head 511 without moving the vacuum chucking/holding unit 515 along the vacuum chucking surface 512c.

Although a construction and method that use the alignment plate 519 have been described above, it is also possible to apply the present invention to a construction and method that do not use the alignment plate 519. Also, in place of a construction that mounts the solder balls 300 on the solder flux applied onto the surface of the substrate 400, it is also possible to use a construction that dips the front end portions of the solder balls 300 vacuum-chucked to the vacuum chucking head 511 into solder flux held in a tray to apply solder flux to the front end portions and then mounts such solder balls 300 on a substrate 400 on which solder flux has not been applied.

Although an example equipped with a flux applying apparatus 4 that applies flux onto the terminals 401 of the substrate 400 has been described above, it is also possible to apply the present invention to a construction equipped with an applying unit that applies flux onto the front end portions of the solder balls 300 vacuum-chucked by the vacuum chucking head 511. Also, although an example equipped with the supplying unit 513 including the suction unit 516 has been described above, the construction of the supplying unit 513 is not limited to such, and as one example, it is possible to apply the present invention to a construction that is not equipped with the suction unit 516.

Although an example where the detecting unit 52 carries out both the first detecting process and the second detecting process has been described above, it is also possible to apply the present invention to a construction equipped with two detecting units (a first detecting unit and a second detecting unit) that carry out the detecting processes separately. Similarly, although an example equipped with the second removing unit 54 that wipes away the flux adhering to the vacuum chucking head 511 using the remover liquid 541, it is also possible to use a construction that removes adhering flux using suction. Also, although a construction and method have been described above where the first removing unit 53 is used to remove solder balls 300 (i.e., to carry out the first removing process) when only solder balls 300 adhere to the vacuum chucking head 511 after execution of the mounting process, it is also possible to apply the present invention to a construction and method that cause the second removing unit 54 to remove the adhering matter (i.e., to carry out the second removing process) even when the adhering matter is composed of only the solder balls 300.

Figure 50:
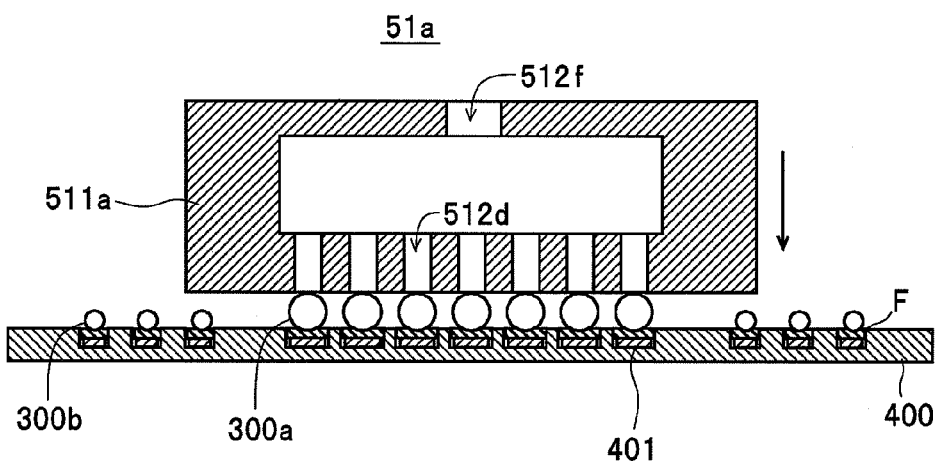
FIG. 50 is a twelfth schematic diagram useful in explaining the operation of the solder ball vacuum chucking apparatus.

Also, although a construction and method that carry out the second mounting process after the first mounting process has been carried out to mount the small-diameter solder balls 300b after the large-diameter solder balls 300a have been mounted, that is, a construction and method that carry out the moving process for the vacuum chucking head 511a with the large-diameter suction inlets 512e before the moving process for the vacuum chucking head 511b with the small-diameter suction inlets 512e have been described above, it is also possible to apply the present invention to a construction and method that carry out the first mounting process after the second mounting process has been carried out to mount the large-diameter solder balls 300a after the small-diameter solder balls 300b have been mounted, that is, a construction and method that carry out the moving process for the vacuum chucking head 511b with the small-diameter suction inlets 512e before the moving process for the vacuum chucking head 511a with the large-diameter suction inlets 512e. According to such construction, when the solder balls 300a are sufficiently larger than the solder balls 300b, for example, as shown in FIG. 50, it is possible during the first mounting process to reliably avoid contact between the solder balls 300b that have been mounted and the vacuum chucking head 511a without providing a concave or cutaway part in the vacuum chucking head 511a. Therefore, according to this construction, in spite of using a vacuum chucking head 511a of a simple construction that is not provided with a concave or cutaway part, it is still possible to reliably avoid having the solder balls 300b that have been mounted knocked off by contact with the vacuum chucking head 511a.

Although an example construction that includes two moving mechanisms 520a, 520b and has the two moving mechanisms 520a, 520b separately move the vacuum chucking heads 511a, 511b has been described above, it is also possible to apply the present invention to a construction where the vacuum chucking heads 511a, 511b are manually or automatically interchanged and the vacuum chucking heads 511a, 511b are moved by a single moving mechanism 520.

Although an example where two types of solder balls 300a, 300b with different diameters L1 are mounted on a single substrate 400 has been described above, it is also possible to apply the present invention to a construction that is equipped with three or more vacuum chucking heads 511 where the suction inlets 512e have different diameters (where the diameter L1 of the solder balls 300 to be held differs) and mounts three or more types of solder balls 300 with different diameters L1 onto a single substrate 400.

It is also possible to apply the present invention to a mounting method (ball mounting method) that mounts a plurality of types of solder balls 300 with different diameters L1 onto the substrate 400 using a plurality of solder ball mounting apparatuses. With this ball mounting method, when for example the solder balls 300a, 300b described above are mounted on a single substrate 400 using two solder ball mounting apparatuses, the solder balls 300a are mounted on the substrate 400 by causing one solder ball mounting apparatus to carry out the moving process using the vacuum chucking head 511a and the solder balls 300b are mounted on the substrate 400 by causing the other solder ball mounting apparatus to carry out the moving process using the vacuum chucking head 511b (that is, the moving process is carried out for the respective vacuum chucking heads 511 using two solder ball mounting apparatuses). With this ball mounting method, it is possible to achieve the same effects as the mounting process carried out by the solder ball mounting apparatus 5 described above.

In addition, although an example has been described above where a process that moves the vacuum chucking heads 511 toward the substrate 400 is carried out as the moving process, it is also possible to apply the present invention to a construction where a process that moves the substrate 400 toward the vacuum chucking heads 511 that hold the solder balls 300 is carried out as the moving process. Also, although an example has been described where the concave 512g for avoiding contact with the solder balls 300 that have been mounted is formed in one of the vacuum chucking heads 511, it is also possible to apply the present invention to a construction where in place of the concave 512g, a cutaway part is formed in such vacuum chucking head 511 and contact with the solder balls 300 that have been mounted is avoided using the cutaway part. Here, the expression "cutaway part" includes the result of partially cutting away an outer periphery part of the vacuum chucking head 511 and one or more holes that pass through in the thickness direction, and depending on the formation position and the like of the terminals 401 of the substrate 400, may be an arbitrary combination of both.

Also, although an example has been described where the control apparatus 8 causes the solder ball refilling apparatuses 55 to carry out the refilling process when the mounting process has been completed a number of times set in advance as one example of where a condition set in advance has been satisfied, it is also possible to apply the present invention to a construction that includes a testing unit that detects the mounting state of the solder balls 300 on the substrate 400 and causes the solder ball refilling apparatuses 55 to carry out the refilling process with detection of the mounting of insufficient solder balls 300 by the testing unit corresponding to the condition set in advance being satisfied. It is also possible to apply the present invention to a construction where the amount (remaining amount) of the solder balls 300 held in the holding vessel 514 is detected by an optical sensor, for example, and the refilling process is carried out when the amount is equal to or below an amount set in advance (as the condition set in advance being satisfied). It is also possible to apply the present invention to a construction where the refilling process is carried out at arbitrary timing by manually operating the rotating mechanism 556 to rotate the mounting portion 554.

Figure 57:
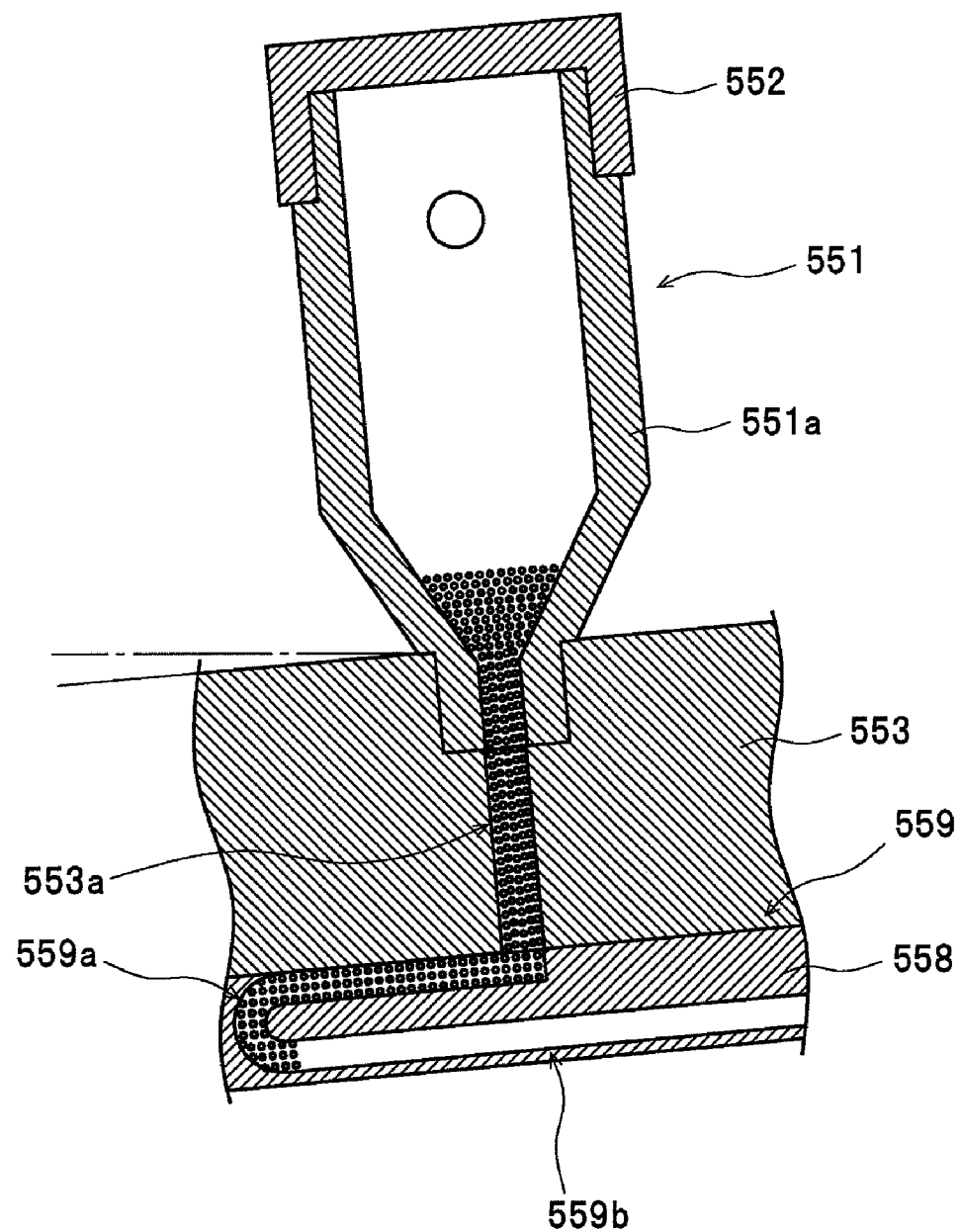
FIG. 57 is a cross-sectional view showing the construction of a mounting portion.

Also, although an example has been described where a hold is constructed by the channel 555 formed in the upper surface 554a of the mounting portion 554, as shown in FIG. 57, it is also possible to construct a hold using a hole 559 formed inside a mounting portion 558. Note that elements that have the same functions as in the solder ball refilling apparatuses 55 described above have been assigned the same reference numerals and duplicated description thereof is omitted. Here, as shown in FIG. 57, the hole 559 includes a storage portion 559a that is formed in a U shape when viewed from the side and a movement path 559b that is formed in a straight line when viewed from the side. With this construction that includes the hole 559, it is possible to achieve the same effects as the construction that includes the channel 555 described above.

Although an example that uses the mounting portion 554 that is in the form of a rectangular plate has been described above, the shape of the mounting portion 554 is not limited to this and it is possible to use a variety of three-dimensional forms such as a cube or rectangular cuboid, as well as shapes that are circular when viewed from above, semicircular (U shaped) when viewed from the side, or triangular when viewed from the side. Also, the material that forms the refilling vessel 551 and the mounting portion 554 are not limited to the materials described above and it is possible to use arbitrary materials Also, although an example has been described where nitrogen gas is used as one example of an oxidization preventing gas, the oxidization preventing gas is not limited to the nitrogen gas G and it is possible to use various types of gas, such as argon gas, that are capable of preventing oxidization of the solder balls 300.

Also, although an example where the flux applying apparatus 4 includes the two squeegee units 421a, 421b has been described above, it is also possible to construct a flux applying apparatus that includes only one squeegee unit 421. More specifically, as one example, when the flux F is applied by moving only the applying unit 42 in the direction of the arrow C in the example described above (i.e., where the flux is applied using only the squeegee unit 421a), it is possible to make the squeegee unit 421b of the applying unit 42 described above unnecessary. It is also possible to construct the flux applying apparatus using three or more squeegee units 421. Even when such constructions are used, it is possible to achieve the same effects as the flux applying apparatus 4 that includes the squeegee units 421a, 421b described above.

Also, although the flux applying apparatus 4 described above uses a construction where the two squeegee units 421a, 421b are attached to the applying mechanism 44 (the attachment portion 441) and both squeegee units 421a, 421b are moved in the same direction at the same time, it is also possible to use a construction that is separately equipped with a moving mechanism for moving the squeegee unit 421a and a moving mechanism for moving the squeegee unit 421b and moves the squeegee units 421a, 421b independently. In addition, although the flux applying apparatus 4 described above uses a construction where the flux F is spread out by using the applying mechanism 44 to move the applying unit 42 in a second direction with respect to the metal mask 41 and the substrate 400, it is also possible to use a construction where the flux F is spread out by moving the metal mask 41 and the substrate 400 using the substrate conveying mechanism 45, for example, in the second direction with respect to the applying unit 42 (the squeegee units 421) that are fixed at a position set in advance (for example, on the frame of the flux applying apparatus). It is also possible to use a construction where the flux F is spread out by moving the applying unit 42 in the second direction using the applying mechanism 44 and also moving the metal mask 41 and the substrate 400 in the second direction using the substrate conveying mechanism 45 or the like. By using such constructions, it is possible to achieve the same effects as the flux applying apparatus 4 described above.

In addition, although the squeegee units 421a, 421b where the springs 424 which are constructed of coil springs are disposed as energizing members have been described above as one example, in place of the coil springs, it is also possible to construct the energizing members of various type of spring such as leaf springs and air springs, or elastic members.

Also, although a method and construction have been described that carry out electrical testing on the substrates 400 after the dicing process that dices the multi-substrate panel 500 into the substrates 400 has been carried out, it is also possible to apply the present invention to a method and construction that carry out a mounting process after electrical testing has been carried out on the substrates 400 and then carries out the dicing process. More specifically, with this method and construction, the testing apparatus 3 carries out electrical testing on the substrates 400 in the multi-substrate panel 500 (the substrates 400 before dicing). Next, the solder ball mounting apparatus 5 mounts the solder balls 300 in the substrates 400 in the multi-substrate panel 500. In this case, the solder ball mounting apparatus 5 selects the substrates 400 that have been judged to be non-defective during the electrical testing out of the substrates 400 in the multi-substrate panel 500 in accordance with instructions from the flux applying apparatus 4 and mounts the solder balls 300 on only the non-defective substrates 400. After this, the solder balls 300 are subjected to a reflow process carried out on the multi-substrate panel 500 on which the solder balls 300 have been mounted. Next, the dicing apparatus 2 dices the multi-substrate panel 500 to divide the multi-substrate panel 500 into the substrates 400. With this mounting method and construction also, since the solder balls 300 are mounted on the substrates 400 that have been judged to be non-defective during the electrical testing, it is possible to reliably avoid having the solder balls 300 mounted on substrates 400 that are electrically defective. By doing so, it is possible to reliably suppress the wasteful consumption of solder balls 300, and as a result, it is possible to sufficiently reduce the manufacturing cost.

It is also possible to apply the present invention to a method and construction that carry out a dicing process after electrical testing has been carried out on the substrates 400 and then carries out the mounting process. More specifically, with this method and construction, the testing apparatus 3 carries out electrical testing on the substrates 400 in the multi-substrate panel 500 (the substrates 400 before dicing). Next, the dicing apparatus 2 dices the multi-substrate panel 500 to divide the multi-substrate panel 500 into the substrates 400. After this, out of the substrates 400 that have been diced, the solder ball mounting apparatus 5 selects the substrates 400 that have been judged to be non-defective during the electrical testing. The solder ball mounting apparatus 5 then mounts the solder balls 300 on only the substrates 400 that have been selected as non-defective. With this mounting method and construction, since the solder balls 300 are mounted on only the substrates 400 judged to be non-defective during the electrical testing, it is possible to reliably avoid the mounting of the solder balls 300 on the substrates 400 that are electrically defective. By doing so, it is possible to reliably suppress the wasteful consumption of solder balls 300, and as a result, it is possible to sufficiently reduce the manufacturing cost.

What is claimed is:

1. A substrate manufacturing apparatus that manufactures a ball-mounted substrate and comprises:
a ball mounting apparatus which includes a ball vacuum chucking apparatus including a vacuum chucking head that carries out a vacuum chucking process to vacuum chuck balls at edges of suction inlets formed in a vacuum chucking surface and which mounts the balls vacuum-chucked by the vacuum chucking head on a substrate,
wherein the ball vacuum chucking apparatus further includes:
a holding vessel that has an opening and holds the balls; and
a vacuum chucking/holding unit that vacuum chucks and holds the balls held in the holding vessel on a front end portion thereof, and
the ball vacuum chucking apparatus carries out a supplying process that brings the vacuum chucking/holding unit that holds the balls on the front end portion thereof and the vacuum chucking surface of the vacuum chucking head relatively close to one another to supply the balls to the vacuum chucking head in a state where air is being drawn through the suction inlets,
wherein the ball vacuum chucking apparatus includes a rotating mechanism that rotates the vacuum chucking/holding unit, the vacuum chucking/holding unit is disposed at the holding vessel and is constructed so as to be capable of being rotated about a base end portion thereof by the rotating mechanism in a state where the balls are held on the front end portion, and the rotating mechanism rotates the vacuum chucking/holding unit during execution of the supplying process so that the front end portion that holds the balls faces the vacuum chucking surface.

2. The substrate manufacturing apparatus according to claim 1,
wherein the ball vacuum chucking apparatus includes a suction unit that is capable of pulling away the balls by suction, and carries out a suction process that brings the suction unit and the vacuum chucking surface of the vacuum chucking head relatively close to one another and uses suction to remove excess balls aside from balls vacuum-chucked at the edges of the suction inlets.

3. The substrate manufacturing apparatus according to claim 1,
wherein the ball mounting apparatus further includes:
a first detecting unit that carries out a first detecting process that detects any excess or insufficiency of balls on the vacuum chucking head after execution of the vacuum chucking process;
a first removing unit that carries out a first removing process that removes the balls vacuum-chucked by the vacuum chucking head from the vacuum chucking head; and
a control unit,
wherein the control unit is operable when an excess of the balls has been detected in the first detecting process, to repeat the vacuum chucking process and the supplying process after the first removing process has been carried out and is operable when an insufficiency of the balls has been detected in the first detecting process, to repeat the vacuum chucking process and the supplying process.

4. The substrate manufacturing apparatus according to claim 1,
further comprising a flux applying apparatus that carries out an applying process to apply flux onto the substrate,
wherein the flux applying apparatus includes:
a squeegee unit including a squeegee that spreads out supplied flux on an application surface of the substrate; and
an application mechanism that moves at least one of the squeegee unit and the substrate, which has a mask provided with an opening that exposes an application area for the flux out of the application surface pressed onto the application surface thereof, in a first direction so that the substrate and the squeegee unit become close to one another and a front end portion, which is linear when viewed from above, of the squeegee becomes pressed onto a surface of the mask and moves at least one of the squeegee unit and the substrate in a second direction across the application surface with the front end portion of the squeegee pressed onto the surface of the mask so as to spread out the flux on the application area,
wherein the squeegee unit includes:
a first base portion and a second base portion;
a connecting mechanism that connects the first base portion and the second base portion while tolerating movement of the second base portion relative to the first base portion along the first direction; and
an energizing member that energizes the first base portion and the second base portion in a direction where the first base portion and the second base portion move apart,
the squeegee is attached to the second base portion via a rotational shaft whose axis is disposed along the second direction,
and the ball mounting apparatus mounts the balls onto the substrate after the applying process has been carried out.

5. The substrate manufacturing apparatus according to claim 1,
wherein the ball vacuum chucking apparatus includes a moving mechanism, and
during the supplying process, the moving mechanism moves at least one of the vacuum chucking head and the vacuum chucking/holding unit in a state where the vacuum chucking/holding unit that holds the balls on the front end portion thereof and the vacuum chucking surface of the vacuum chucking head have been brought relatively close to one another so that the vacuum chucking/holding unit moves relatively across the vacuum chucking surface.

6. The substrate manufacturing apparatus according to claim 1,
wherein the ball mounting apparatus includes a plurality of vacuum chucking heads and a mounting unit that mounts the balls held by the vacuum chucking heads onto the substrate by carrying out a moving process that moves one of the vacuum chucking heads and the substrate toward the other of the vacuum chucking heads and the substrate,
the vacuum chucking heads are constructed so that diameters of the suction inlets on each vacuum chucking head differ corresponding to diameters of the balls,
and the mounting unit carries out the moving process for each vacuum chucking head so as to mount, on a single substrate, a plurality of types of the balls with different diameters corresponding to the diameters of the suction inlets of the vacuum chucking heads.

7. The substrate manufacturing apparatus according to claim 1,
wherein the ball mounting apparatus includes a ball refilling apparatus that carries out a refilling process that refills the holding vessel with the balls,
wherein the ball refilling apparatus includes:
a refilling vessel that stores the balls and in which a discharge opening that discharges the stored balls is formed;
a mounting portion on which the refilling vessel is mounted in a state where the discharge opening faces downward and in which a holding portion, which is connected to the discharge opening in a mounted state and which is capable of holding the balls, is formed; and
a rotating mechanism that rotates the mounting portion so as to enable an angle of inclination of the mounting portion to be changed,
wherein the holding portion includes a storage portion that stores the balls discharged from the discharge opening of the refilling vessel and a movement path that joins the storage portion to a refilling opening that is formed at an edge of the mounting portion and enables the balls to fall out of the mounting portion, and
during a standby state, the rotating mechanism keeps the mounting portion in a first posture where the storage portion is positioned lower than the refilling opening and during the refilling process, the rotating mechanism rotates the mounting portion to a second posture where the refilling opening becomes positioned lower than the storage portion.

8. The substrate manufacturing apparatus according to claim 1,
further comprising a dicing apparatus that carries out a dicing process that dices a multi-substrate panel on which a plurality of substrates are formed to divide the multi-substrate panel into the plurality of substrates and a testing apparatus that carries out electrical testing on the substrates produced by the dicing process,
wherein the ball mounting apparatus mounts the balls on only the substrates that have been judged to be non-defective in the electrical testing.

9. A substrate manufacturing method that manufactures a ball-mounted substrate by causing a vacuum chucking head to carry out a vacuum chucking process where balls are vacuum-chucked on edges of suction inlets form in a vacuum chucking surface of the vacuum chucking head and mounting the balls, which have been vacuum-chucked by the vacuum chucking head, onto a substrate,
wherein during execution of the vacuum chucking process, the balls, that are held in a holding vessel with an opening, are vacuum-chucked and held on a front end portion of a vacuum chucking/holding unit, and
a supplying process is carried out where the vacuum chucking/holding unit that holds the balls on the front end portion thereof and the vacuum chucking surface of the vacuum chucking head are brought relatively close to one another to supply the balls to the vacuum chucking head in a state where air is being drawn through the suction inlets,
wherein during execution of the vacuum chucking process, the balls are placed on the front end portion of the vacuum chucking/holding unit that is disposed at the holding vessel and is capable of rotating about the base end portion thereof in a state where the balls are held on the front end portion, and during the supplying process, the vacuum chucking/holding unit is rotated so that the front end portion that holds the balls faces the vacuum chucking surface.

10. The substrate manufacturing method according to claim 9,
wherein when the vacuum chucking process is carried out, a suction process is carried out that brings a suction unit that is capable of pulling away the balls by suction and the vacuum chucking surface of the vacuum chucking head relatively close to one another and uses suction to remove excess balls aside from balls vacuum-chucked at the edges of the suction inlets.

11. The substrate manufacturing method according to claim 9,
further comprising a first detecting process that detects any excess or insufficiency of the balls on the vacuum chucking head after execution of the vacuum chucking process,
wherein when an excess of the balls has been detected in the first detecting process, a first removing process that removes the balls vacuum-chucked by the vacuum chucking head from the vacuum chucking head is carried out and then the vacuum chucking process and the supplying process are repeated, and
when an insufficiency of the balls has been detected in the first detecting process, the vacuum chucking process and the supplying process are repeated.

12. The substrate manufacturing method according to claim 9,
further comprising an applying process that moves at least one of a squeegee unit including a squeegee that spreads out supplied flux on an application surface of the substrate and the substrate, which has a mask provided with an opening that exposes an application area for the flux out of the application surface pressed onto the application surface thereof, in a first direction so that the substrate and the squeegee unit become close to one another and a front end portion, which is linear when viewed from above, of the squeegee becomes pressed onto a surface of the mask and moves at least one of the squeegee unit and the substrate in a second direction across the application surface with the front end portion of the squeegee pressed onto the surface of the mask so as to spread out the flux on the application area,
wherein the applying process is carried out using the squeegee unit which includes:
a first base portion and a second base portion;
a connecting mechanism that connects the first base portion and the second base portion while tolerating movement of the second base portion relative to the first base portion along the first direction; and
an energizing member that energizes the first base portion and the second base portion in a direction where the first base portion and the second base portion move apart,
wherein the squeegee is attached to the second base portion via a rotational shaft whose axis is disposed along the second direction, and
the balls are mounted onto the substrate after the applying process has been carried out.

13. The substrate manufacturing method according to claim 9,
wherein during the supplying process, at least one of the vacuum chucking head and the vacuum chucking/holding unit is moved in a state where the vacuum chucking/holding unit that holds the balls on the front end portion thereof and the vacuum chucking surface of the vacuum chucking head have been brought relatively close to one another so that the vacuum chucking/holding unit moves relatively across the vacuum chucking surface.

14. The substrate manufacturing method according to claim 9,
wherein when the balls held by the vacuum chucking head are mounted onto the substrate by carrying out a moving process that moves one of the vacuum chucking head and the substrate toward the other of the vacuum chucking head and the substrate,
the moving process is carried out separately for a plurality of vacuum chucking heads where diameters of the suction inlets on each vacuum chucking head differ corresponding to diameters of the balls so as to mount, on a single substrate, a plurality of types of the balls with different diameters corresponding to the diameters of the suction inlets.

15. The substrate manufacturing method according to claim 9,
wherein when a refilling process that refills the holding vessel with the balls is carried out, a ball refilling apparatus is used,
the ball refilling apparatus including:
a refilling vessel that stores the balls and in which a discharge opening that discharges the stored balls is formed;
a mounting portion on which the refilling vessel is mounted in a state where the discharge opening faces downward and in which a holding portion, which is connected to the discharge opening in a mounted state and which is capable of holding the balls, is formed; and
a rotating mechanism that rotates the mounting portion so as to enable an angle of inclination of the mounting portion to be changed,
wherein the holding portion includes a storage portion that stores the balls discharged from the discharge opening of the refilling vessel and a movement path that joins the storage portion to a refilling opening that is formed at an edge of the mounting portion and enables the balls to fall out of the mounting portion, and
during a standby state, the rotating mechanism keeps the mounting portion in a first posture where the storage portion is positioned lower than the refilling opening and during the refilling process, the rotating mechanism rotates the mounting portion to a second posture where the refilling opening becomes positioned lower than the storage portion.

16. The substrate manufacturing method according to claim 9,
wherein a dicing process that dices a multi-substrate panel on which a plurality of substrates are formed to divide the multi-substrate panel into the plurality of substrates and electrical testing of the substrates produced by the dicing process are carried out, and
the balls are mounted on only the substrates that have been judged to be non-defective in the electrical testing.

* * * * *